United States Patent
Akashi

(10) Patent No.: US 12,520,722 B2
(45) Date of Patent: Jan. 6, 2026

(54) NITROGEN-CONTAINING COMPOUND AND ORGANIC ELECTROLUMINESCENCE DEVICE INCLUDING THE SAME

(71) Applicant: Samsung Display Co., Ltd., Yongin-si (KR)

(72) Inventor: Nobutaka Akashi, Yokohama (JP)

(73) Assignee: Samsung Display Co., Ltd., Yongin-si (KR)

( * ) Notice: Subject to any disclaimer, the term of this patent is extended or adjusted under 35 U.S.C. 154(b) by 323 days.

(21) Appl. No.: 16/020,866

(22) Filed: Jun. 27, 2018

(65) Prior Publication Data
US 2019/0148647 A1   May 16, 2019

(30) Foreign Application Priority Data
Nov. 10, 2017 (KR) .......................... 10-2017-0149866

(51) Int. Cl.
H10K 85/60 (2023.01)
C07D 471/04 (2006.01)
(Continued)

(52) U.S. Cl.
CPC ....... H10K 85/6572 (2023.02); C07D 471/04 (2013.01); C07D 471/14 (2013.01);
(Continued)

(58) Field of Classification Search
CPC ............ H01L 51/0071; H01L 51/0072; H01L 51/5092; H01L 51/5016; H01L 51/0073;
(Continued)

(56) References Cited

U.S. PATENT DOCUMENTS 8,920,946 B2   12/2014   Lee et al.
8,927,749 B2   1/2015    Boudreault et al.
(Continued)

FOREIGN PATENT DOCUMENTS

CN   103509010 A   1/2014
EP   2980876 B1 * 5/2019 ............. C09K 11/06
(Continued)

OTHER PUBLICATIONS

KR-20110107681-A—translation (Year: 2011).*
(Continued)

*Primary Examiner* — Jennifer A Boyd
*Assistant Examiner* — Braelyn R Watson
(74) *Attorney, Agent, or Firm* — Womble Bond Dickinson (US) LLP

(57) ABSTRACT

A nitrogen-containing compound represented by Formula 1 below may be included in a light emitting layer of an organic electroluminescence device. The resulting organic electroluminescence device may exhibit improved light emitting efficiency and may emit deep blue light:

Formula 1

(Continued)

wherein, $X_1$ to $X_{13}$ are each independently $CR_1$, $CR_2$ or N, at least one of $X_9$ to $X_{13}$ is N, at least one of $X_1$ to $X_{13}$ is $CR_2$, and $R_2$ is represented by Formula 2 below:

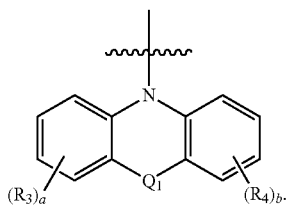

Formula 2

10 Claims, 2 Drawing Sheets

(51) Int. Cl.
| | | |
|---|---|---|
| *C07D 471/14* | (2006.01) | |
| *C07D 519/00* | (2006.01) | |
| *C07F 9/6584* | (2006.01) | |
| *C09K 11/06* | (2006.01) | |
| *H10K 50/11* | (2023.01) | |
| *H10K 50/17* | (2023.01) | |
| *H10K 85/40* | (2023.01) | |
| *H10K 50/16* | (2023.01) | |
| *H10K 101/10* | (2023.01) | |

(52) U.S. Cl.
CPC .......... *C07D 519/00* (2013.01); *C07F 9/6584* (2013.01); *C09K 11/06* (2013.01); *H10K 50/171* (2023.02); *H10K 50/11* (2023.02); *H10K 50/166* (2023.02); *H10K 85/40* (2023.02); *H10K 2101/10* (2023.02)

(58) Field of Classification Search
CPC . H01L 51/0074; C07D 219/00; C07D 471/14; C07D 471/04; C07D 519/00; C07D 487/04; C07D 487/14; C07D 498/00; C07D 471/10; C07D 471/20; C07D 491/10; C07D 491/20; C07D 491/22; C07D 495/12; C07D 495/22; C07D 221/20; C07D 491/107; C07D 471/00–02; C07D 487/00–02; C07D 487/10; C09K 19/3447; C09K 11/06; C09K 2211/1029; C09K 2211/1033; C09K 2211/104; C07F 9/6584; H10K 85/6572; H10K 50/171; H10K 50/11; H10K 50/166; H10K 85/40; H10K 2101/10; H10K 2101/20; H10K 50/12; H10K 85/657; H10K 85/6574; H10K 85/6576

See application file for complete search history.

(56) References Cited

U.S. PATENT DOCUMENTS

| | | | | |
|---|---|---|---|---|
| 2008/0303434 | A1* | 12/2008 | Cho .................. | H01L 51/0039 313/506 |
| 2012/0319052 | A1* | 12/2012 | Brocke .............. | C07D 471/06 252/500 |
| 2014/0142301 | A1* | 5/2014 | Itoi .................... | C07D 471/04 544/43 |
| 2014/0252318 | A1* | 9/2014 | Boudreault ....... | H01L 51/0059 257/40 |
| 2014/0316134 | A1* | 10/2014 | Stoessel ............. | C07F 9/65683 546/18 |
| 2016/0028025 | A1* | 1/2016 | Ogiwara ........... | H01L 51/5004 257/40 |
| 2016/0118595 | A1* | 4/2016 | Itoi .................... | H01L 51/0061 257/40 |
| 2016/0181546 | A1* | 6/2016 | Kang ................. | H01L 51/0072 257/40 |
| 2017/0005275 | A1* | 1/2017 | Jeon .................. | C09K 11/025 |
| 2017/0025620 | A1 | 1/2017 | Jeon et al. | |
| 2017/0213987 | A1 | 7/2017 | Kim et al. | |
| 2018/0166636 | A1* | 6/2018 | Noh .................. | H01L 51/0067 |
| 2018/0312531 | A1* | 11/2018 | Pan ................... | H10K 85/636 |

FOREIGN PATENT DOCUMENTS

| | | | | | |
|---|---|---|---|---|---|
| FR | 20160076882 | A | * | 7/2016 | .......... C07D 471/04 |
| JP | 2016117730 | A | * | 6/2016 | |
| KR | 10-2011-0102055 | A | | 9/2011 | |
| KR | 20110107681 | A | * | 10/2011 | |
| KR | 2015135599 | A | * | 12/2015 | |
| KR | 20160076882 | A | * | 7/2016 | |
| KR | 10-2017-0004793 | A | | 1/2017 | |
| KR | 10-2017-0011875 | | | 2/2017 | |
| KR | 10-1706659 | | | 2/2017 | |
| KR | 10-2017-0037135 | | | 4/2017 | |
| KR | 2017041648 | A | * | 4/2017 | .......... C07D 471/10 |
| KR | 10-2017-0075645 | | | 7/2017 | |
| KR | 10-2017-0089092 | | | 8/2017 | |
| WO | WO-2015158690 | A1 | * | 10/2015 | ........ H01L 51/0067 |
| WO | WO-2017011531 | A2 | * | 1/2017 | ........ H01L 51/0061 |
| WO | 2017115608 | A1 | | 7/2017 | |
| WO | WO-2018181370 | A1 | * | 10/2018 | ............ H01L 51/50 |

OTHER PUBLICATIONS

WO-2018181370-A1—translated (Year: 2018).*
English translation of JP 2016117730 A obtained from Global Dossier. (Year: 2016).*
English translation of WO 2018181370 obtained from Global Dossier. (Year: 2018).*
Kim, Gyeong Heon, et al. "Controlling the exciton lifetime of blue thermally activated delayed fluorescence emitters using a heteroatom-containing pyridoindole donor moiety." Materials Horizons 4.4 (2017): 619-624. (Year: 2017).*
Su, Shi-Jian, Chao Cai, and Junji Kido. "RGB phosphorescent organic light-emitting diodes by using host materials with hetero-cyclic cores: effect of nitrogen atom orientations." Chemistry of Materials 23.2 (2011): 274-284. (Year: 2011).*
Seo, Jeong-A., et al. "Long lifetime blue phosphorescent organic light-emitting diodes with an exciton blocking layer." Journal of Materials Chemistry C 3.18 (2015): 4640-4645. (Year: 2015).*
English translation of KR20160076882A obtained by Google Patents (Year: 2016).*
English translation of WO-2015158690-A1 obtained from Global Dossier (Year: 2015).*
English translation of KR-2017041648-A obtained form Google Patents (Year: 2017).*
Chen, Dongcheng, Shi-Jian Su, and Yong Cao. "Nitrogen heterocycle-containing materials for highly efficient phosphorescent OLEDs with low operating voltage." Journal of Materials Chemistry C 2.45 (2014): 9565-9578 (Year: 2014).*
Fu, Meiyan, et al. "A design concept of long-wavelength fluorescent analogs of rhodamine dyes: replacement of oxygen with silicon atom." Chemical Communications 15 (2008): 1780-1782. (Year: 2008).*
English translation of KR 20150135599 A obtained from Google Patents (Year: 2015).*
EPO Extended Search Report dated Feb. 5, 2019, for corresponding European Patent Application 18193891.1 (7 pages).

(56) References Cited

OTHER PUBLICATIONS

Notice of Allowance dated Oct. 18, 2022, from the Korean Patent Office in corresponding KR Patent Application No. 10-2017-0149866 (6 pages).

* cited by examiner

NITROGEN-CONTAINING COMPOUND AND ORGANIC ELECTROLUMINESCENCE DEVICE INCLUDING THE SAME

CROSS-REFERENCE TO RELATED APPLICATION

This application claims priority to and the benefit of Korean Patent Application No. 10-2017-0149866, filed on Nov. 10, 2017, the entire content of which is hereby incorporated by reference.

BACKGROUND

One or more aspects of embodiments of the present disclosure herein relate to a nitrogen-containing compound and an organic electroluminescence device including the same.

As an image display, an organic electroluminescence display has been actively developed. The organic electroluminescence display is different from a liquid crystal display and the like; it is a self-light emitting type (or kind) of display that realizes the display of images by recombining holes and electrons injected from a first electrode and a second electrode in a light emitting layer to emit light from a light emitting material—an organic compound included in the light emitting layer.

The organic electroluminescence device used in an image display should exhibit a low driving voltage, a high light emitting efficiency, and long lifetime, and there is a continuing need to develop a material for the organic electroluminescence device capable of stably realizing the above demands.

For example, in order to realize a high-efficiency organic electroluminescence device in recent years, the techniques for phosphorescence light emission using triplet state energy, or delayed fluorescence light emission using triplet-triplet annihilation (TTA) are being developed. Delayed fluorescence light emission using TTA is a phenomenon in which singlet excitons are generated by collision of triplet excitons. A thermally activated delayed fluorescence (TADF) material using a delayed fluorescence phenomenon is being developed.

SUMMARY

One or more aspects of embodiments of the present disclosure are directed toward a nitrogen-containing compound and an organic electroluminescence device including the same.

An embodiment of the present disclosure provides a nitrogen-containing compound represented by Formula 1 below:

Formula 1

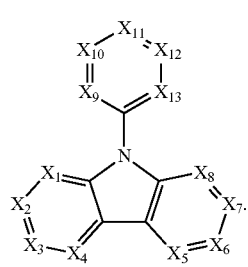

In Formula 1, $X_1$ to $X_{13}$ may be each independently $CR_1$, $CR_2$ or N, at least one of $X_1$ to $X_3$ and at least one of $X_9$ to $X_{13}$ may be N; $R_1$ may be hydrogen, deuterium, a substituted or unsubstituted alkyl group having 1 to 10 carbon atoms, a substituted or unsubstituted aryl group having 6 to 30 ring-forming carbon atoms, or a substituted or unsubstituted heteroaryl group having 2 to 30 ring-forming carbon atoms; at least one of $X_1$ to $X_{13}$ may be $CR_2$, where $R_2$ is represented by Formula 2 below:

Formula 2

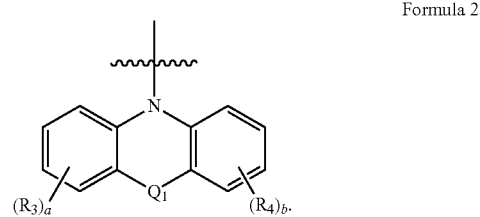

In Formula 2, $Q_1$ may be $CY_1Y_2$, $SiY_3Y_4$, $NY_5$, O or S; and $R_3$, $R_4$ and $Y_1$ to $Y_5$ may be each independently hydrogen, deuterium, a halogen atom, a cyano group, a substituted or unsubstituted alkyl group having 1 to 10 carbon atoms, a substituted or unsubstituted aryl group having 6 to 30 ring-forming carbon atoms, or a substituted or unsubstituted heteroaryl group having 2 to 30 ring-forming carbon atoms, where $Y_1$ and $Y_2$, and $Y_3$ and $Y_4$ may combine with each other to form a hydrocarbon ring or heterocycle; and a and b may be each independently an integer of 1 to 4.

When at least one of $X_9$ to $X_{13}$ is $CR_2$, the remaining $X_9$ to $X_{13}$ may be each independently CH or N.

In the nitrogen-containing compound of embodiments of the present disclosure, an absolute value of the difference between a singlet energy level and a triplet energy level of the nitrogen-containing compound may be 0.2 eV or less.

The number of N in $X_1$ to $X_5$ may be 1 or 2, and the number of N in $X_9$ to $X_{13}$ may be 1, 2 or 3.

Formula 1 may be represented by Formulae 1-1 or 1-2 below:

Formula 1-1

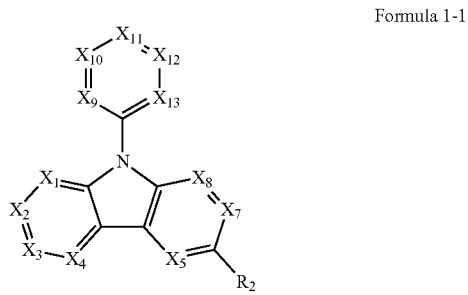

Formula 1-2

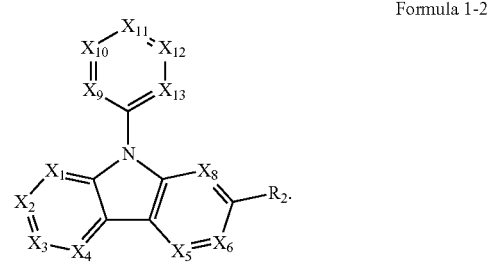

In Formulae 1-1 and 1-2, $X_1$ to $X_{13}$, and $R_2$ may be the same as described above.

Formula 1 may be represented by Formula 1-1-1 or 1-2-1 below:

Formula 1-1-1

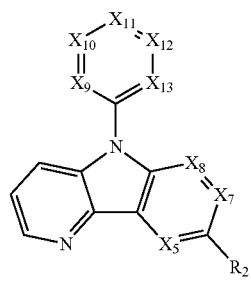

Formula 1-2-1

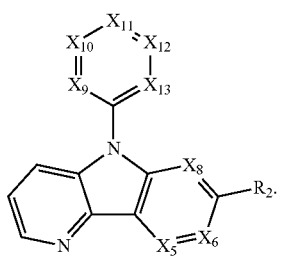

In Formulae 1-1-1 and 1-2-1, $X_5$ to $X_{13}$, and $R_2$ may be the same as described above.

Formula 1 may be represented by Formulae 1-1-2, 1-1-3, 1-2-2, or 1-2-3 below:

[Formula 1-1-2]

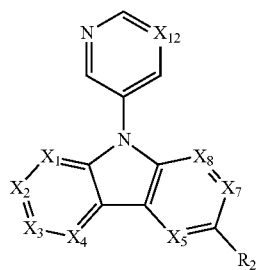

[Formula 1-1-3]

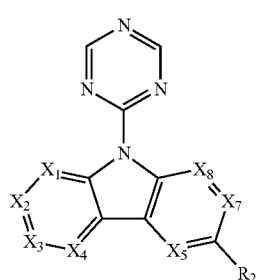

[Formula 1-2-2]

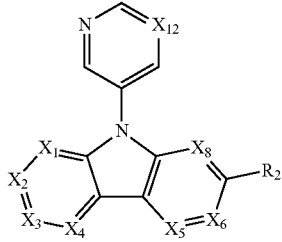

[Formula 1-2-3]

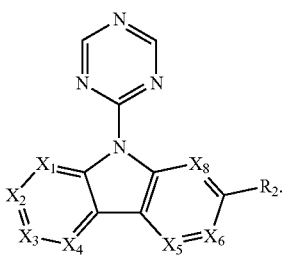

In Formulae 1-1-2, 1-1-3, 1-2-2, and 1-2-3, $X_{12}$ may be CH or N, and $X_1$ to $X_8$, and $R_2$ may be the same as described above.

Formula 1 may be represented by Formulae 1-3 or 1-4 below:

Formula 1-3

Formula 1-4

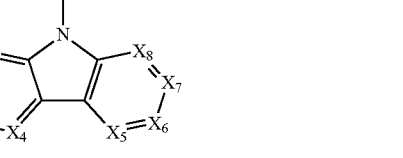

In Formulae 1-3 and 1-4, $X_1$ to $X_{13}$, and $R_2$ may be the same as described above.

Formula 1 may be represented by Formulae 1-3-1 or 1-4-1 below:

Formula 1-3-1
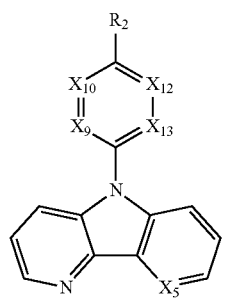
Formula 2-1
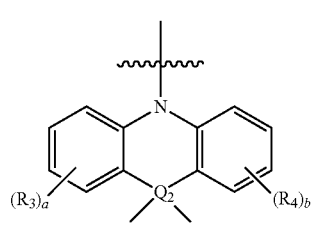
Formula 1-4-1
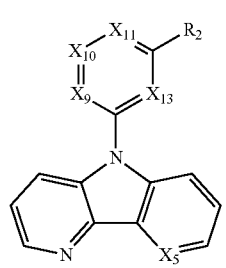
Formula 2-2
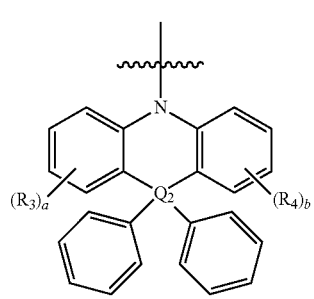
In Formulae 1-3-1 and 1-4-1, $X_5$ may be CH or N, and $X_9$ to $X_{13}$, and $R_2$ may be the same as described above.
Formula 1 may be represented by Formulae 1-3-2 or 1-4-2 below:
Formula 1-3-2
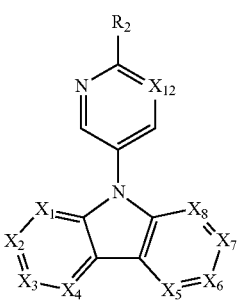
Formula 2-3
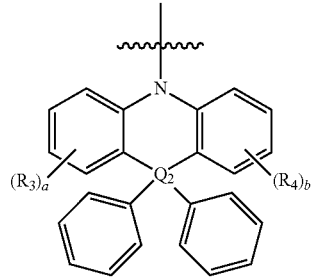
Formula 2-4
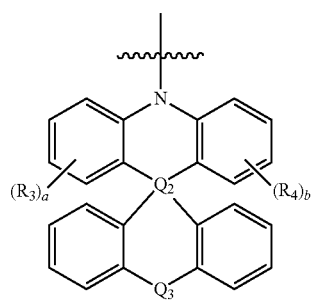
Formula 1-4-2
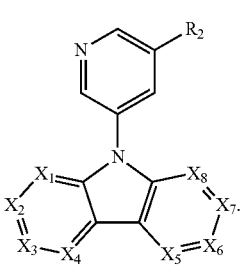
Formula 2-5
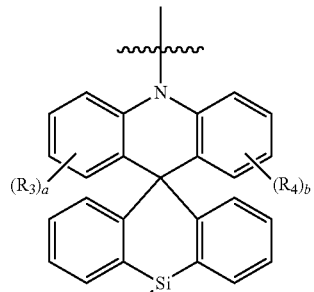
In Formulae 1-3-2 and 1-4-2, $X_{12}$ may be CH or N, and $X_1$ to $X_8$, and $R_2$ may be the same as described above.
Formula 2 may be represented by any one of Formulae 2-1 to 2-10 below:

Formula 2-6

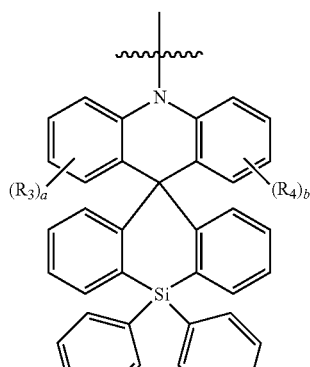

Formula 2-7

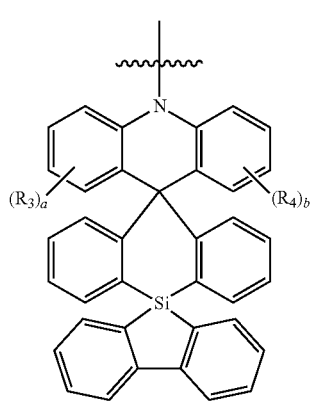

Formula 2-8

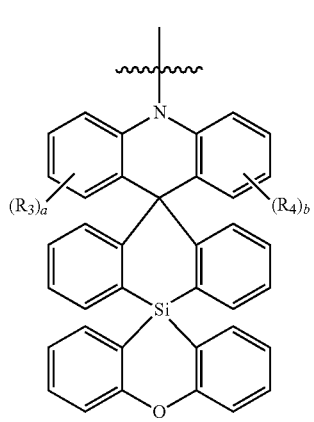

Formula 2-9

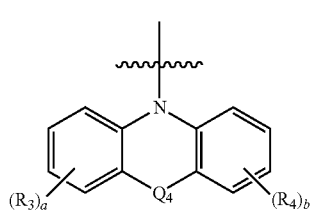

Formula 2-10

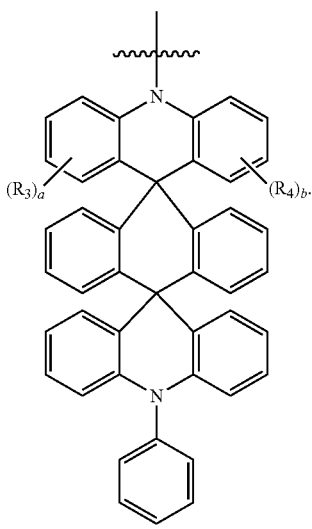

In Formulae 2-1 to 2-10, $Q_2$ may be C or Si, $Q_3$ may be O or S, $Q_4$ may be $NY_5$, O or S, and $Y_5$, $R_3$, $R_4$, and a and b may be the same as described above.

An embodiment of the present disclosure provides a nitrogen-containing compound represented by Formula A below:

Formula A

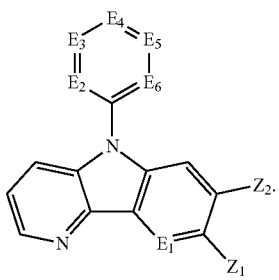

In Formula A, $E_1$ may be CH or N, $E_2$ to $E_6$ may be each independently $CZ_3$ or N; at least one of $E_2$ to $E_6$ may be N; and $Z_1$ to $Z_3$ may be each independently represented by hydrogen or Formula B below, and at least one of $Z_1$ to $Z_3$ may be represented by Formula B below:

Formula B

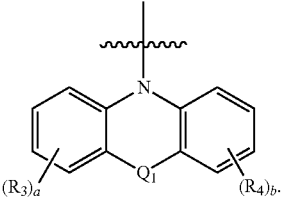

In Formula B, $Q_1$ may be $CY_1Y_2$, $SiY_3Y_4$, $NY_5$, O or S; and $R_3$, $R_4$, and $Y_1$ to $Y_5$ may be each independently hydrogen, deuterium, a halogen atom, a cyano group, a substituted or unsubstituted alkyl having 1 to 10 carbon atoms, a substituted or unsubstituted aryl having 6 to 30 ring-forming carbon atoms, or a substituted or unsubstituted heteroaryl having 2 to 30 ring-forming carbon atoms, where $Y_1$ and $Y_2$, and $Y_3$ and $Y_4$ may combine with each other to form a hydrocarbon ring and a heterocycle; and a and b may be each independently an integer of 0 to 4.

An embodiment of the present disclosure may provide an organic electroluminescence device including: a first electrode; a hole transport region provided on the first electrode; a light emitting layer provided on the hole transport region; an electron transport region provided on the light emitting layer; and a second electrode provided on the electron transport region, wherein the light emitting layer may include the nitrogen-containing compound according to an embodiment of the present disclosure described above.

In an embodiment, the first electrode and the second electrode each independently comprise at least one selected from Ag, Mg, Cu, Al, Pt, Pd, Au, Ni, Nd, Ir, Cr, Li, Ca, LiF/Ca, LiF/Al, Mo, Ti, In, Sn, and Zn, a compound of two or more thereof, a mixture of two or more thereof, and an oxide of one or more thereof.

In an embodiment, the light emitting layer may include a host and a dopant, wherein the dopant may include the nitrogen-containing compound according to an embodiment of the present disclosure described above.

In an embodiment, the dopant may be a thermally activated delayed fluorescence dopant.

BRIEF DESCRIPTION OF THE FIGURES

The above and other objects and features will become more apparent from the following description with reference to the following figures, wherein like reference numerals refer to like parts throughout the various figures unless otherwise specified, and wherein.

DETAILED DESCRIPTION

Figure 1:
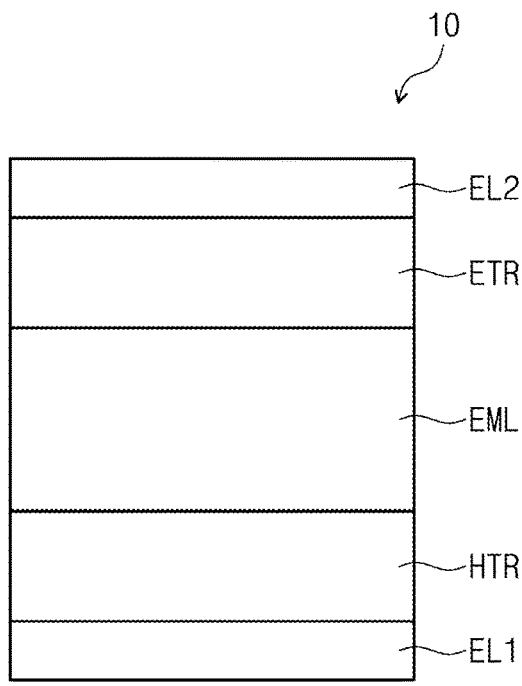
FIG. 1 is a cross-sectional view schematically illustrating an organic electroluminescence device, according to an embodiment of the present disclosure, FIG. 2 a cross-sectional view schematically illustrating an organic electroluminescence device, according to an embodiment of the present disclosure, FIG. 3 a cross-sectional view schematically illustrating an organic electroluminescence device, according to an embodiment of the present disclosure.

The above and other objects, features, and advantages of the present invention will be more readily understood with reference to the accompanying drawings and the following example embodiments. The present disclosure may, however, be embodied in many different forms and should not be construed as being limited to the embodiments set forth herein; rather, these embodiments are provided so that this disclosure will be thorough and complete, and will fully convey the concept of the invention to those skilled in the art.

Like reference numerals have been used for like elements in describing each drawing. In the accompanying drawings, the dimensions of structures are exaggerated for clarity of illustration. Although the terms first, second, etc. may be used herein to describe various elements, these elements should not be limited by these terms. These terms are only used to distinguish one element from another element. For example, without departing from the teachings of the present invention, a first element could be termed a second element, and similarly, a second element could also be termed a first element. The singular forms are intended to include the plural forms as well, unless the context clearly indicates otherwise.

It will be understood that the terms "includes," "including," "comprise," and/or "comprising," when used in this specification, specify the presence of stated features, integers, steps, operations, elements, and/or components, but do not preclude the presence or addition of one or more other features, integers, steps, operations, elements, components, and/or groups thereof. Also, when a portion of a layer, film, region, plate, etc. is referred to as being "on" another portion, it can be directly on the other portion, or intervening layers, films, regions, and/or plates may also be present. Similarly, when a portion of a layer, film, region, plate, etc. is referred to as being "under" another portion, it can be directly under another portion, or intervening layers, films, regions, and/or plates may also be present.

In the present specification, ⁃⧸⁃ may refer to a site to be connected (e.g., a binding site).

In the present specification, the term "substituted or unsubstituted" may refer to an unsubstituted group or a group substituted with one or more substituents selected from deuterium, a halogen atom, a cyano group, a nitro group, an amino group, a silyl group, a boron group, a phosphine group, an alkyl group, an alkenyl group, an aryl group, and a heterocyclic group. Also, each of the exemplified substituents may itself be substituted or unsubstituted. For example, a biphenyl group may be described as an aryl group, or as a phenyl group substituted with a phenyl group.

In the present specification, the term "combine with a neighboring group to form a ring" may refer to a combination (or bonding) of one substituent group with the neighboring group to form a substituted or unsubstituted hydrocarbon ring, or a substituted or unsubstituted heterocycle. The hydrocarbon ring may include an aliphatic hydrocarbon ring and an aromatic hydrocarbon ring. The heterocycle may include an aliphatic heterocycle and an aromatic heterocycle. The hydrocarbon ring and the heterocycle may each independently be monocyclic or polycyclic. Furthermore, the ring formed by combining two or more substituent groups with each other may be connected to another ring to form a spiro structure.

Expressions such as "at least one of," "one of," and "selected from," when preceding a list of elements, modify the entire list of elements and do not modify the individual elements of the list. Further, the use of "may" when describing embodiments of the present invention refers to "one or more embodiments of the present invention."

In the present specification, non-limiting examples of the halogen atom are a fluorine atom, a chlorine atom, a bromine atom and an iodine atom.

In the present specification, the alkyl group may be linear, branched, or cyclic. The number of carbon atoms of the alkyl group may be 1 to 30, 1 to 20, 1 to 10, or 1 to 4. Examples of the alkyl group may include, but are not limited to, a methyl group, an ethyl group, an n-propyl group, an isopropyl group, an n-butyl group, an s-butyl group, a t-butyl group, an i-butyl group, a 2-ethyl butyl group, a 3, 3-dimethyl butyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2penthyl group, an n-hexyl group, a 1-methylhexyl group, a 2-ethylhexyl group, a 2-butylhexyl group, a cyclohexyl group, a 4-methylcyclrohexyl group, a 4-t-butylcyclrohexyl group, an n-heptyl group, a 1-methylheptyl group, a 2, 2-dimethylheptyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, an ethyldodecyl group, a butyldodecyl group, a hexyldodecyl group, an octyldodecyl group, an n-tridecyl group, an n-tetradecyl group, a pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl, an n-eicosyl group, a 2-ethylicosyl group, a 2-butyleicosyl group, a 2-hexyleicosyl group, a 2-octyl eicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group, and the like.

In the present specification, the aryl group may refer to any functional group or substituent derived from the aromatic hydrocarbon ring. The aryl group may be a monocyclic aryl or a polycyclic aryl. The number of ring-forming carbon atoms of the aryl group may be 6 to 30, 6 to 20, or 6 to 15. Examples of the aryl group may include, but are not limited to, a phenyl group, a naphthyl group, a fluorenyl group, an anthracenyl group, a phenanthryl group, a biphenyl group, a terphenyl group, a quaterphenyl group, a quintaphenyl group, a sextaphenyl group, a biphenylene group, a triphenylene group, a pyrenyl group, a benzofluoranthenyl group, a chrysenyl group, etc.

In the present specification, the fluorenyl group may be substituted, and two substituents may combine with each other to form the spiro structure. Examples in which the fluorenyl group is substituted are as follows. However, the present invention is not limited thereto.

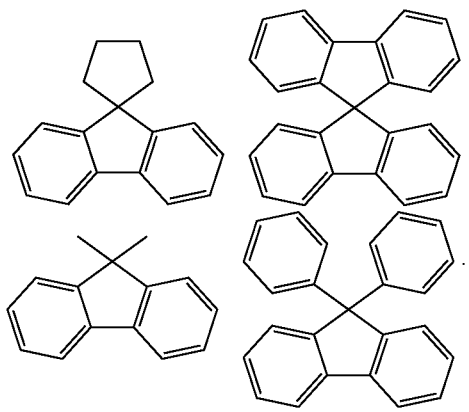

In the present specification, the heteroaryl group may include a heteroaryl group including at least one of O, N, P, S or Si as a hetero atom. When the heteroaryl group includes two heteroatoms, the two heteroatoms may be the same as or different from each other. The number of ring-forming carbon atoms of the heteroaryl group may be 2 to 30, or 2 to 20. The heteroaryl group may be a monocyclic heteroaryl group or a polycyclic heteroaryl group. The polycyclic heteroaryl group may be, for example, one having a bicyclic or a tricyclic structure. Examples of the heteroaryl group include, but are not limited to, a thiophenyl group, a furanyl group, a pyrrolyl group, an imidazolyl group, a thiazolyl group, an oxazolyl group, an oxadiazolyl group, a triazolyl group, a pyridyl group, a bipyridyl group, a pyrimidyl group, a triazinyl group, an acridyl groups, a pyridazinyl group, a pyrazinyl group, a quinolinyl group, a quinazolinyl group, a quinoxalinyl group, a phenoxazyl group, a phthalazinyl group, a pyrido pyrimidinyl group, a pyrido pyrazinyl group, a pyrazino pyrazinyl group, an isoquinolinyl group, an indolyl group, a carbazolyl group, an N-arylcarbazolyl group, an N-heteroarylcarbazolyl group, an N-alkylcarbazolyl group, a benzoxazolyl group, a benzoimidazolyl group, a benzothiazolyl group, a benzocarbazolyl group, a benzothiophenyl group, a dibenzothiophenyl group, a thienothiophenyl group, a benzofuranyl group, a phenanthrolinyl, a thiazolyl group, an isoxazolyl group, an oxadiazolyl group, a thiadiazolyl group, a benzothiazolyl group, a phenothiazinyl group, a dibenzosilolyl group, a dibenzofuranyl group, etc.

In the present specification, the silyl group may include an alkylsilyl group and an arylsilyl group. Examples of the silyl group include, but are not limited to, a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, etc.

In the present specification, the boron group may include an alkyl boron group and an aryl boron group. Examples of the boron group include, but are not limited to, a trimethylboron group, a triethylboron group, a t-butyldimethylboron group, a triphenylboron group, a diphenylboron group, a phenylboron group, etc.

In the present specification, the alkenyl group may be linear or branched. The number of carbon atoms is not particularly limited, but may be 2 to 30, 2 to 20, or 2 to 10. Examples of the alkenyl group include, but are not limited to, a vinyl group, a 1-butenyl group, a 1-pentenyl group, a 1,3-butadienyl aryl group, a styrenyl group, a styrylvinyl group, etc.

In the present specification, the number of carbon atoms of the amino group is not particularly limited, but may be 1 to 30. The amino group may include an alkyl amino group and an aryl amino group. Examples of the amino group include, but are not limited to, a methylamino group, a dimethylamino group, a phenylamine group, a diphenylamino group, a naphthylamino group, a 9-methyl-anthracenylamino group, a triphenylamino group, etc.

Hereinafter, a nitrogen-containing compound according to an embodiment of the present disclosure will be described.

The nitrogen-containing compound according to an embodiment of the present disclosure is represented by Formula 1 below:

Formula 1

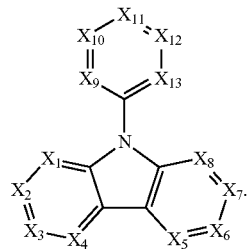

In Formula 1, $X_1$ to $X_{13}$ are each independently $CR_1$, $CR_2$ or N; and $R_1$ is hydrogen, deuterium, a substituted or unsubstituted alkyl group having 1 to 10 carbon atoms, a substituted or unsubstituted aryl group having 6 to 30 ring-forming carbon atoms, or a substituted or unsubstituted heteroaryl group having 2 to 30 ring-forming carbon atoms.

At least one of $X_1$ to $X_5$ is N, and at least one of $X_9$ to $X_{13}$ is N.

At least one of $X_1$ to $X_5$ is $CR_2$, and $R_2$ is represented by Formula 2 below:

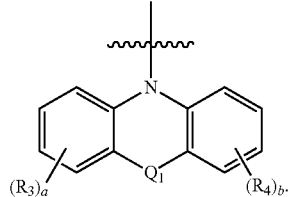

Formula 2

In Formula 2, $Q_1$ is $CY_1Y_2$, $SiY_3Y_4$, $NY_5$, O or S; and $R_3$, $R_4$ and $Y_1$ to $Y_5$ are each independently hydrogen, deuterium, a halogen atom, a cyano group, a substituted or unsubstituted alkyl group having 1 to 10 carbon atoms, a substituted or unsubstituted aryl group having 6 to 30 ring-forming carbon atoms, or a substituted or unsubstituted heteroaryl group having 2 to 30 ring-forming carbon atoms.

$Y_1$ and $Y_2$, and $Y_3$ and $Y_4$ may optionally combine with each other to form a hydrocarbon ring and/or a heterocycle.

a and b are each independently an integer of 1 to 4. When a is 2 or more, a plurality of $R_3$s are the same as or different from each other; when a is 1, $R_3$ may not be hydrogen. When b is 2 or more, a plurality of $R_4$s are the same as or different from each other; when b is 1, $R_4$ may not be hydrogen.

The nitrogen-containing compound according to an embodiment of the present disclosure may include one substituent represent by Formula 2. In other words, one Formula 2 may be introduced into a ring including $X_1$ to $X_4$, one into a ring including $X_5$ to $X_8$, or one into a ring including $X_9$ to $X_{13}$. However, the embodiment is not limited thereto.

When at least one of $X_9$ to $X_{13}$ is $CR_2$, the remaining of $X_9$ to $X_{13}$ may be each independently CH or N. In other words, when Formula 2 is introduced into a ring including $X_9$ to $X_{13}$, the ring including $X_9$ to $X_{13}$ may be a ring in which a substituent other than Formula 2 is not included.

$R_1$ may be, for example, hydrogen, deuterium, a substituted or unsubstituted methyl group, a substituted or unsubstituted ethyl group, a substituted or unsubstituted propyl group, a substituted or unsubstituted butyl group, a substituted or unsubstituted phenyl group, a substituted or unsubstituted biphenyl group, or a substituted or unsubstituted heteroaryl group having 2 to 20 ring-forming carbon atoms.

The nitrogen-containing compound according to an embodiment of the present disclosure may have an absolute value of the difference between a singlet energy level and a triplet energy level of 0.2 eV or less. For example, the absolute value of the difference between the singlet energy level and the triplet energy level may be 0.1 eV or less, 0.07 eV or less, or 0.05 eV or less. Accordingly, the nitrogen-containing compound according to an embodiment of the present disclosure may be applied to a thermally activated delayed fluorescence material.

The number of N (nitrogen atoms) in $X_1$ to $X_8$ may be 1 or 2, and the number of N in $X_9$ to $X_{13}$ may be 1, 2 or 3, but the number of N is not limited thereto. For example, a ring including $X_9$ to $X_{13}$ may be a substituted or unsubstituted pyridine group, a substituted or unsubstituted pyrimidine group, or a substituted or unsubstituted triazine group.

Formula 1 may be represented, for example, by Formulae 1-1 or 1-2 below:

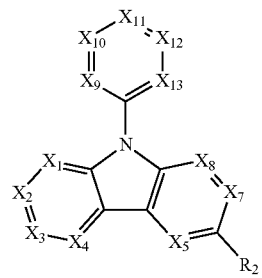

Formula 1-1

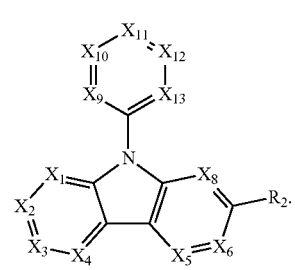

Formula 1-2

In Formula 1-1, $X_1$ to $X_5$, $X_7$ to $X_{13}$, and $R_2$ are the same as described above.

In Formula 1-2, $X_1$ to $X_6$, $X_8$ to $X_{13}$, and $R_2$ are the same as described above.

In Formulae 1-1 and 1-2, $X_9$ to $X_{13}$ may be each independently CH or N. In Formula 1-1, the number of N in $X_1$ to $X_4$ may be 1 (e.g., one selected from $X_1$ to $X_4$ may be N), and the number of N in $X_5$, $X_7$ and $X_8$ may be 0 or 1 (e.g., no or one selected from $X_5$, $X_7$ and $X_8$ may be N). In Formula 1-2, the number of N in $X_1$ to $X_4$ may be 1, and the number of N in $X_5$, $X_6$ and $X_8$ may be 0 or 1.

In Formulae 1-1 and 1-2, the number of nitrogen in $X_9$ to $X_{13}$ may be 1, 2, or 3.

Formula 1-1 may be represented, for example, by Formula 1-1-1 below:

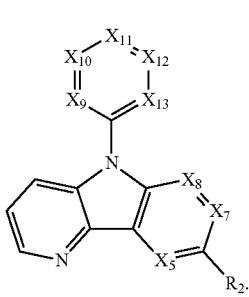

Formula 1-1-1

In Formula 1-1-1, $X_5$, $X_7$ to $X_{13}$, and $R_2$ are the same as described above. For example, $X_5$ may be CH or N, and $X_7$ and $X_8$ may be each CH.

Formula 1-1 may be represented by Formula 1-1-2 below:

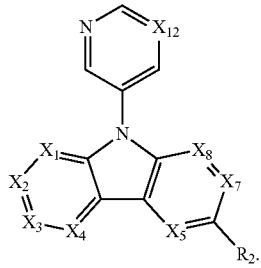

Formula 1-1-2

In Formula 1-1-2, $X_{12}$ is CH or N, and $X_1$ to $X_5$, $X_7$, $X_8$, and $R_2$ are the same as described above. In Formula 1-1-2, the number of N in $X_1$ to $X_4$ may be 1. $X_1$ to $X_3$ may be each independently $CR_1$, and $R_1$ may be hydrogen, or a substituted or unsubstituted alkyl group having 1 to 4 carbon atoms.

Formula 1-1 may be represented by Formula 1-1-3 below:

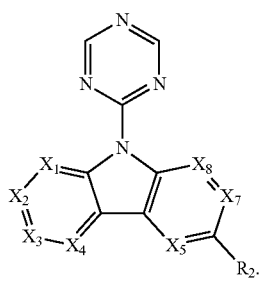

Formula 1-1-3

In Formula 1-1-3, $X_1$ to $X_5$, $X_7$, $X_8$, and $R_2$ are the same as described above. In Formula 1-1-3, the number of N in $X_1$ to $X_5$, $X_7$ and $X_8$ may be 1.

Formula 1-2 may be represented by Formula 1-2-1 below:

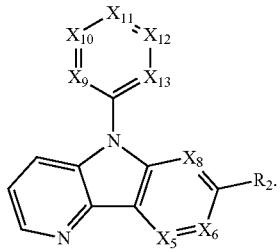

Formula 1-2-1

In Formula 1-2-1, $X_5$, $X_6$, $X_8$ to $X_{13}$, and $R_2$ are the same as described above. In Formula 1-2-1, $X_5$ may be CH or N, and $X_6$ and $X_8$ may be each CH.

Formula 1-2 may be represented, for example, by Formula 1-2-2 below:

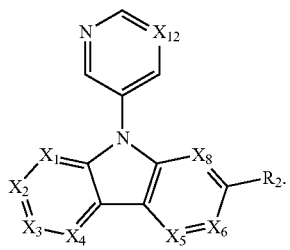

Formula 1-2-2

In Formula 1-2-2, $X_{12}$ is CH or N, and $X_1$ to $X_6$, $X_8$ and $R_2$ are the same as described below. In Formula 1-2-2, the number of N in $X_1$ to $X_4$ may be 1, and $X_6$ and $X_8$ may be each $CR_1$, where $R_1$ is as defined above.

Formula 1-2 may be represented Formula 1-2-3 below:

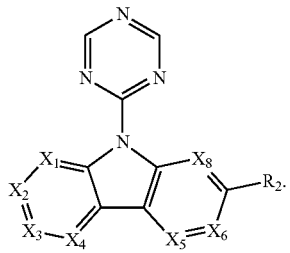

Formula 1-2-3

In Formula 1-2-3, $X_1$ to $X_6$, $X_8$ and $R_2$ are the same as described above. In Formula 1-2-3, the number of N in $X_1$ to $X_5$, $X_7$ and $X_8$ may be 1. For example, any one of $X_1$ to $X_4$ may be N.

Formula 1 may be represented by Formulae 1-3 or 1-4 below:

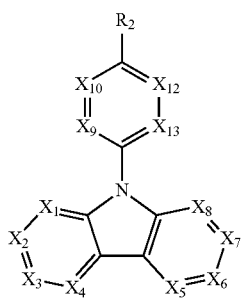

Formula 1-3

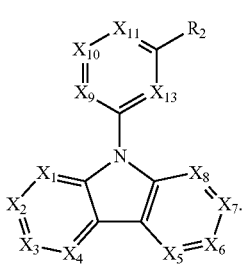

Formula 1-4

In Formula 1-3, $X_1$ to $X_{10}$, $X_{12}$, $X_{13}$, and $R_2$ are the same as described above.

In Formula 1-4, $X_1$ to $X_{11}$, $X_{13}$, and $R_2$ are the same as described above.

In Formulae 1-3 and 1-4, $X_1$ to $X_8$ may be each independently CH or N. For example, the number of N in $X_1$ to $X_8$ may be 1 or 2.

In Formula 1-3, the number of N in $X_9$, $X_{10}$, $X_{12}$ and $X_{13}$ may be 1 or 2.

In Formula 1-4, one of $X_9$ to $X_{11}$, and $X_{13}$ may be N, and the remaining may be CH.

Formula 1-3 may be represented, for example, by Formula 1-3-1 below:

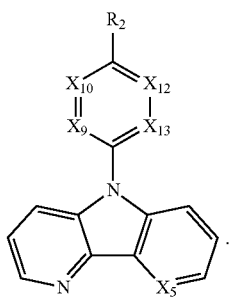

Formula 1-3-1

In Formula 1-3-1, $X_5$ is CH or N, and $X_9$, $X_{10}$, $X_{12}$, $X_{13}$, and $R_2$ are the same as described above. For example, $X_9$, $X_{10}$, $X_{12}$, and $X_{13}$ may be each independently N or CH. The number of N in $X_9$, $X_{10}$, $X_{12}$, and $X_{13}$ may be 1 or 2.

For example, Formula 1-3 may be represented by Formula 1-3-2 below:

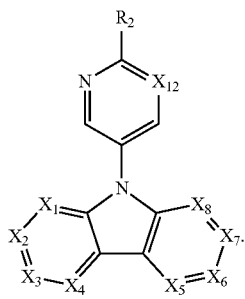

Formula 1-3-2

In Formula 1-3-2, $X_{12}$ is CH or N, $X_1$ to $X_8$, and $R_2$ are the same as described above. In Formula 1-3-2, the number of N in $X_1$ to $X_4$ may be 1, and the number of N in $X_5$ to $X_8$ may be 0 or 1.

Formula 1-4 may be represented by Formula 1-4-1 below:

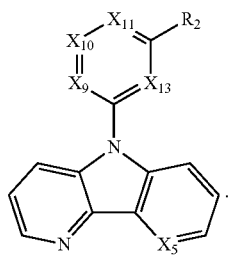

Formula 1-4-1

In Formula 1-4-1, $X_5$ is CH or N, and $X_9$ to $X_{11}$, $X_{13}$, and $R_2$ are the same as described above. In Formula 1-4-1, $X_9$ to $X_{11}$ and $X_{13}$ may be each independently CH or N. In Formula 1-4-1, the number of N in $X_9$ to $X_{11}$ and $X_{13}$ may be 1.

For example, Formula 1-4 may be represented by Formula 1-4-2 below:

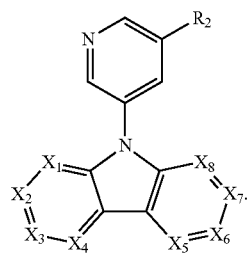

Formula 1-4-2

In Formula 1-4-2, $X_1$ to $X_8$ and $R_2$ are the same as described above. The number of N in $X_1$ to $X_8$ may be 1 or 2. For example, one of $X_1$ to $X_4$ may be N, and the remaining may be CH.

Formula 2 may be represented, for example, by any one of Formulae 2-1 to 2-10.

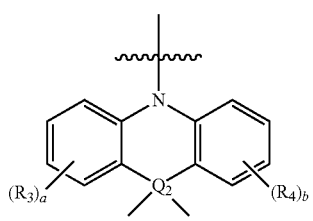

Formula 2-1

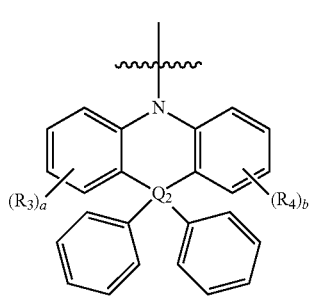

Formula 2-2

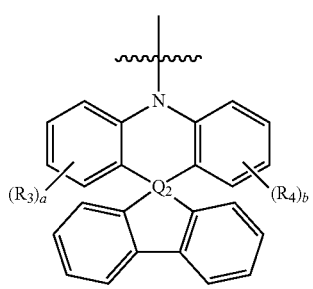

Formula 2-3

Formula 2-4

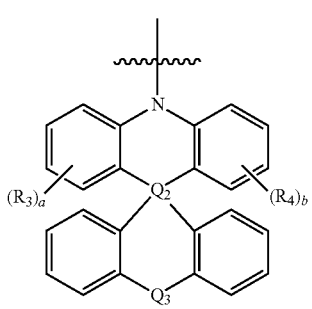

Formula 2-5

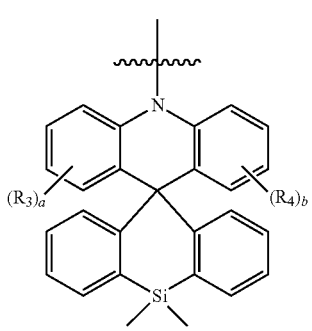

Formula 2-6

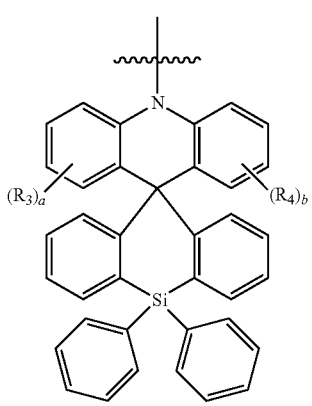

Formula 2-7

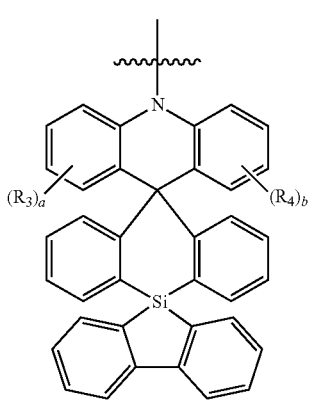

Formula 2-8

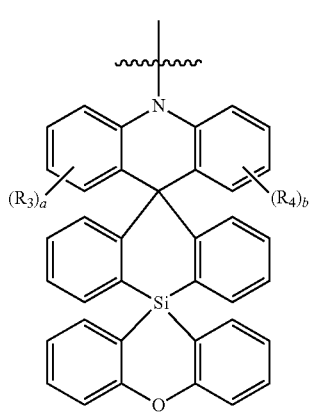

Formula 2-9

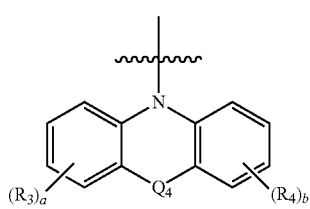

Formula 2-10

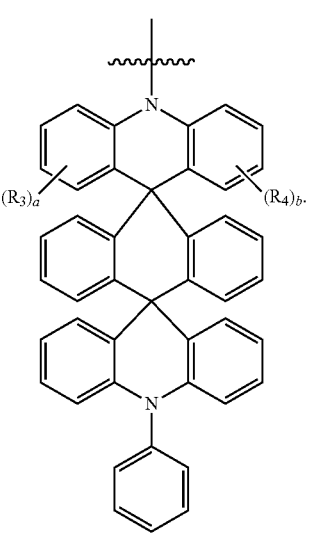

In Formulae 2-1 to 2-3, $Q_2$ is C or Si, and $R_3$, $R_4$, a and b are the same as described above.

In Formula 2-4, $Q_2$ is C or Si, $Q_3$ is O or Si, and $R_3$, $R_4$, a and b are the same as described above.

In Formulae 2-5 to 2-8, $R_3$, $R_4$, a and b are the same as described above.

In Formula 2-9, $Q_4$ is $NY_5$, O or S, and $Y_5$, $R_3$, $R_4$, a and b are the same as described above. For example, $Y_5$ may be a substituted or unsubstituted alkyl group having 1 to 5 carbon atoms, or a substituted or unsubstituted aryl group having 6 to 30 ring-forming carbon atoms. For example, $Y_5$ may be a substituted or unsubstituted methyl group, a substituted or unsubstituted phenyl group, a substituted or unsubstituted biphenyl group, or a substituted or unsubstituted terphenyl group.

In Formula 2-10, $R_3$, $R_4$, a and b are the same as described above.

The nitrogen-containing compound represented by Formula 1 according to an embodiment of the present disclosure may be, but is not limited to, one selected from the compounds represented by Compound Group 1 below:
Compound Group 1
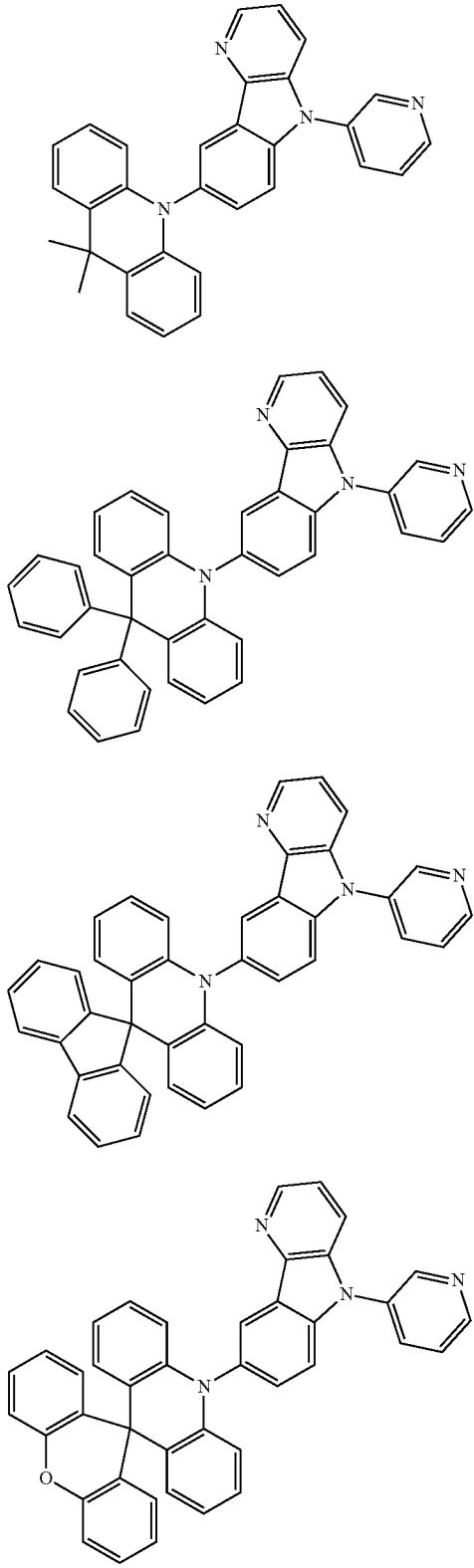
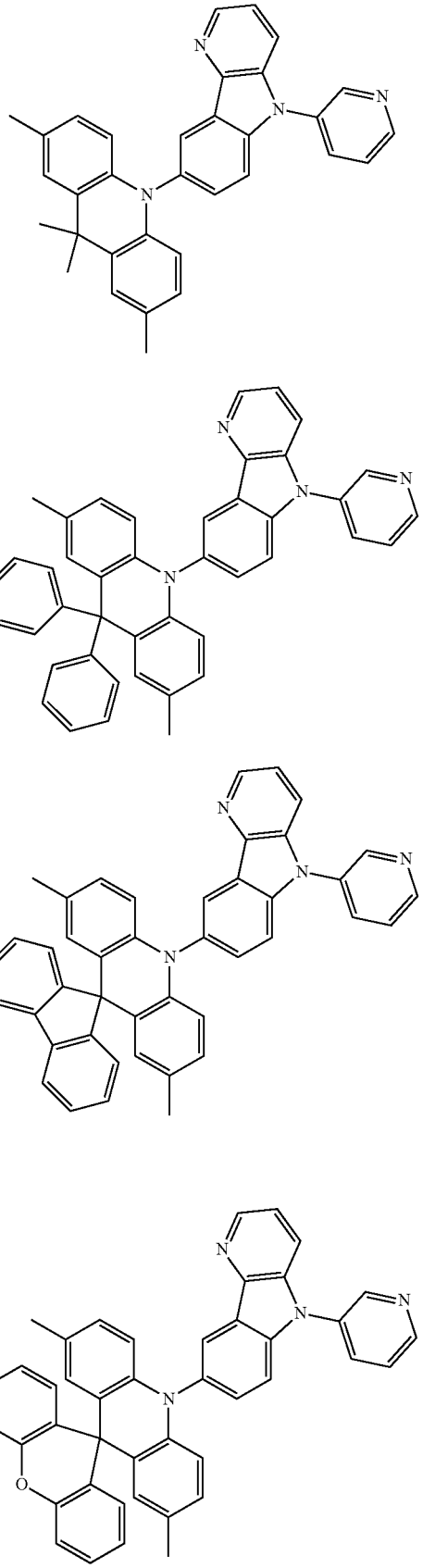

9
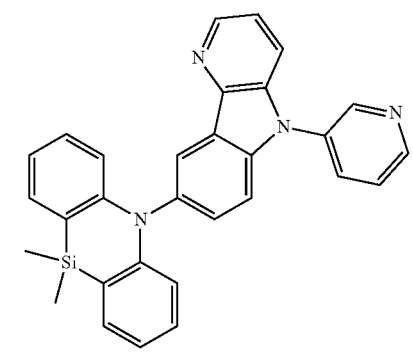
10
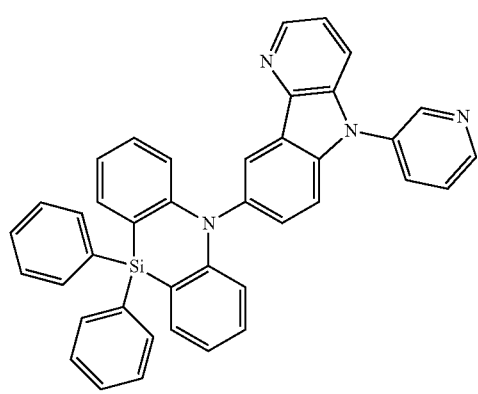
11
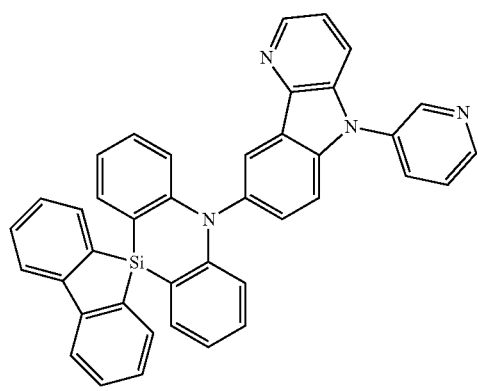
12
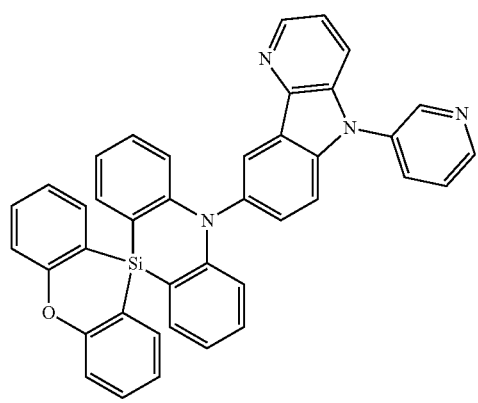
13
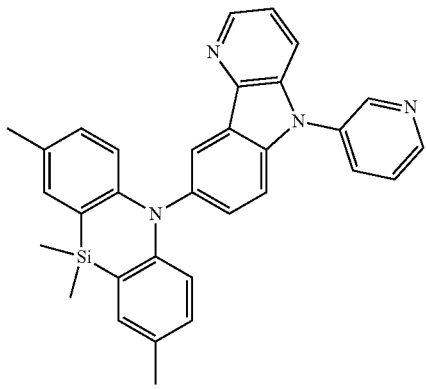
14
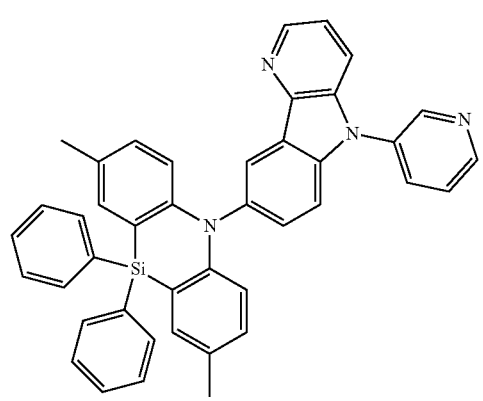
15
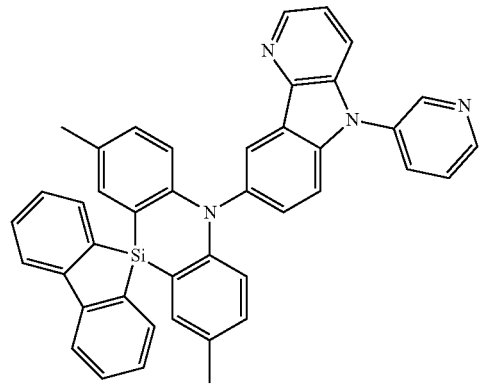
16
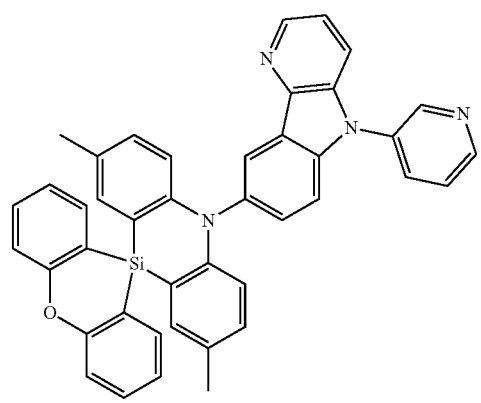

17
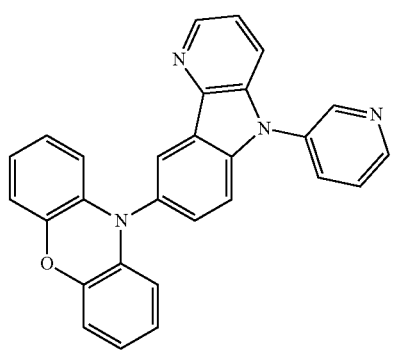
18
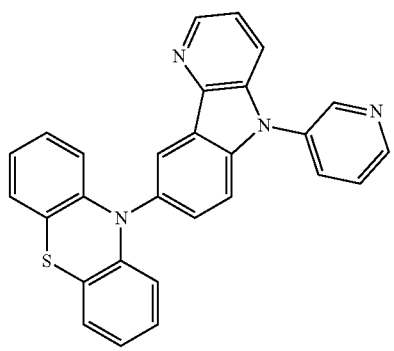
19
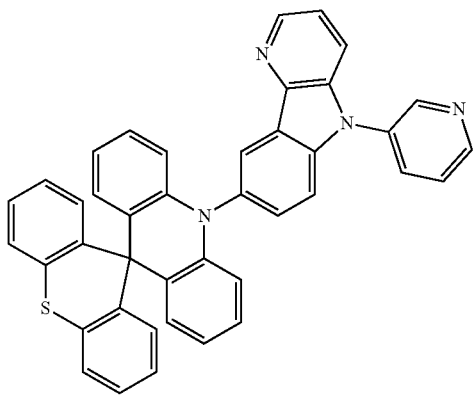
20
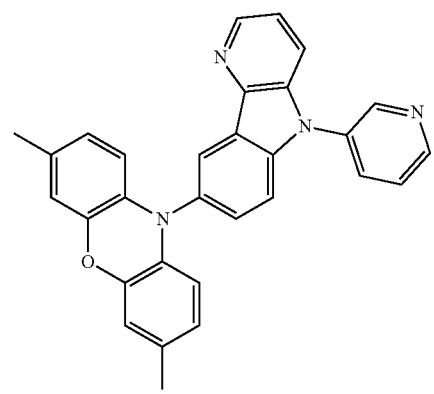
21
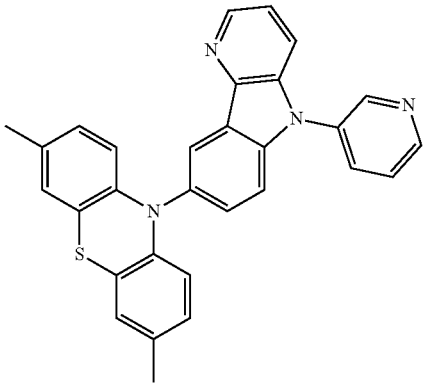
22
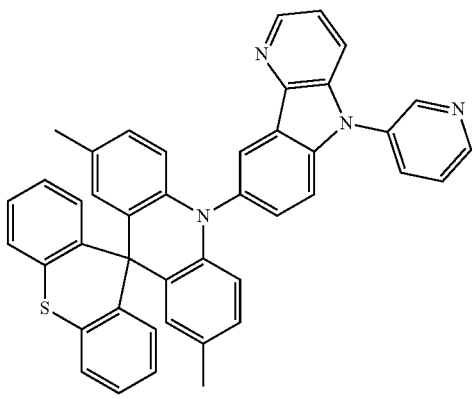
23
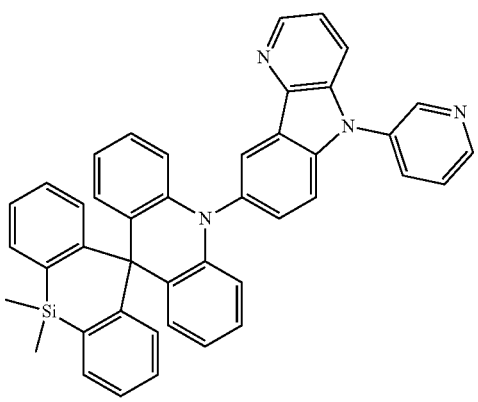
24
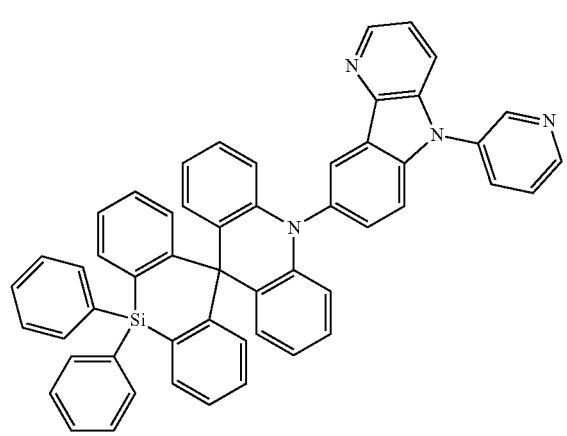

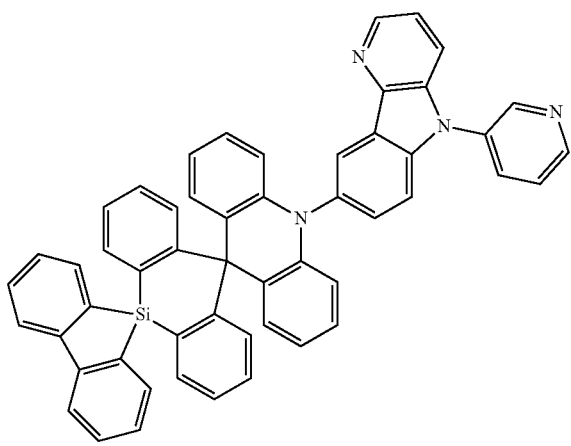
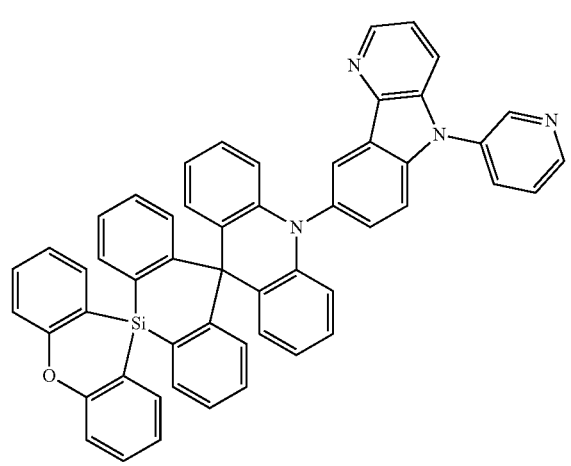
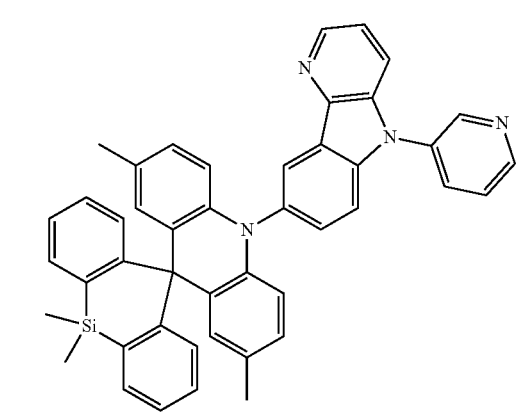
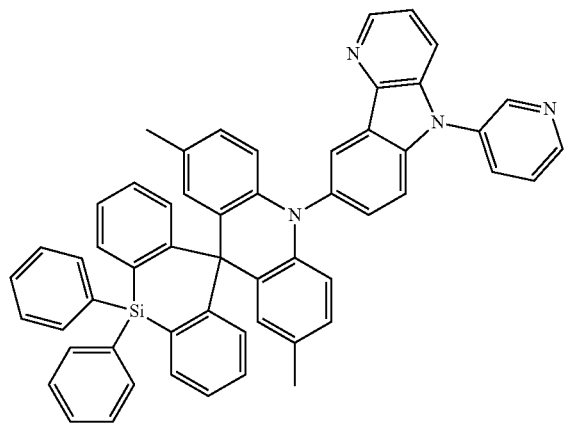
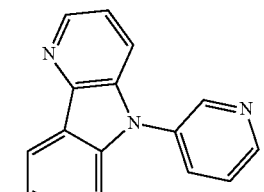
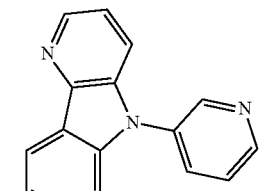
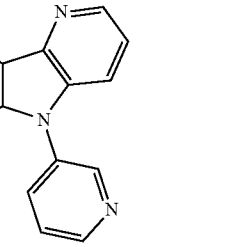

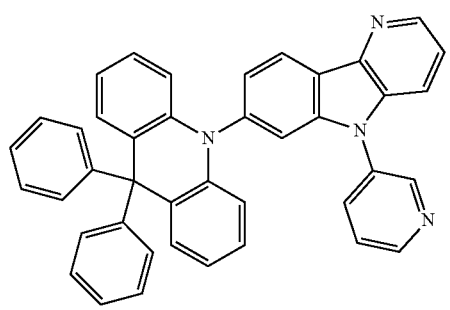
32
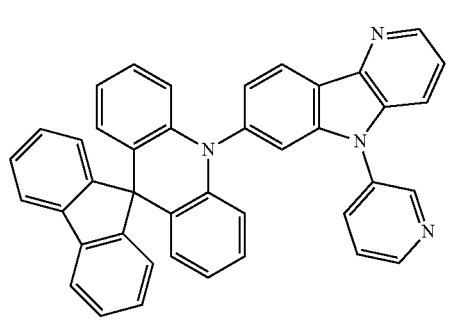
33
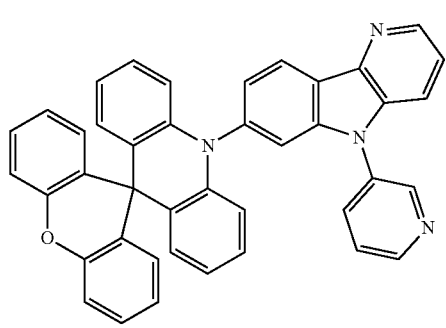
34
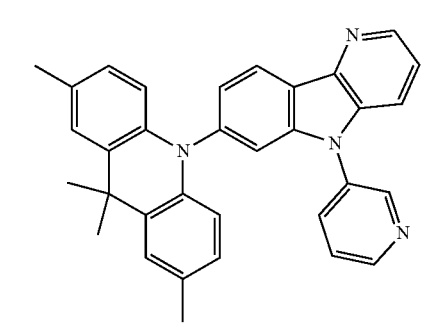
35
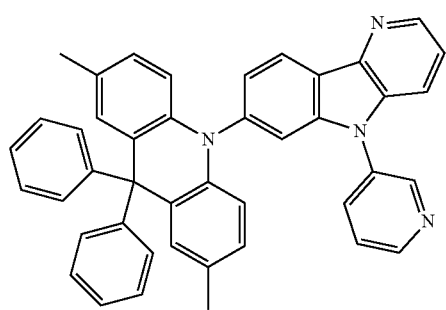
36
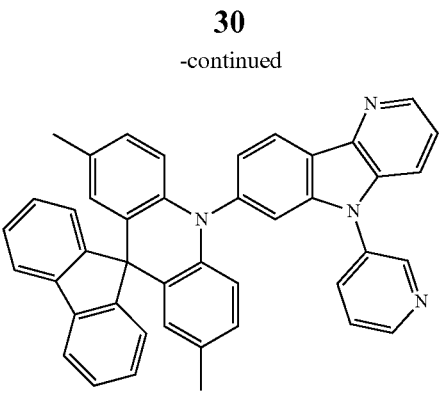
37
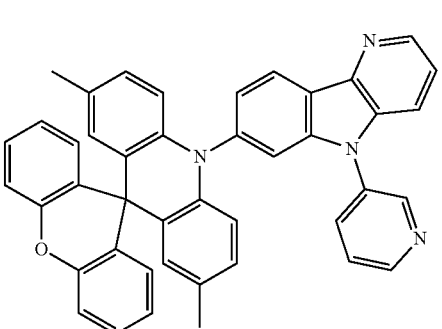
38
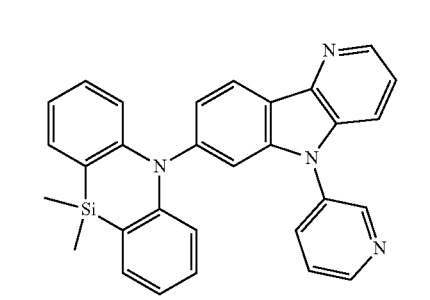
39
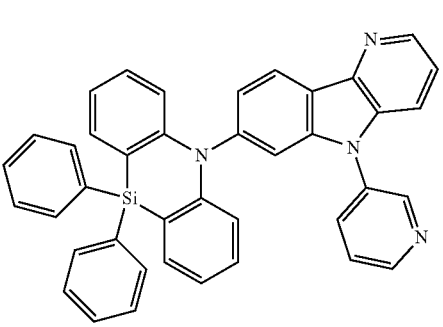
40
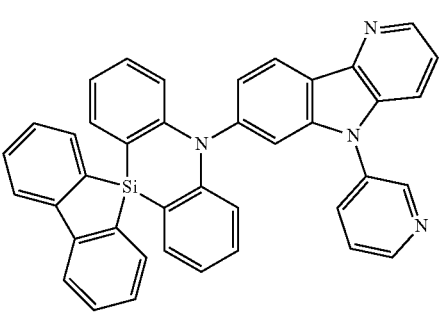
41

42
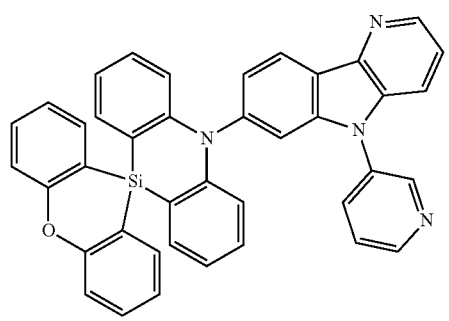
43
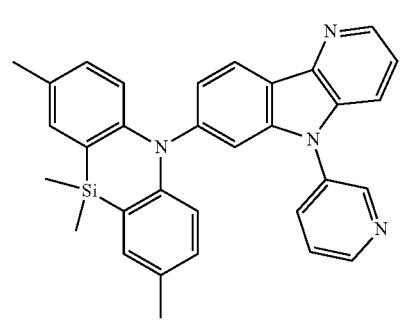
44
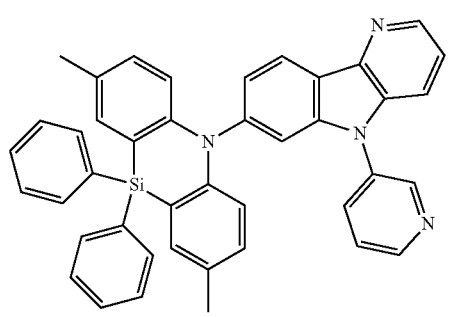
45
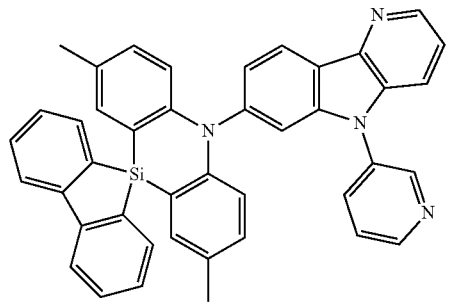
46
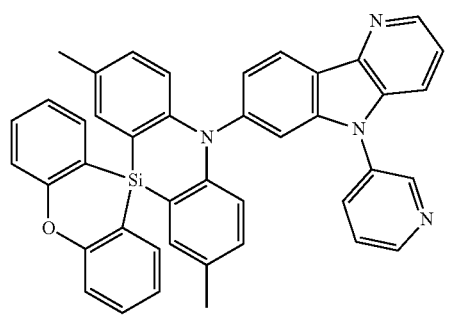
47
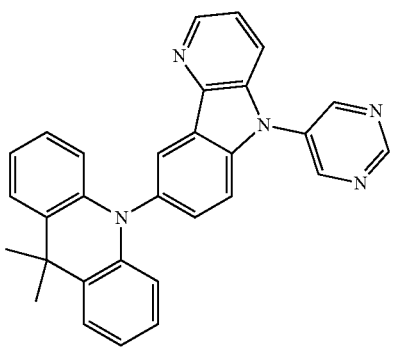
48
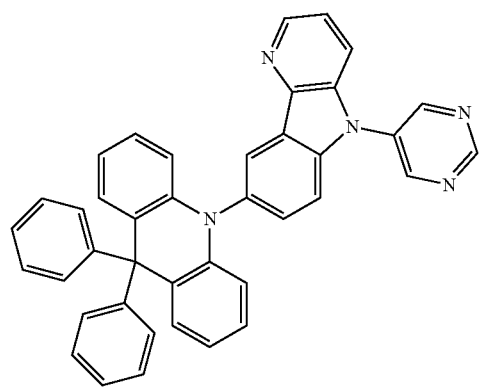
49
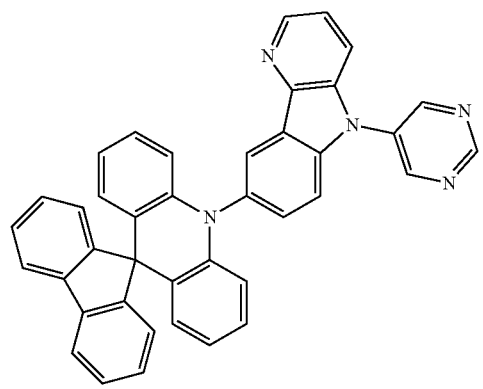
50
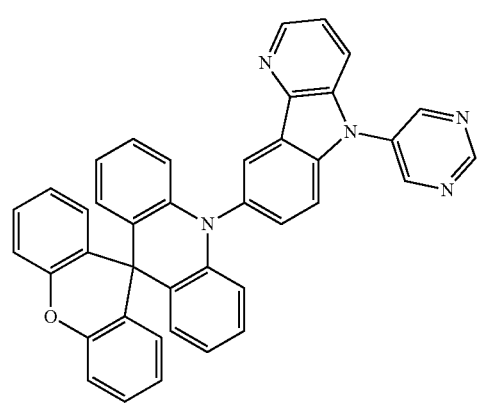

51
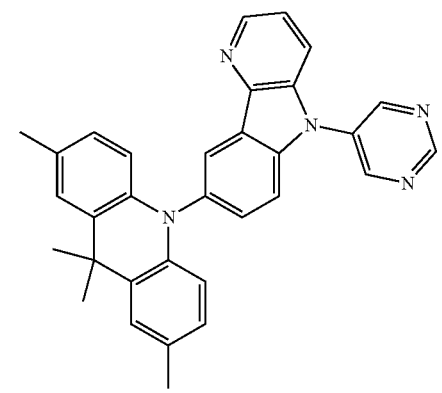
52
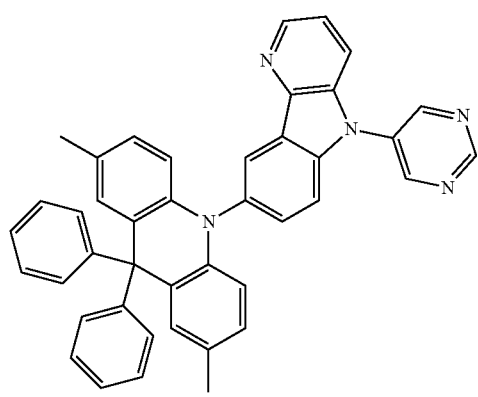
53
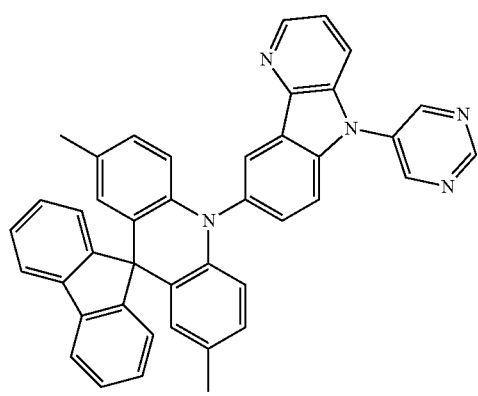
54
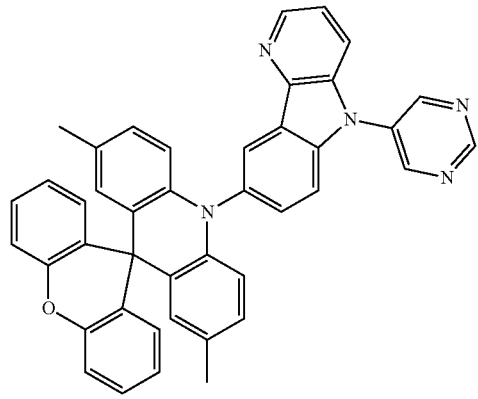
55
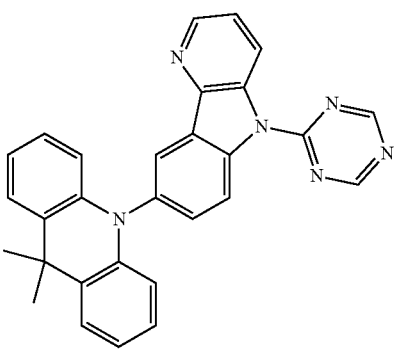
56
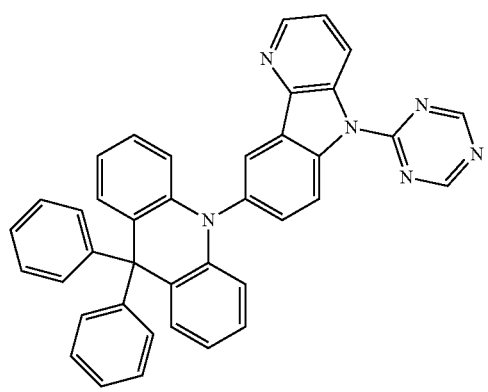
57
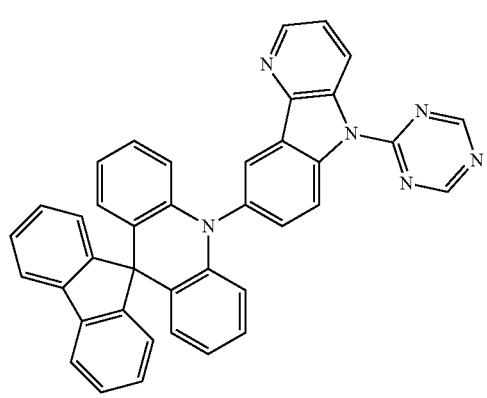
58
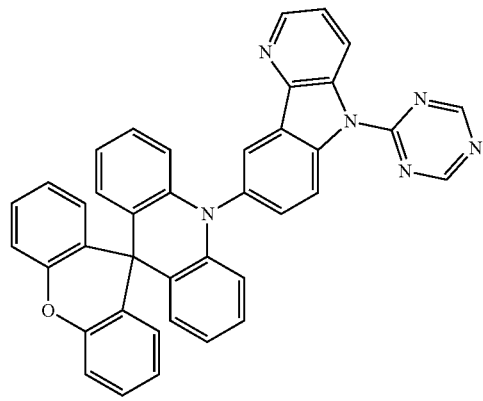

-continued
59
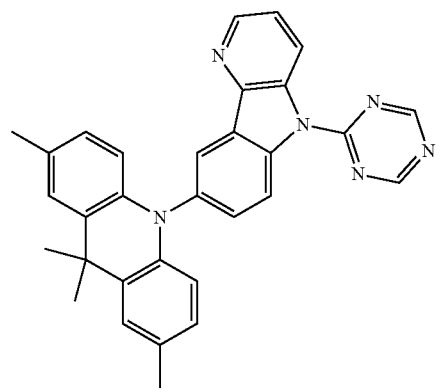
60
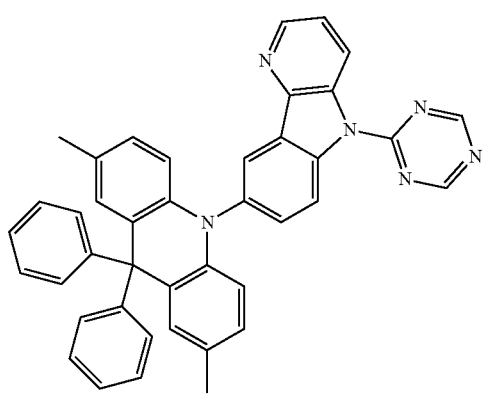
61
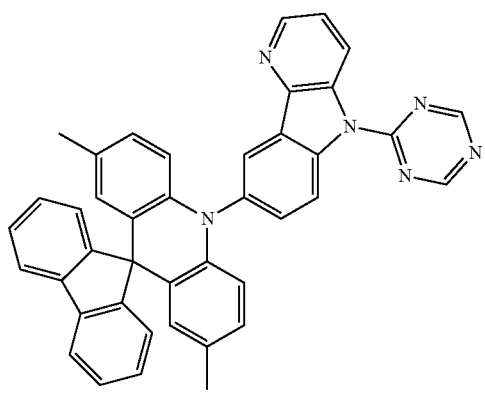
62
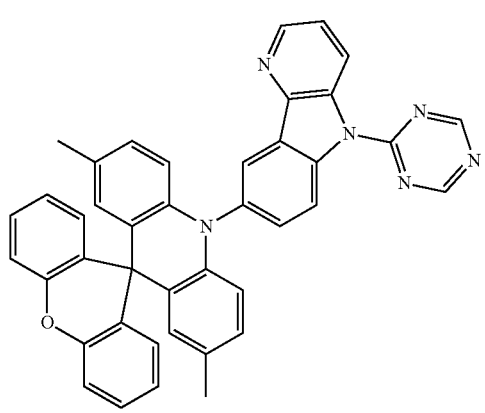
-continued
63
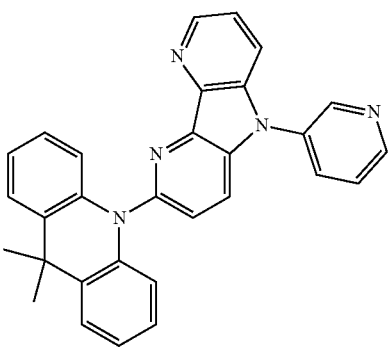
64
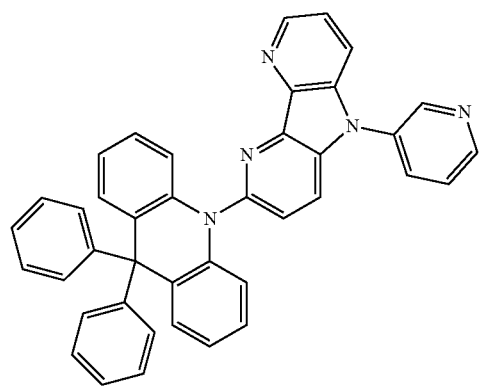
65
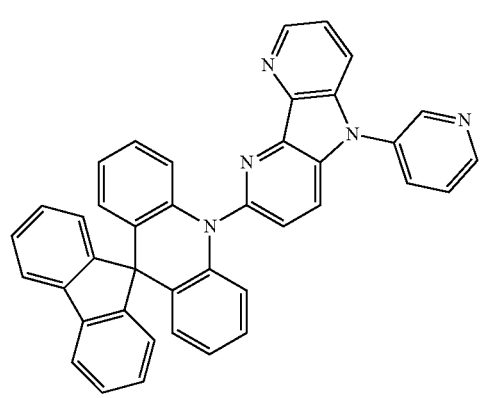
66
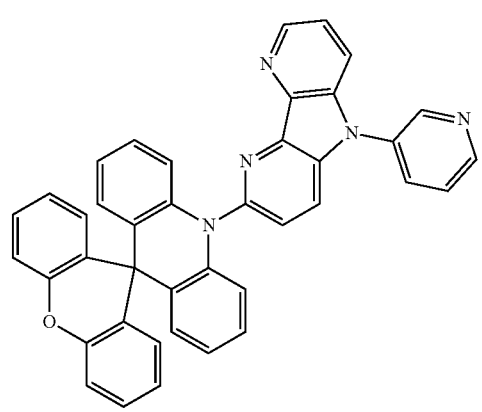

-continued
67
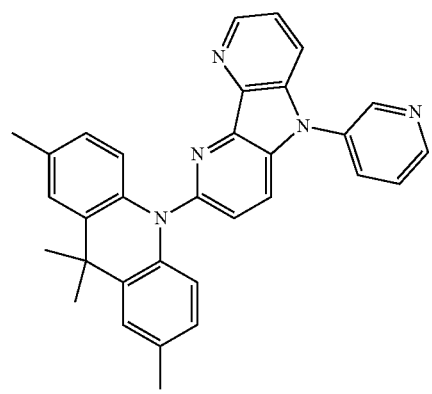
68
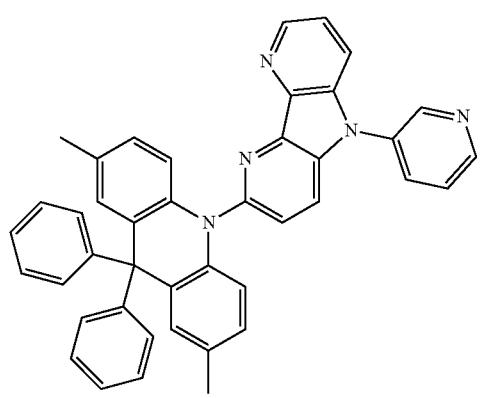
69
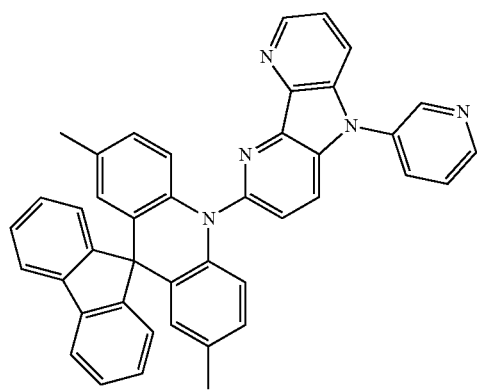
70
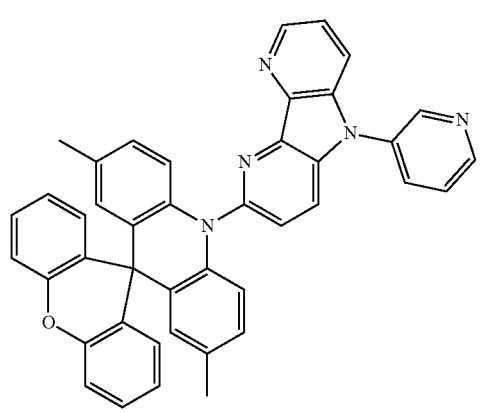
-continued
71
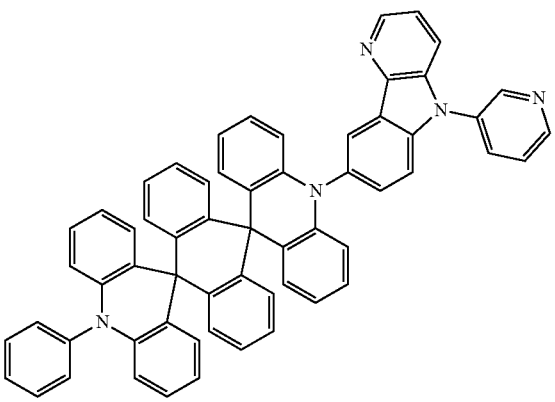
72
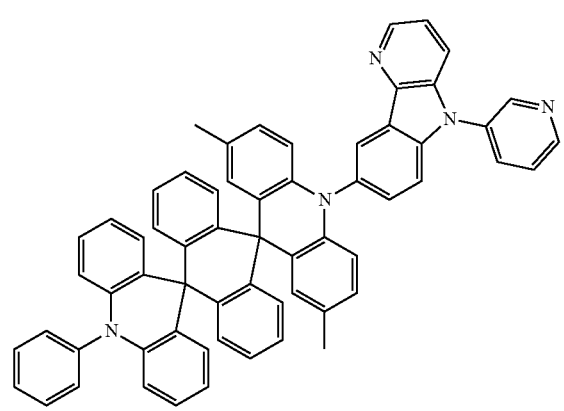
73
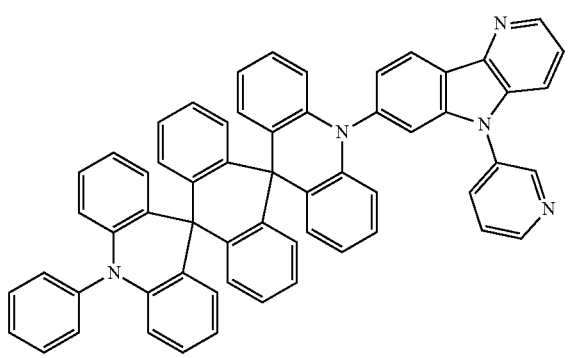
74
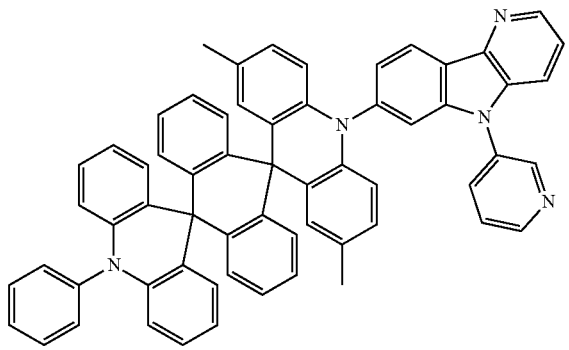

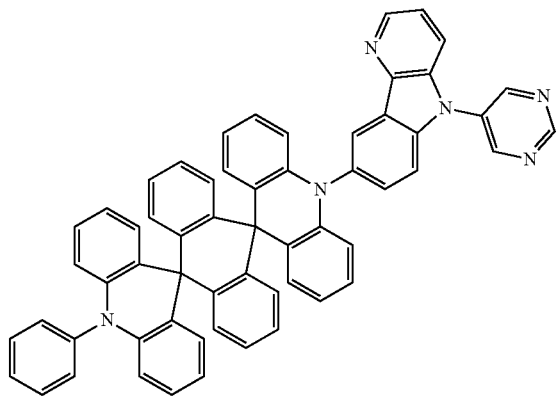
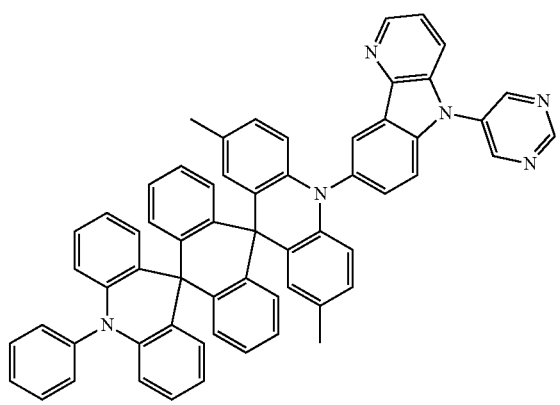
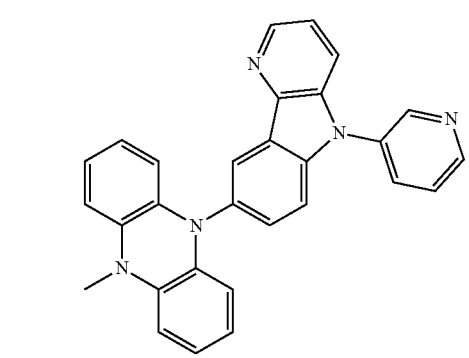
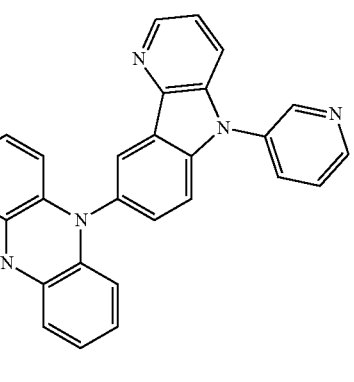
The nitrogen-containing compound represented by Formula 1 according to an embodiment of the present disclosure may be, but is not limited to, one selected from the compounds represented by Compound Group 2 below:
Compound Group 2
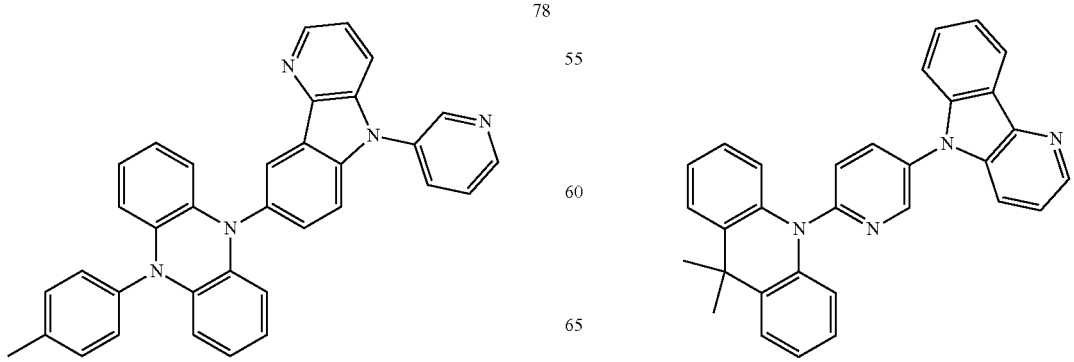

82
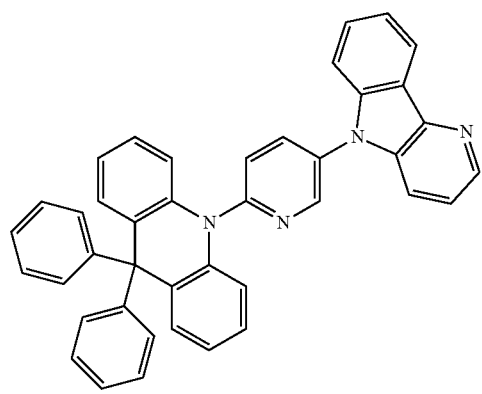
83
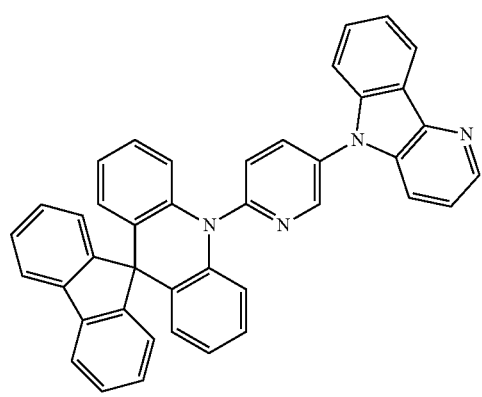
84
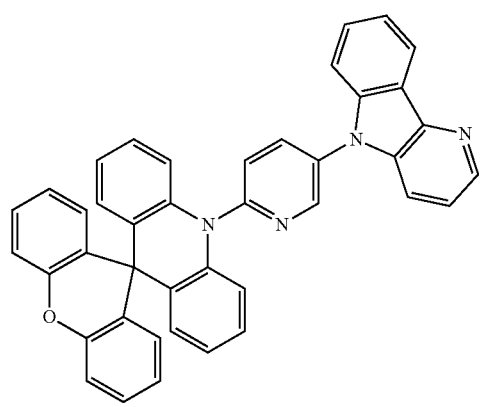
85
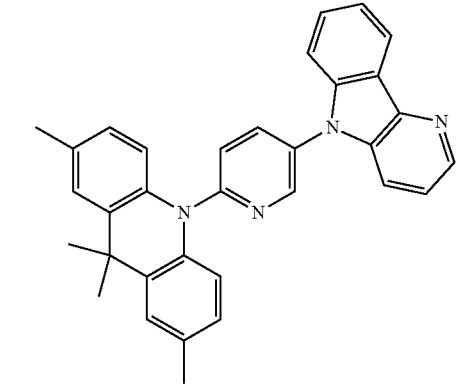
86
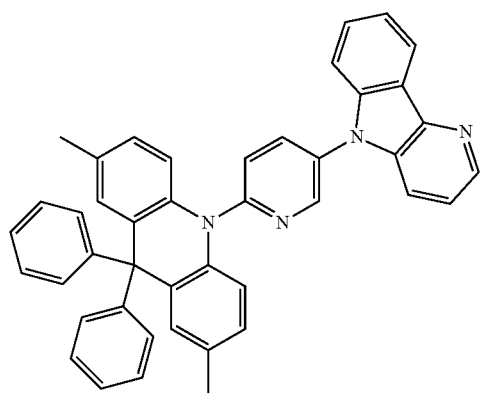
87
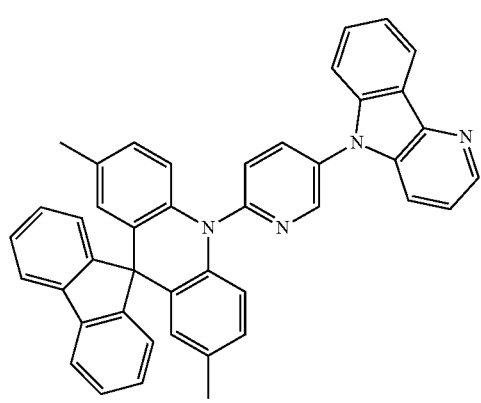
88
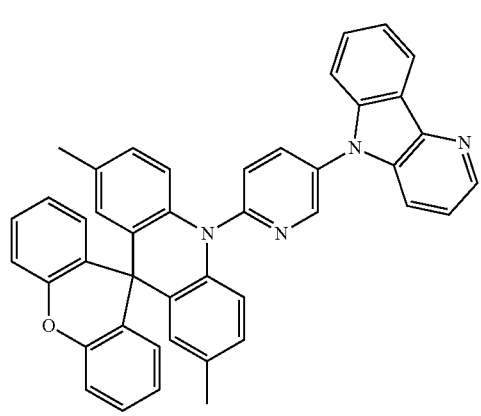
89
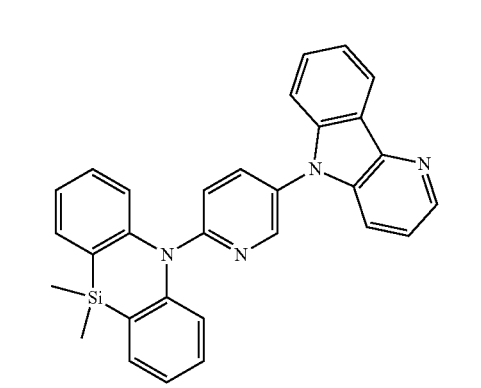

90
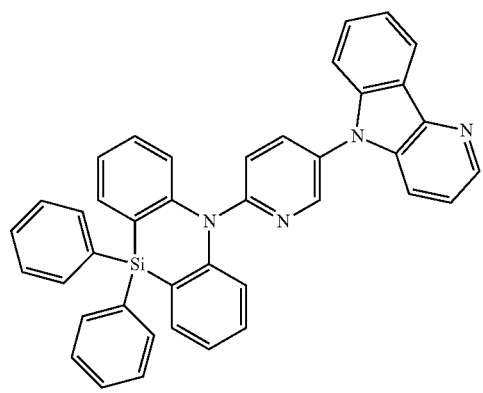
91
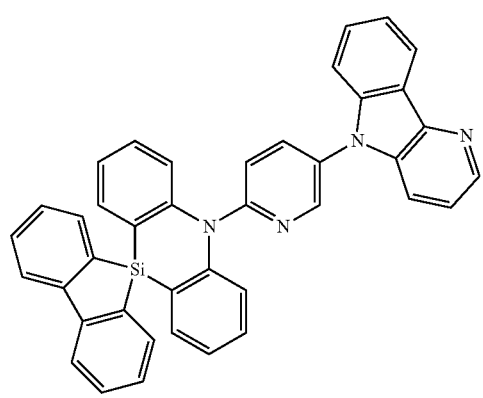
92
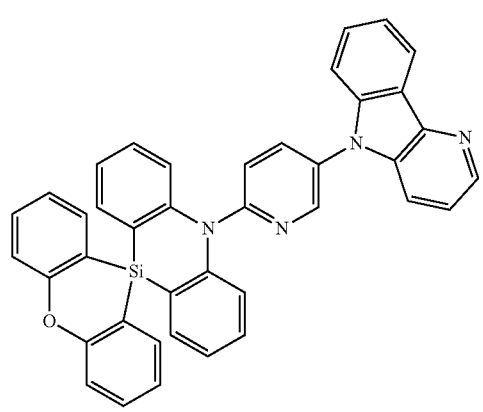
93
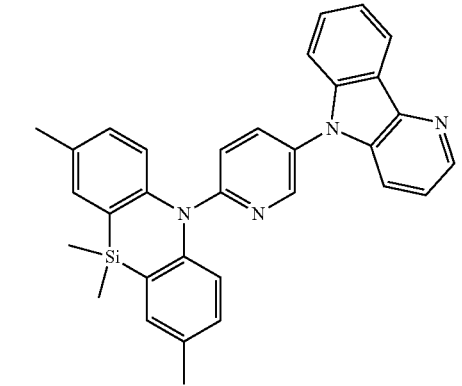
94
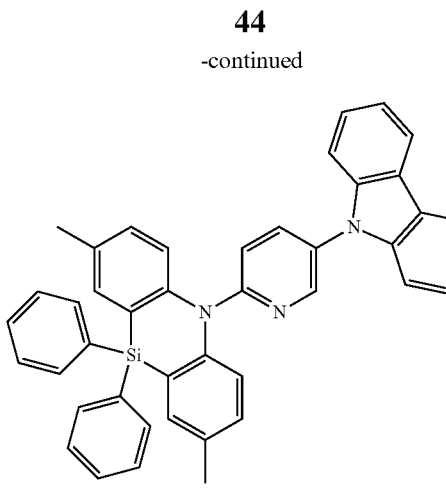
95
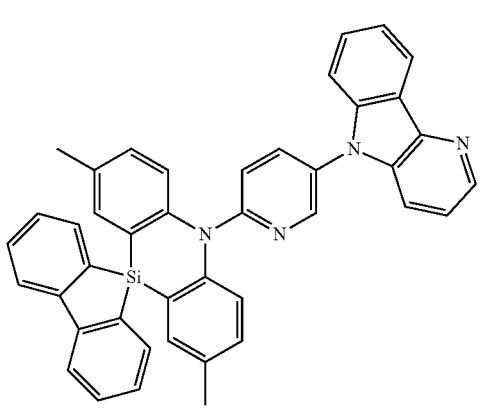
96
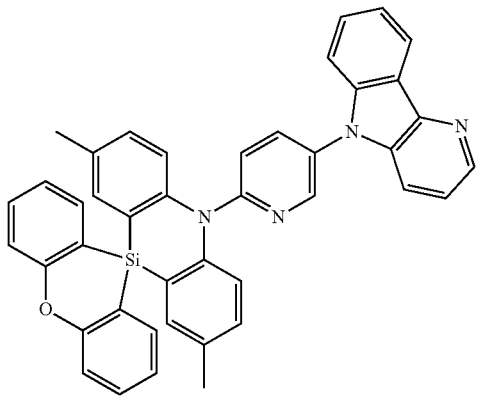
97
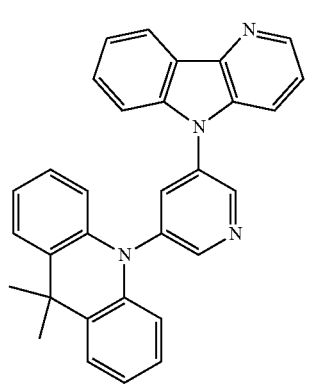

-continued
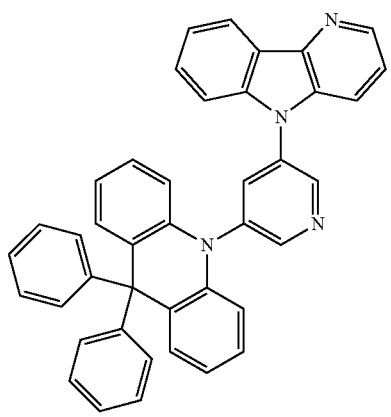
98
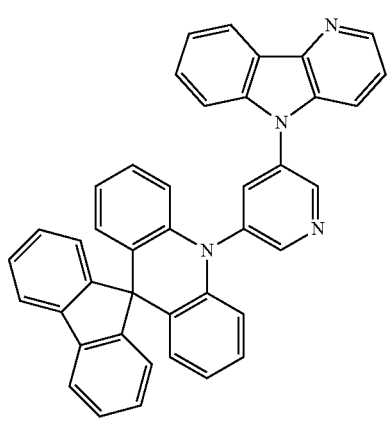
99
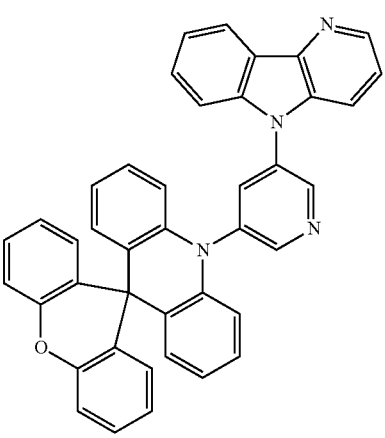
100
-continued
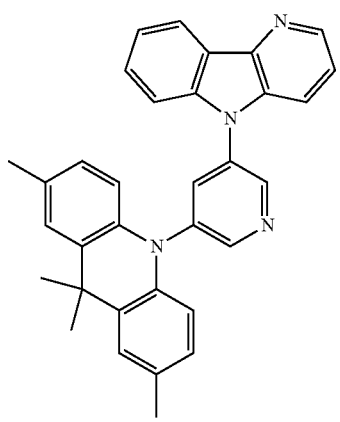
101
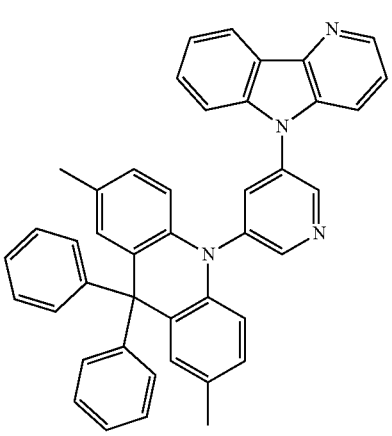
102
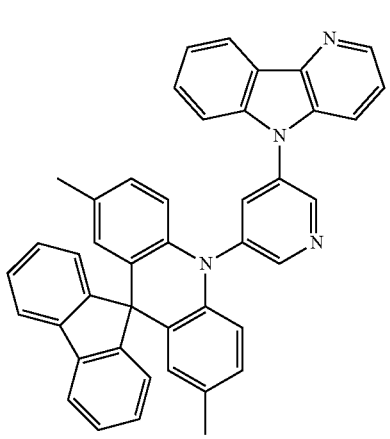
103

104
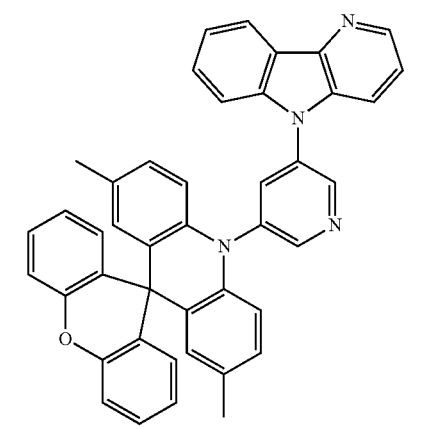
105
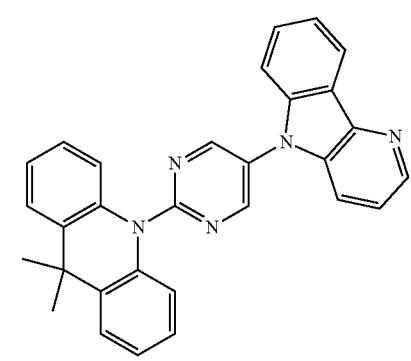
106
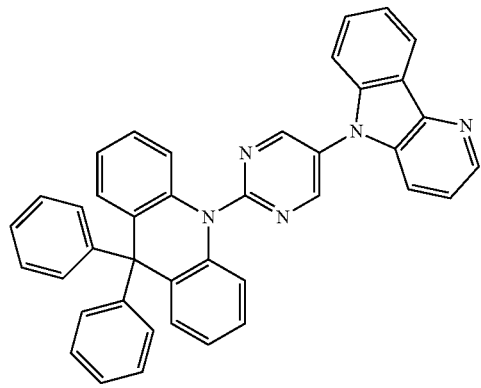
107
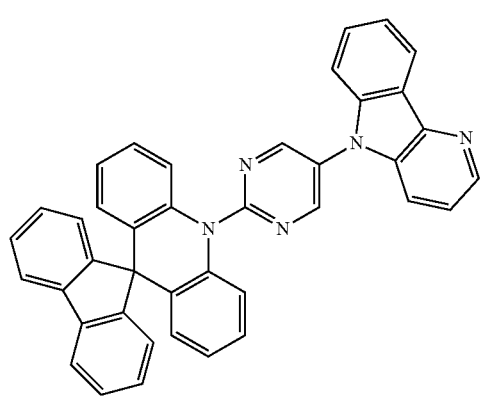
108
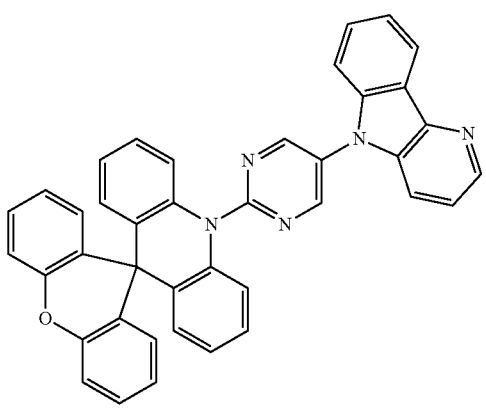
109
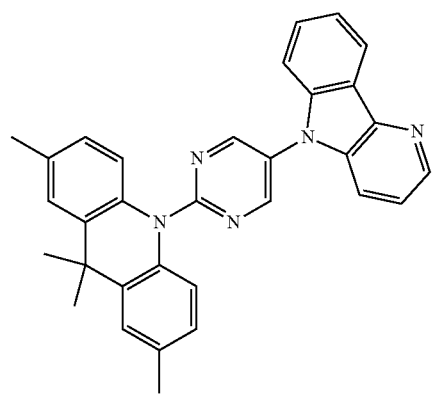
110
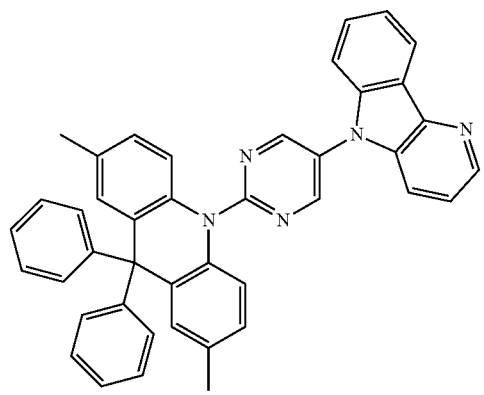
111
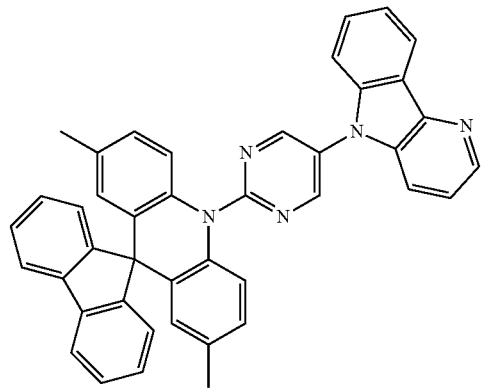

112
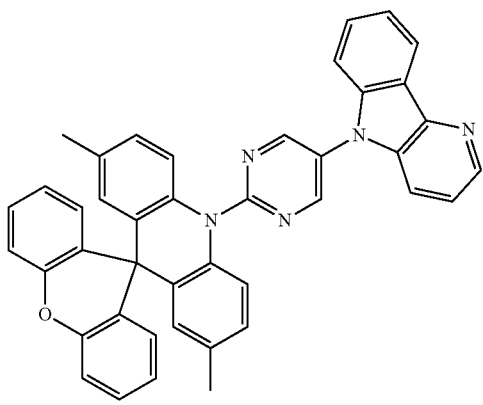
116
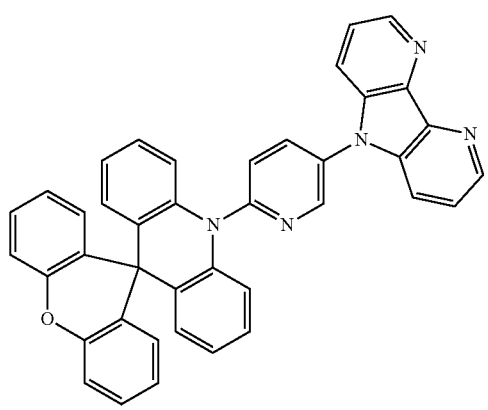
113
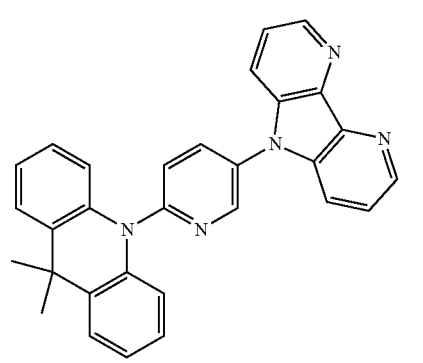
117
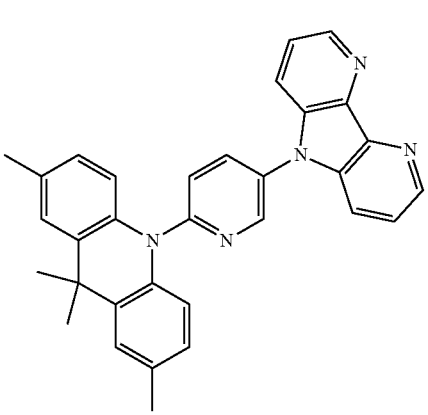
114
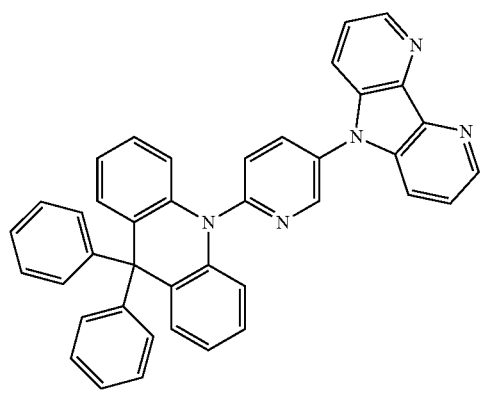
118
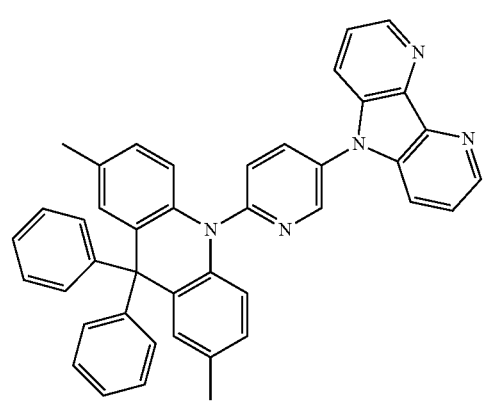
115
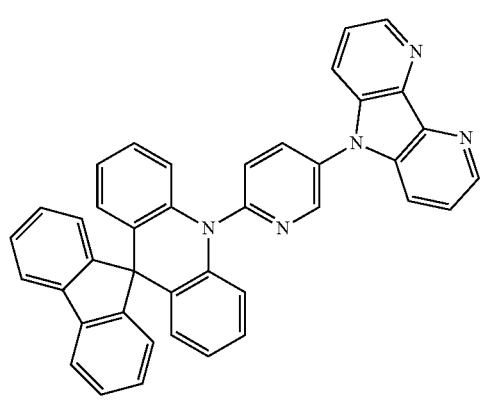
119
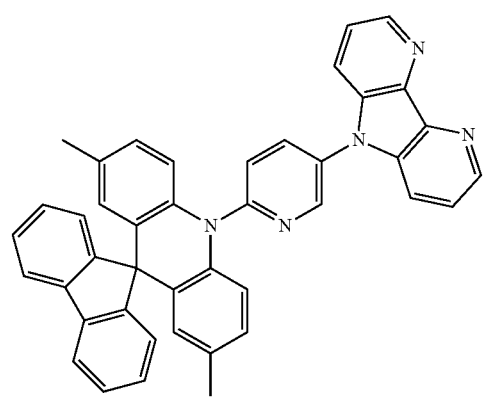

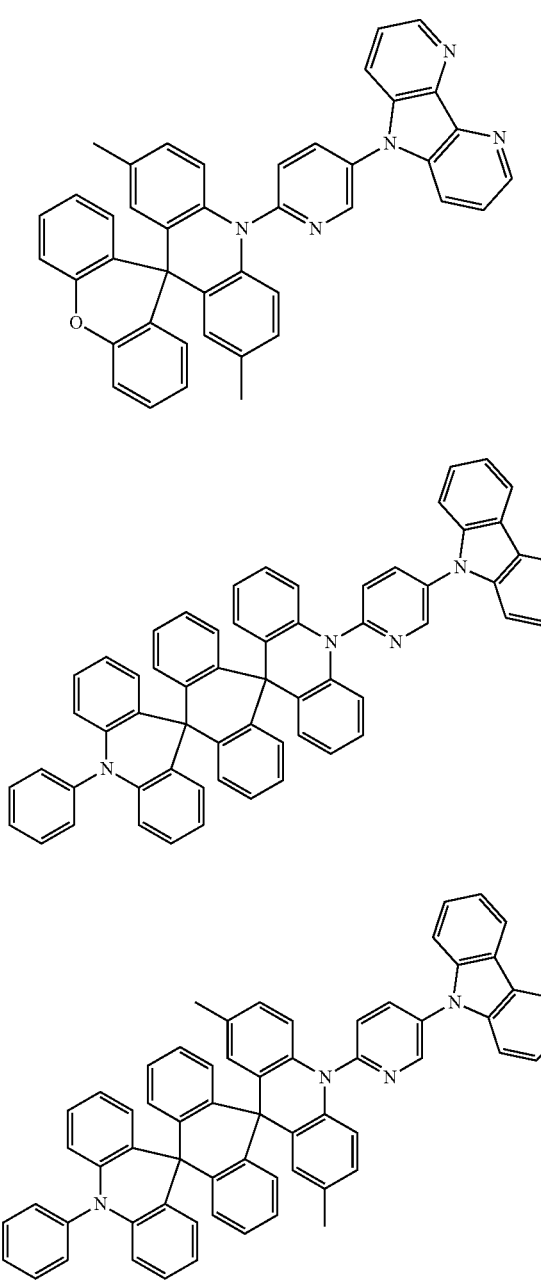

The nitrogen-containing compound according to an embodiment of the present disclosure has a structure in which the difference between the singlet energy level and the triplet energy level is close to zero, and thus may be applied to a thermally activated delayed fluorescence material. Further, the nitrogen-containing compound according to an embodiment of the present disclosure may be applied to a light emitting material emitting blue light having a wavelength range of less than about 470 nm, and for example, may be applied to a light emitting material emitting deep blue having a wavelength range of about 440 nm to about 470 nm or about 450 nm to about 470 nm.

An embodiment of the present disclosure provides a nitrogen-containing compound represented by Formula A below:

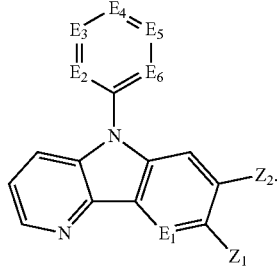

Formula A

In Formula A, $E_1$ is CH or N; $E_2$ to $E_6$ are each independently $CZ_3$ or N, at least one of $E_2$ to $E_6$ is N; $Z_1$ to $Z_3$ are each independently represented by hydrogen or Formula B below, and at least one of $Z_1$ to $Z_3$ is represented by Formula B below:

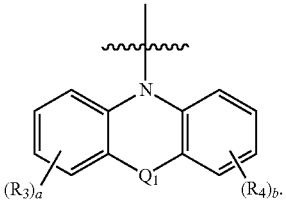

Formula B

In Formula B, $Q_1$ is $CY_1Y_2$, $SiY_3Y_4$, $NY_5$, O or S; and $R_3$, $R_4$, and $Y_1$ to $Y_5$ are each independently hydrogen, deuterium, a cyano group, a substituted or unsubstituted alkyl group having 1 to 10 carbon atoms, a substituted or unsubstituted aryl group having 6 to 30 ring-forming carbon atoms, or a substituted or unsubstituted heteroalkyl group having 2 to 30 ring-forming carbon atoms, and $Y_1$ and $Y_2$, and $Y_3$ and $Y_4$ may combine with each other to form a hydrocarbon ring or a heterocycle; and a and b are each independently an integer of 1 to 4.

Formula B is the same as Formula 2 described above, and thus a detailed description of Formula B will not be provided herein.

The compound represented by Formula A may be, for example, any one selected from the compounds represented by Compound Group 1 and Compound Group 2 described above.

The compound represented by Formula A may be represented by any one of Formulae 1-1 to 1-4 described above, and the detailed description of these formulae may be applied equally.

The compound represented by Formula A may have an absolute value of the difference between the singlet energy level and the triplet energy level of 0.2 eV or less, for example, 0.1 eV or less, 0.07 eV or less, or 0.05 eV or less. The compound represented by Formula A may be applied to a thermally activated delayed fluorescence material.

The compound represented by Formula A may be also applied to a light emitting material emitting blue light having a wavelength range of less than about 470 nm, and for example, may be applied to a light emitting material emitting deep blue having a wavelength range of about 440 nm to 470 nm or about 450 nm to about 470 nm.

Hereinafter, an organic electroluminescence device according to an embodiment of the present disclosure will be described. Hereinafter, portions that are different from the nitrogen-containing compound described above will be described in detail, while the portions that are substantially the same as those in the above-described nitrogen-containing compound will not be described again.

The organic electroluminescence device according to an embodiment of the present disclosure includes the nitrogen-containing compound according to an embodiment of the present disclosure described above. The organic electroluminescence device according to an embodiment of the present disclosure may include the nitrogen-containing compound represented by Formula 1 or the nitrogen-containing compound represented by Formula A described above.

Hereinafter, an example embodiment in which the organic electroluminescence device according to an embodiment of the present disclosure includes the nitrogen-containing compound represented by Formula 1 will be described. However, the nitrogen-containing compound represented by Formula 1 may be replaced by the heterocyclic compound represented by Formula A.

FIG. 1 is a cross-sectional view schematically illustrating an organic electroluminescence device according to an embodiment of the present disclosure.

Figure 2:
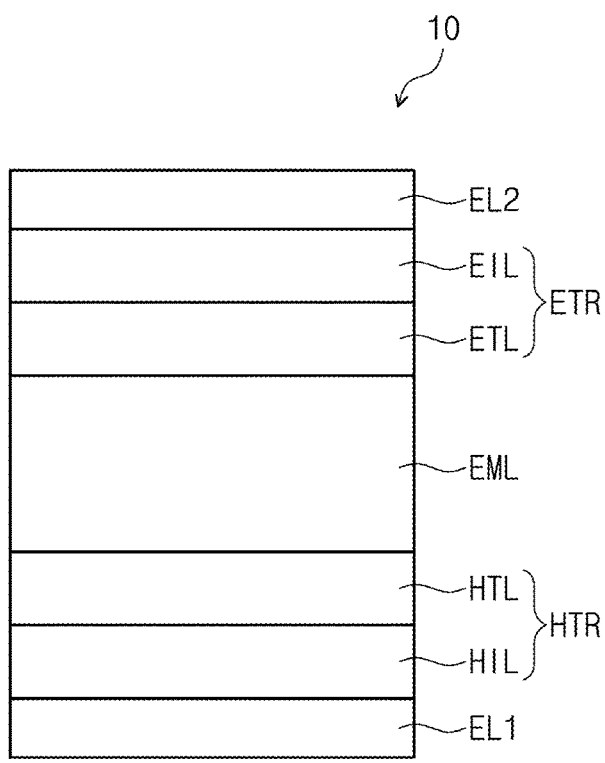

FIG. 2 is a cross-sectional view schematically illustrating an organic electroluminescence device according to an embodiment of the present disclosure.

Figure 3:
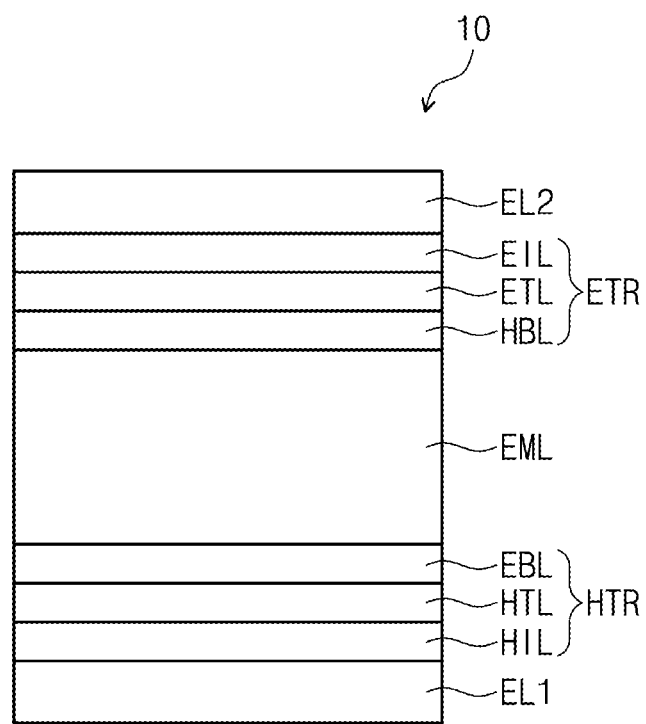

FIG. 3 is a cross-sectional view schematically illustrating an organic electroluminescence device according to an embodiment of the present disclosure.

Referring to FIGS. 1 to 3, an organic electroluminescence device 10 according to an embodiment of the present disclosure includes a first electrode EL1, a hole transport region HTR, a light emitting region EML, an electron transport region ETR, and a second electrode EL2.

The first electrode EL1 has conductivity. The first electrode EL1 may be a pixel electrode and/or a positive electrode. The first electrode EL1 may be a transmissive electrode, a semi-transmissive electrode, or a reflective electrode. When the first electrode EL1 is the transmissive electrode, the first electrode EL1 may include a transparent metal oxide such as indium tin oxide (ITO), indium zinc oxide (IZO), zinc oxide (ZnO), indium tin zinc oxide (ITZO), and/or the like. When the first electrode EL1 is the semi-transmissive electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, or a combination or mixture thereof (e.g., a mixture of Ag and Mg). Also, the first electrode EL1 may have a multilayered structure including a reflective film or a semi-transmissive film formed of the above material and a transparent conductive film formed of indium tin oxide (ITO), indium zinc oxide (IZO), indium tin zinc oxide (ITZO), and/or the like. For example, the first electrode EL1 may have, but is not limited to, a three-layered structure of ITO/Ag/ITO.

The thickness of the first electrode EL1 may be about 1,000 Å to about 10,000 Å, for example, about 1,000 Å to about 3,000 Å.

The hole transport region HTR is provided on the first electrode EL1. The hole transport region HTR may include at least one of a hole injection layer HIL, a hole transport layer HTL, a hole buffer layer, and an electron blocking layer EBL.

The hole transport region HTR may have a single layer composed of a single material, a single layer composed of a plurality of different materials, or multiple layers composed of a plurality of different materials.

For example, the hole transport region HTR may have a single-layered structure having a hole injection layer HIL or a hole transport layer HTL, or may have a single-layered structure composed of a hole injection material and a hole transport material. In some embodiments, the hole transport region HTR may have a single-layered structure composed of a plurality of different materials, or a structure of the hole injection layer HIL/the hole transport layer HTL, the hole injection layer HIL/the hole transport layer HTL/the hole buffer layer, the hole injection layer HIL/the hole buffer layer, the hole transport layer HTL/the hole buffer layer, or the hole injection layer HIL/the hole transport layer HTL/the electron blocking layer EBL, which are sequentially stacked from the first electrode EL1. However, the embodiment is not limited thereto.

The hole transport region HTR may be formed by using various methods such as vacuum deposition, spin coating, casting, Langmuir-Blodgett (LB), inkjet printing, laser printing, and/or laser induced thermal imaging (LITI).

The hole injection layer HIL may include, for example, a phthalocyanine compound (such as copper phthalocyanine), DNTPD(N,N'-diphenyl-N,N'-bis-[4-(phenyl-m-tolylamino)-phenyl]-biphenyl-4,4'-diamine), m-MTDATA(4,4',4"-tris(3-methylphenylphenylamino) triphenylamine), TDATA(4,4'4"-Tris(N,N-diphenylamino)triphenylamine), 2-TNATA(4,4',4"-tris{N,-(2-naphthyl)-N-phenylamino}-triphenylamine), PEDOT/PSS(Poly(3,4-ethylenedioxythiophene)/Poly(4-styrenesulfonate)), PANI/DBSA(Polyaniline/Dodecylbenzenesulfonic acid), PANI/CSA(Polyaniline/Camphor sulfonicacid), PANI/PSS((Polyaniline)/Poly(4-styrenesulfonate)), NPD(N,N'-di(naphthalene-l-yl)-N,N'-diplienyl-benzidine), polyetherketone (TPAPEK) including triphenylamine, 4-Isopropyl-4'-methyldiphenyliodonium Tetrakis(pentafluorophenyl)borate], and/or HAT-CN (dipyrazino[2,3-f: 2',3'-h] quinoxaline-2,3,6,7,10,11-hexacarbonitrile).

The hole transport layer HTL may include, for example, carbazole-based derivatives (such as N-phenylcarbazole and polyvinylcarbazole), fluorine-based derivatives, triphenylamine-based derivatives (such as TPD(N,N'-bis(3-methylphenyl)-N,N'-diphenyl-[1,1-biphenyl]-4,4'-diamine) and TCTA(4,4',4"-tris(N-carbazolyl)triphenylamine)), NPD (N,N'-di(naphthalene-1-yl)-N,N'-diplienyl-benzidine), TAPC(4,4'-Cyclohexylidene bis[N,N-bis(4-methylphenyl) benzenamine]), HMTPD(4,4'-Bis[N,N'-(3-tolyl)amino]-3,3'-dimethylbiphenyl), and/or the like.

The electron blocking layer EBL may include suitable materials known in the art. The electron blocking layer EBL may include, for example, carbazole-based derivatives (such as N-phenylcarbazole and polyvinylcarbazole), fluorine-based derivatives, triphenylamine-based derivatives (such as TPD(N,N'-bis(3-methylphenyl)-N,N'-diphenyl-[1,1-biphenyl]-4,4'-diamine) and TCTA(4,4',4"-tris(N-carbazolyl)triphenylamine)), NPD(N,N'-di(naphthalene-1-yl)-N,N'-diplienyl-benzidine), TAPC(4,4'-Cyclohexylidene bis[N,N-bis (4-methylphenyl)benzenamine]), HMTPD(4,4'-Bis[N,N'-(3-tolyl)amino]-3,3'-dimethylbiphenyl), mCP, and/or the like. In addition, as described above, the electron blocking layer EBL may include the nitrogen-containing compound according to an embodiment of the present disclosure.

The thickness of the hole transport region HTR may be about 100 Å to about 10,000 Å, for example, about 100 Å to about 5000 Å. The thickness of the hole injection layer HIL may be, for example, about 30 Å to about 1000 Å, and the thickness of the hole transport layer HTL may be about 30 Å to about 1000 Å. For example, the thickness of the electron blocking layer may be about 10 Å to about 1000 Å. When the thicknesses of the hole transport region HTR, the hole injection layer HIL, the hole transport layer HTL and the electron blocking layer EBL are satisfied within any of the above-described ranges, satisfactory (or suitable) hole transport region characteristics may be obtained without a substantial increase in driving voltage.

In addition to the above-mentioned materials, the hole transport region HTR may further include a charge-generating material in order to improve conductivity. The charge-generating material may be dispersed uniformly or randomly in the hole transport region HTR. The charge-generating material may be, for example, a p-dopant. The p-dopant may be, but is not limited to, one of the compounds containing a quinone derivative, a metal oxide, and/or a cyano group. For example, unrestrictive examples of the p-dopant may include, but are not limited to, quinone derivatives (such as tetracyanoquinodimethane (TCNQ) and/or 2,3,5,6-tetrafluoro-tetracyanoquinodimethane (F4-TCNQ)), and metal oxides (such as tungsten oxide and/or molybdenum oxide).

As described above, the hole transport region HTR may further include at least one of the hole buffer layer and the electron blocking layer EBL. The hole buffer layer may compensate a resonant distance depending on the wavelength of light emitted from the light emitting layer EML to increase light emission efficiency. As a material included in the hole buffer layer, any suitable material for the hole transport region HTR may be used. The electron blocking layer EBL is a layer which serves to prevent or reduce the electron injection from the electron transport region ETR into the hole transport region HTR.

The light emitting layer EML is provided on the hole transport region HTR. The light emitting layer EML may have, for example, a thickness of about 100 Å to about 1000 Å, or about 100 Å to about 300 Å. The light emitting layer EML may have a multilayered structure having a single layer composed of a single material, a single layer composed of a plurality of different materials, or multiple layers composed of a plurality of different materials.

Hereinafter, an example embodiment in which the nitrogen-containing compound according to the present disclosure described above is included in the light emitting layer EML will be described. The nitrogen-containing compound according to an embodiment of the present disclosure may be included, but not limited to, in at least one layer of the one more organic layers provided between the first electrode EL1 and the second electrode EL2. In one or more embodiments, the nitrogen-containing compound according to an embodiment of the present disclosure may be included in the hole transport region HTR. For example, the nitrogen-containing compound according to an embodiment of the present disclosure may be included in the hole transport layer HTL or the electron blocking layer EBL.

The light emitting layer EML may include the nitrogen-containing compound according to an embodiment of the present disclosure described above. For example, the light emitting layer EML may include the nitrogen-containing compound represented by Formula 1 below:

Formula 1

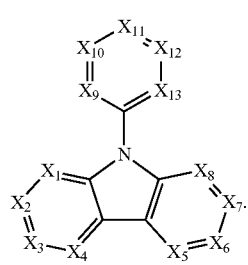

In Formula 1, the description about $X_1$ to $X_{13}$ is the same as described above, and thus will not be provided herein. For example, at least one of $X_1$ to $X_{13}$ may be $CR_2$, and $R_2$ is represented by Formula 2 below:

Formula 2

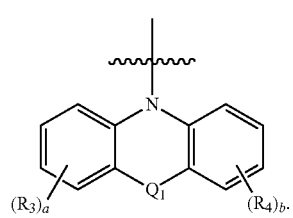

In Formula 2, the description about $Q_1$, $R_3$, $R_4$, a and b is the same as described above, and thus will not be provided herein.

For example, Formula 1 may be represented by any one of Formulae 1-1 to 1-4 described above. For example, Formula 1 may be represented by any one of Formulae 1-1-1 to 1-1-3 described above. For example, Formula 1 may be represented by any one of Formulae 1-2-1 to 1-2-3 described above. For example, Formula 1 may be represented by Formulae 1-3-1 or 1-3-2 described above. For example, Formula 1 may be represented by Formulae 1-4-1 or 1-4-2 described above.

For example, Formula 2 may be represented by any one of Formulae 2-1 to 2-10 described above.

The light emitting layer EML may include at least one (e.g., two) nitrogen-containing compounds represented by Formula 1. The light emitting layer EML may further include a suitablematerial, in addition to the nitrogen-containing compound represented by Formula 1. For example, the light emitting layer EML may further include, but is not limited to, a fluorescence material including any one selected from spiro-DPVBi, spiro-6P(2,2',7,7'-tetrakis(biphenyl-4-yl)-9,9'-spirobifluorene(spiro-sextaphenyl)), distyryl-benzene (DSB), distyryl-arylene (DSA), polyfluorene (PFO)-based polymer, and poly(p-phenylene vinylene) (PPV)-based polymer.

The light emitting layer EML may include a host and a dopant. The dopant may include the nitrogen-containing compound according to an embodiment of the present disclosure described above. The dopant may be, for example, a thermally activated delayed fluorescence dopant. In other words, the light emitting layer EML may be a layer including the nitrogen-containing compound according to an embodiment of the present disclosure as a dopant and emitting thermally activated delayed fluorescence.

For example, the light emitting layer EML may be a blue light emitting layer emitting blue light through thermally activated delayed fluorescence. The light emitting layer EML may emit blue light having a wavelength range of less than about 470 nm, for example, about 440 nm to about 470 nm, or about 450 nm to about 470 nm.

The host is not particularly limited as long as it is a suitable material. For example, the host may include $Alq_3$ (tris(8-hydroxyquinolino)aluminum), CBP(4,4'-bis(N-carbazolyl)-1,1'-biphenyl), PVK(poly(n-vinylcabazole), ADN (9,10-di(naphthalene-2-yl)anthracene), TCTA(4,4',4"-Tris (carbazol-9-yl)-triphenylamine), TPBi(1,3,5-tris(N-phenylbenzimidazole-2-yl)benzene), TBADN(3-tert-butyl-9,10-di(naphth-2-yl)anthracene), DSA(distyrylarylene), CDBP(4,4'-bis(9-carbazolyl)-2,2'-dimethyl-biphenyl), MADN(2-Methyl-9,10-bis(naphthalen-2-yl)anthracene), DPEPO(bis[2-(diphenylphosphino)phenyl]ether oxide), CP1(Hexaphenyl cyclotriphosphazene), UGH2 (1,4-Bis(triphenylsilyl)benzene), DPSiO₃ (Hexaphenylcyclotrisiloxane), DPSiO₄ (Octaphenylcyclotetra siloxane), PPF(2,8-Bis(diphenylphosphoryl)dibenzofuran), and/or the like.

The host may be, for example, at least one selected from the compounds below:

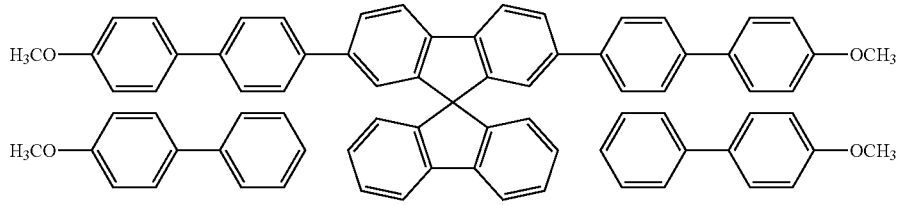

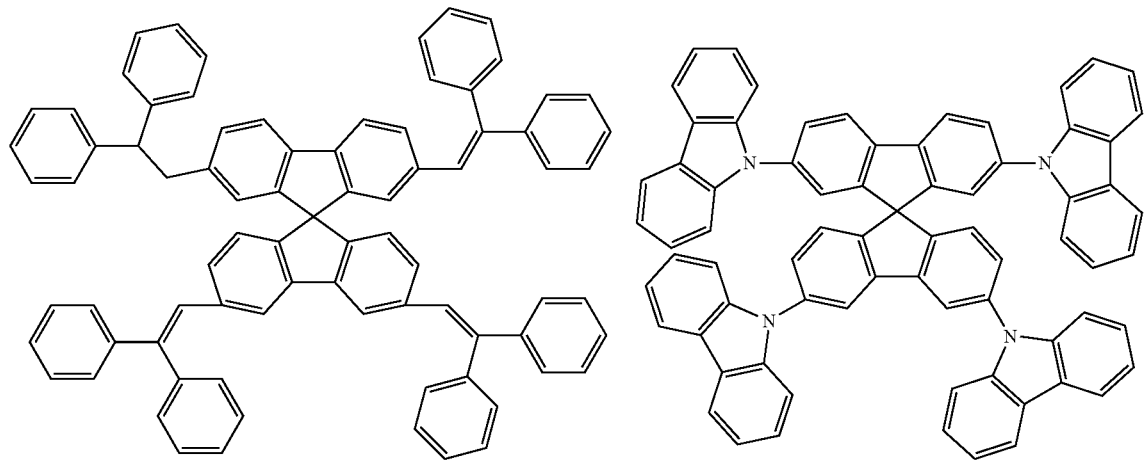

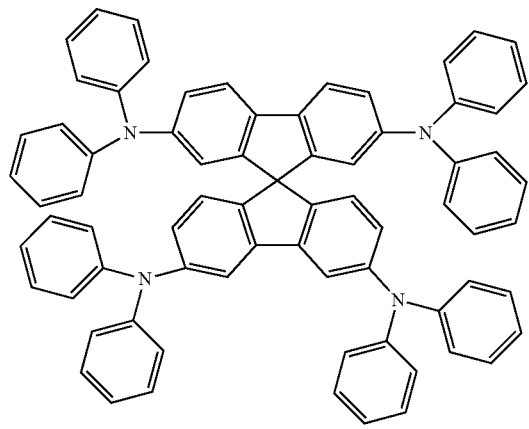

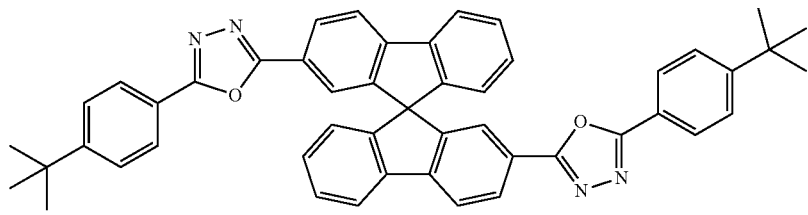

-continued
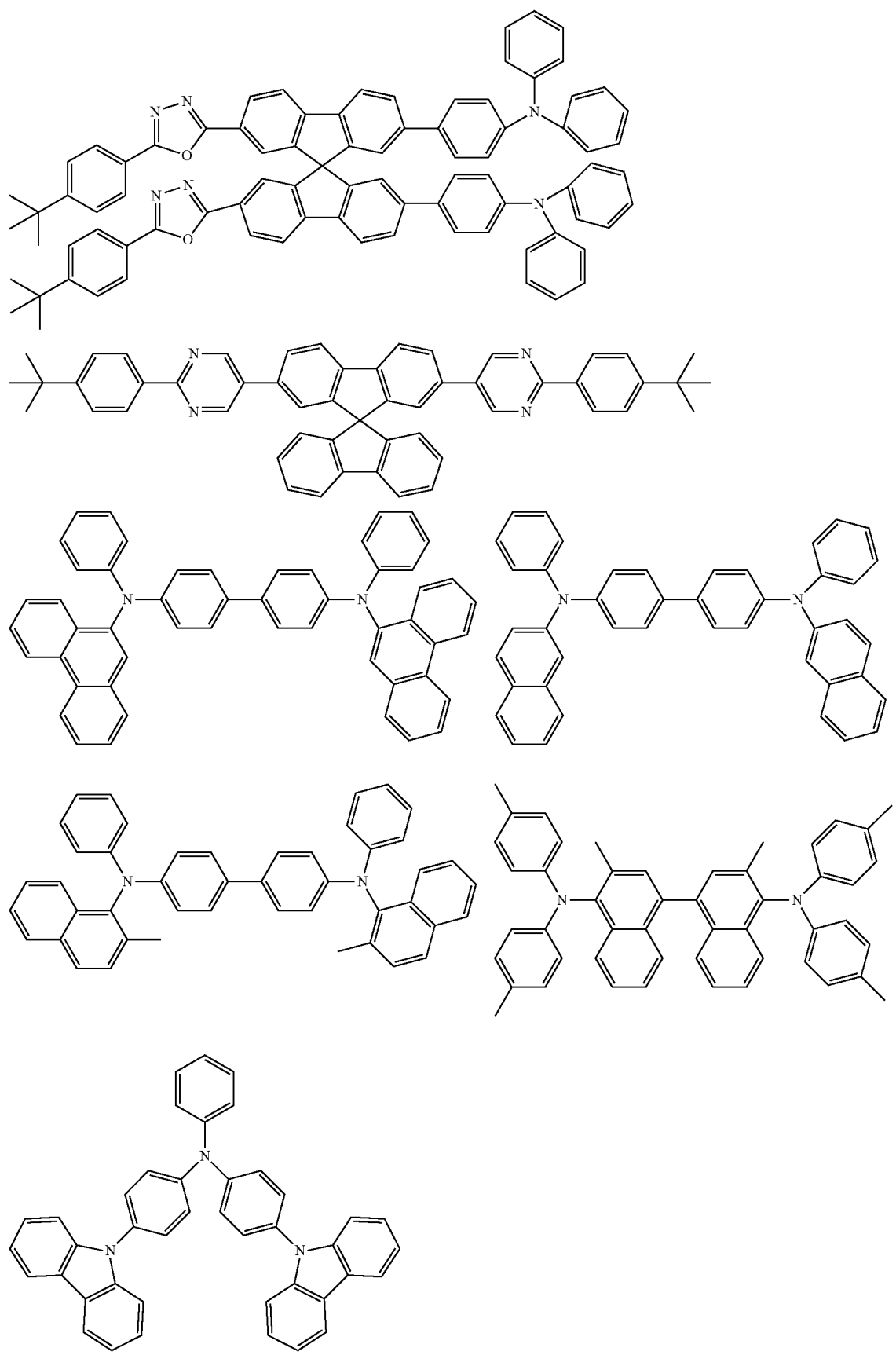

-continued
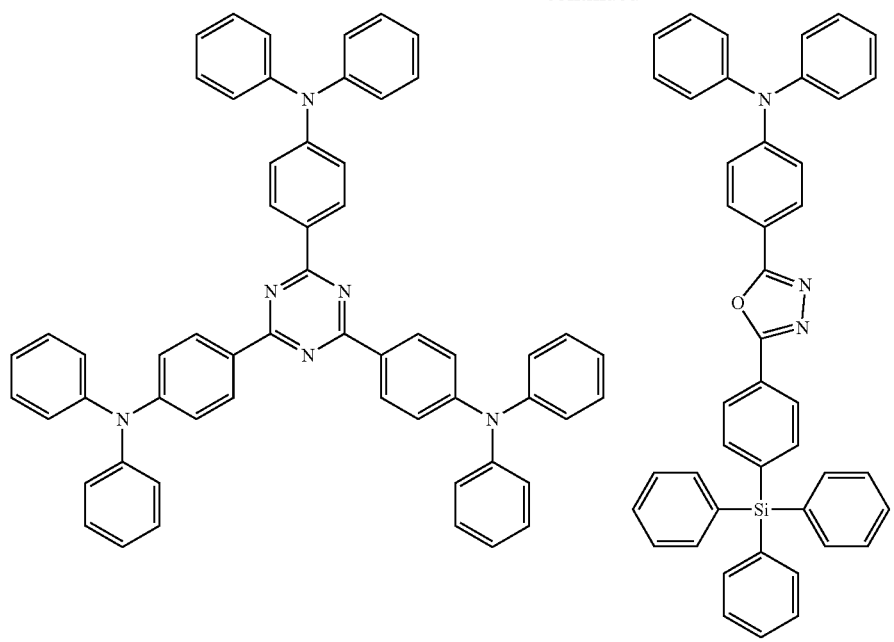
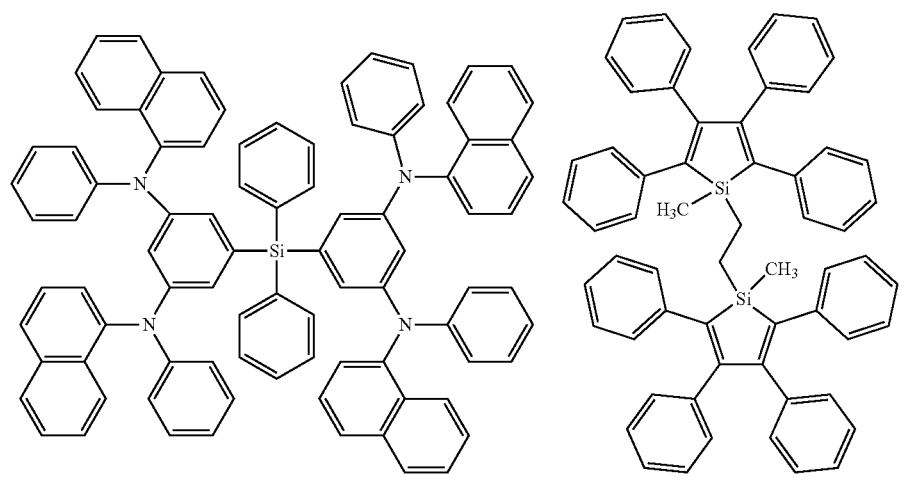
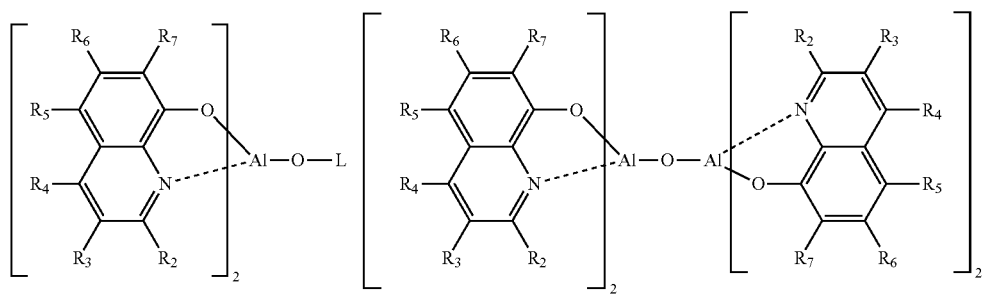
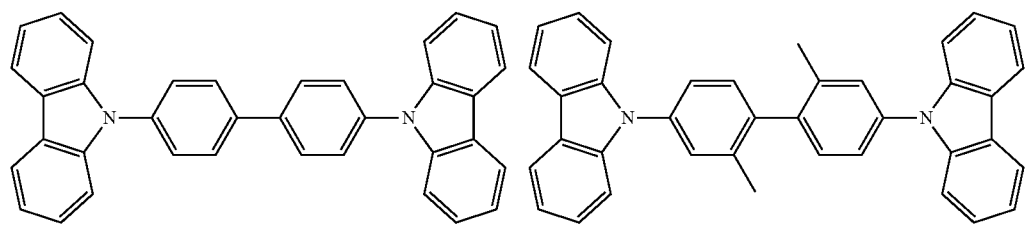

-continued
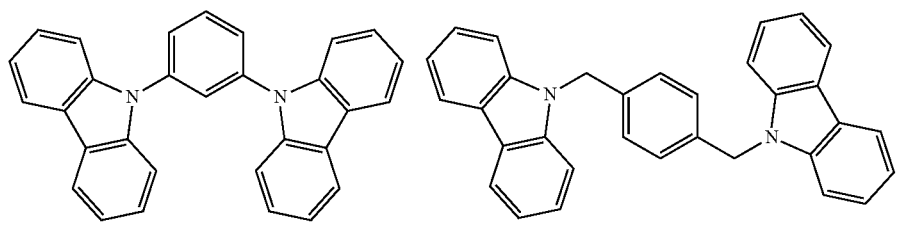
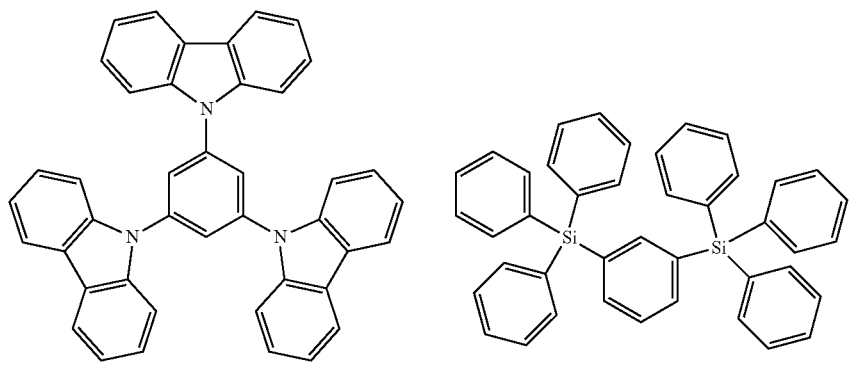
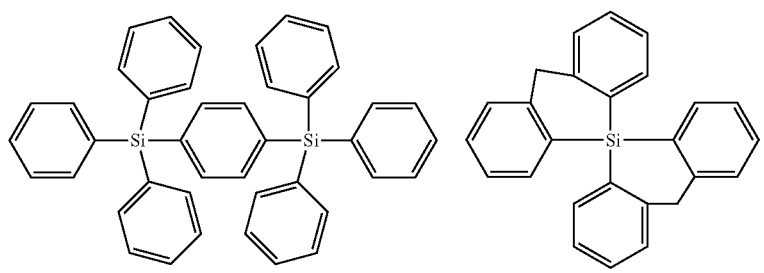
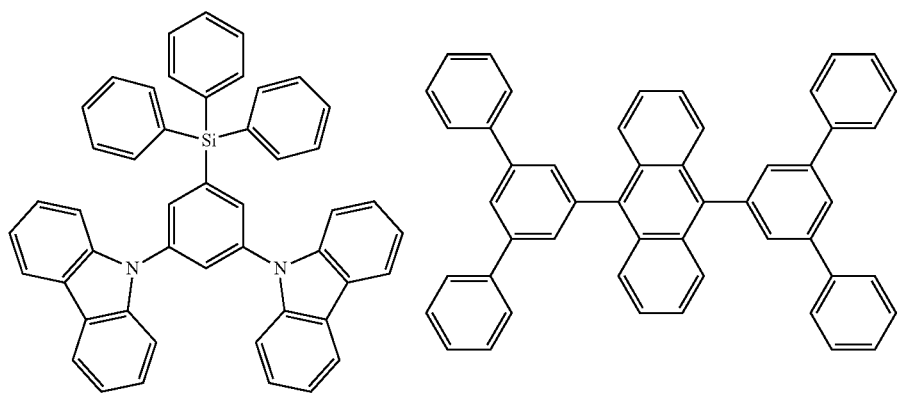
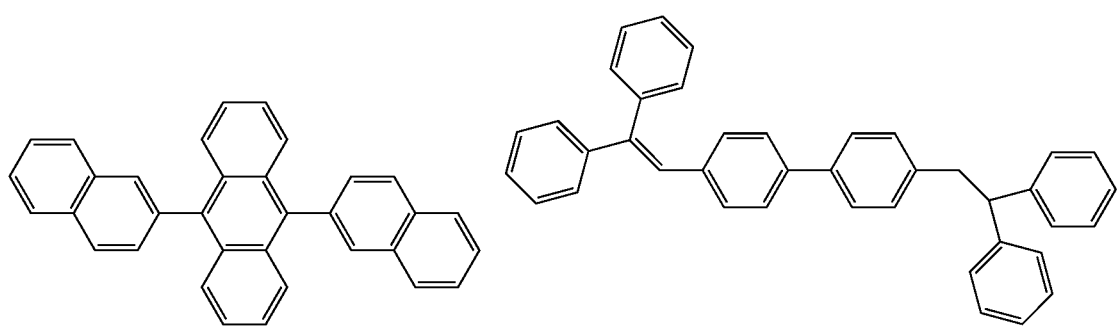

-continued
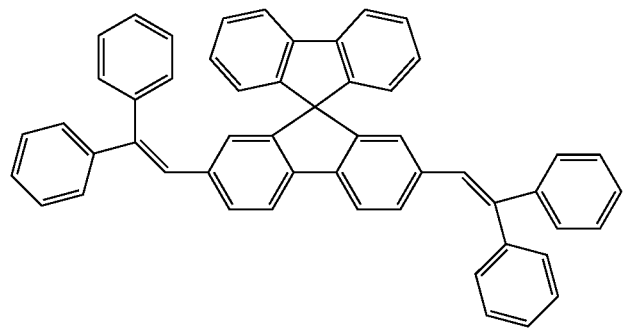
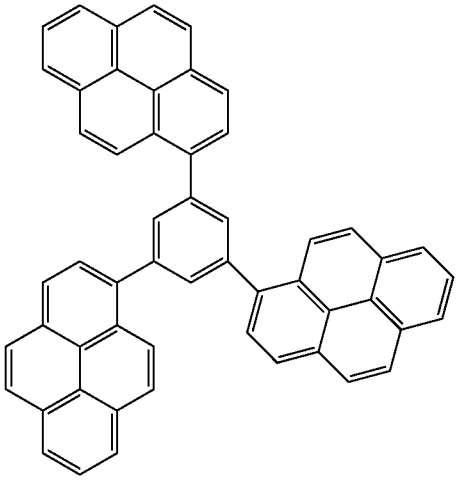
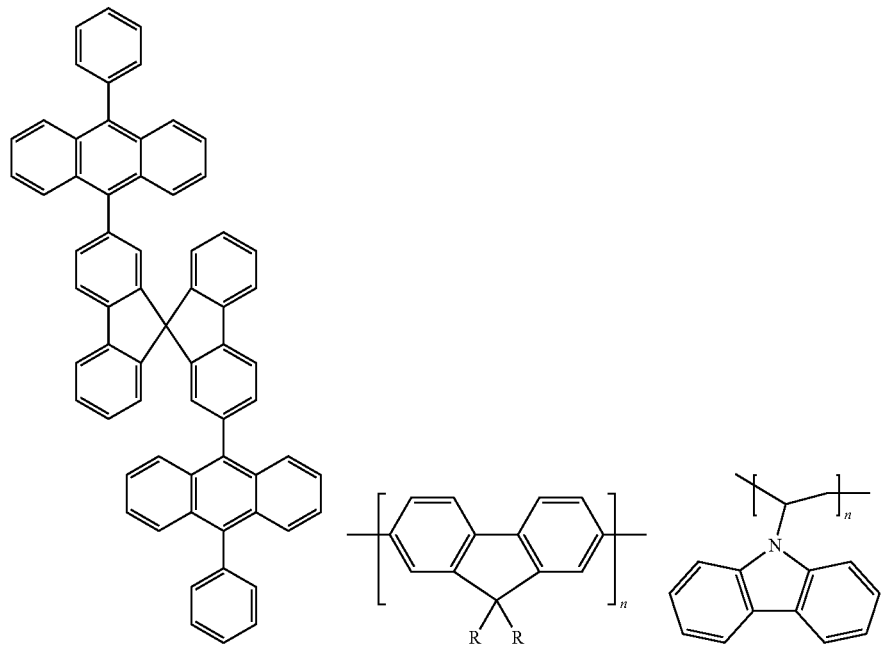
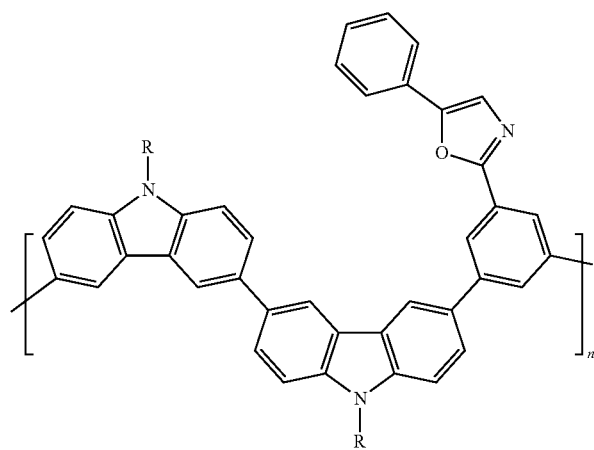

In the compounds provided above, R may refer to a general substituent, and n may be an integer of 1 to about 1,000, or 1 to about 100.

The electron transport region ETR is provided on the emitting layer EML. The electron transport region ETR may include, but is not limited to, at least one of a hole blocking layer HBL, an electron transport layer ETL and an electron injection layer EIL.

The electron transport region ETR may have a single layer composed of a single material, a single layer composed of a plurality of different materials, or multiple layers composed of a plurality of different materials.

For example, the electron transport region ETR may have a single-layered structure of the electron injection layer EIL or the electron transport layer ETL, or may have a single-layered structure composed of an electron injection material and an electron transport region material. In one or more embodiments, the electron transport region ETR may have, but is not limited to, a single-layered structure composed of a plurality of different materials, or a structure of the electron transport layer ETL/the electron injection layer EIL, the hole blocking layer HBL/the electron transport layer ETL/the electron injection layer EIL, wherein the layers are sequentially stacked from the light emitting layer EML. The thickness of the electron transport region ETR may be, for example, about 1000 Å to about 1500 Å.

The electron transport region ETR may be formed by using various methods such as vacuum deposition, spin coating, casting, Langmuir-Blodgett (LB), inkjet printing, laser printing, and/or laser induced thermal imaging (LITI).

When the electron transport region ETR includes an electron transport layer ETL, the electron transport region ETR may include, but is not limited to, Alq$_3$(Tris(8-hydroxyquinolinato)aluminum), 1,3,5-tri[(3-pyridyl)-phen-3-yl]benzene, 2,4,6-tris(3'-(pyridin-3-yl)biphenyl-3-yl)-1,3,5-triazine, DPEPO(bis[2-(diphenylphosphino)phenyl]ether oxide), 2-(4-(N-phenylbenzoimidazolyl-1-ylphenyl)-9,10-dinaphthylanthracene, TPBi(1,3,5-Tri(1-phenyl-1H-benzo[d]imidazol-2-yl)phenyl), BCP(2,9-Dimethyl-4,7-diphenyl-1,10-phenanthroline), Bphen(4,7-Diphenyl-1,10-phenanthroline), TAZ(3-(4-Biphenylyl)-4-phenyl-5-tert-butylphenyl-1,2,4-triazole), NTAZ(4-(Naphthalen-1-yl)-3,5-diphenyl-4H-1,2,4-triazole), tBu-PBD(2-(4-Biphenylyl)-5-(4-tert-butylphenyl)-1,3,4-oxadiazole), BAlq(Bis(2-methyl-8-quinolinolato-N1,O8)-(1,1'-Biphenyl-4-olato) aluminum), Bebq$_2$(berylliumbis(benzoquinolin-10-olate), ADN(9,10-di(naphthalene-2-yl)anthracene) and mixtures thereof. The thickness of the electron transport layer ETL may be about 100 Å to about 1000 Å, for example, about 150 Å to about 500 Å. When the thickness of the electron transport layer ETL satisfies the above-mentioned range, a satisfactory (or suitable) electron transport region characteristic may be obtained without a substantial increase in driving voltage.

When the electron transport region ETR includes an electron injection layer EIL, the electron transport region ETR may include, but is not limited to, LiF, lithium quinolate (LiQ), Li$_2$O, BaO, NaCl, CsF, Yb, and/or a metal halide such as RbCl and/or RbI, and/or the like. The electron injection layer EIL may also be composed of a mixture of an electron transport material and an insulating organo metal salt. The organo metal salt may be a material having an energy band gap of about 4 eV or more.

In some embodiments, the organo metal salt may include, for example, metal acetate, metal benzoate, metal acetoacetate, metal acetylacetonate, and/or metal stearate. The thickness of the electron injection layer EIL may be about 1 Å to about 100 Å, or about 3 Å to about 90 Å. When the thickness of the electron injection layers EIL satisfies the above-described range, a satisfactory (or suitable) electron injection characteristic may be obtained without a substantial increase in driving voltage.

The electron transport region ETR may include, but is not limited to, a hole blocking layer HBL mentioned above. The hole blocking layer HBL may include, for example, BCP (2,9-dimethyl-4,7-diphenyl-1,10-phenanthroline), Bphen(4,7-diphenyl-1,10-phenanthroline), DPEPO(bis[2-(diphenylphosphino)phenyl]ether oxide), and/or the like. However, the hole blocking layer HBL is not limited thereto.

The second electrode EL2 is provided on the electron transport region ETR. The second electrode EL2 may be a common electrode and/or a negative electrode. The second electrode EL2 may be a transmissive electrode, a semi-transmissive electrode, or a reflective electrode. When the second electrode EL2 is a transmissive electrode, the second electrode EL2 may be composed of a metal oxide such as indium tin oxide (ITO), indium zinc oxide (IZO), zinc oxide (ZnO), and/or indium tin zinc oxide (ITZO).

When the second electrode EL2 is a semi-transmissive electrode, or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, or a compound or mixture thereof (e.g., a mixture of Ag and Mg). In some embodiments, the second electrode EL2 may be a multilayered structure including a reflective film or a semi-transmissive film formed of any of the above materials, and a transparent conductive film formed of indium tin oxide (ITO), indium zinc oxide (IZO), zinc oxide (ZnO), indium tin zinc oxide (ITZO), and/or the like.

The second electrode EL2 may be connected with an auxiliary electrode. When the second electrode EL2 is connected with the auxiliary electrode, the resistance of the second electrode EL2 may be reduced.

In the organic electroluminescence device 10, when voltage is applied to the first electrode EL1 and the second electrode EL2, the holes injected from the first electrode EL1 move to the light emitting layer EML through the hole transport region HTR, and the electrons injected from the second electrode EL2 move to the light emitting layer EML thorough the electron transport region ETR. The holes and the electrons are recombined in the light emitting layer EML to generate excitons. The excitons emit light by transitioning from the excited state to the ground state.

When organic electroluminescence device 10 is a front light emitting device, the first electrode EL1 may be a reflective electrode, and the second electrode EL2 may be a transmissive electrode or a semi-transmissive electrode. When organic electroluminescence device 10 is a rear light emitting device, the first electrode EL1 may be a transmissive electrode or a semi-transmissive electrode, and the second electrode EL2 may be a reflective electrode.

The organic electroluminescence device 10 according to an embodiment of the present disclosure may include the nitrogen-containing compound represented by Formula 1. Accordingly, the organic electroluminescence device may simultaneously (or concurrently) have high efficiency and blue light emission (e.g., deep blue light emission).

Hereinafter, the present disclosure will be described in more detail with reference to specific examples and comparative examples. The following examples are merely provided to aid understanding of the present disclosure, and the scope of the present disclosure is not limited thereto.

Synthesis Example

The nitrogen-containing compound according to an embodiment of the present disclosure may be synthesized, for example, as follows. However, the method for synthesizing the nitrogen-containing compound according to an embodiment of the present disclosure is not limited thereto.

1. Synthesis of Compound 7

Compound 7, which is a nitrogen-containing compound according to an embodiment of the present disclosure, may be synthesized, for example, by the following reaction.

Synthesis of Intermediate 1

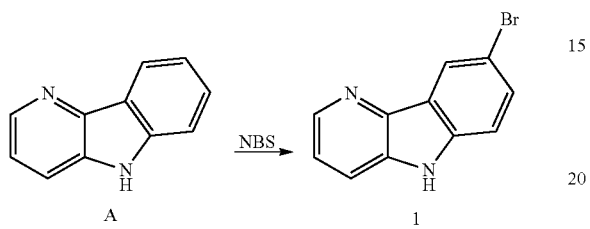

In a 300 mL three-necked flask under argon (Ar) atmosphere, 3.4 g of Compound A, 2.5 g of N-Bromosuccinimide, 55 mL of dichloromethane, and 83 mL of acetic acid were combined and stirred for 8 hours at room temperature. After completion of the reaction, water was added thereto, and the organic layer was separated therefrom and the solvent was distilled off. The obtained crude product was purified by silica gel chromatography (using a mixed solvent of ethyl acetate/n-hexane) to obtain 4.2 g (yield 93%) of Intermediate 1 as a white solid. The molecular weight of Intermediate 1 measured by Fast Atom Bombardment-Mass Spectrometry (FAB-MS) measurement was 246.

Synthesis of Intermediate 2

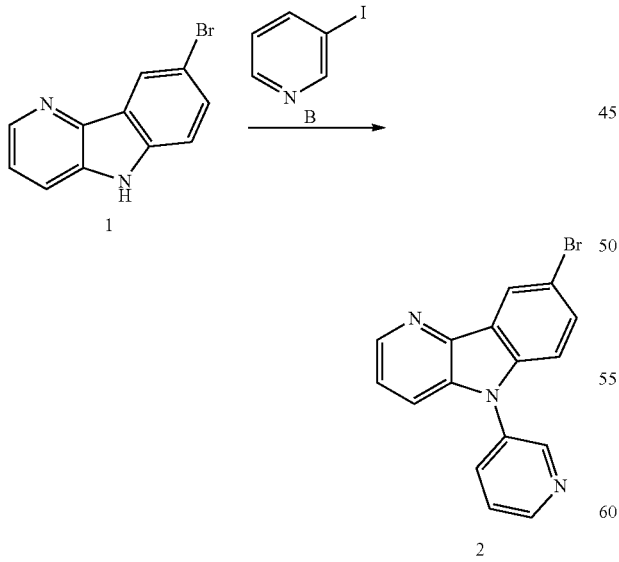

In a 300 mL three-necked flask under argon (Ar) atmosphere, 4.2 g of Intermediate 1, 5.2 g of 3-Iodepyridine (Compound B), 0.32 g of CuI, 0.47 g of 6-methylpicolinic acid, 5.4 g of $K_3PO_4$, 170 mL of DMSO were combined and stirred for 7 hours at 125° C. After completion of the reaction, water and $CH_2Cl_2$ were added thereto, and the organic layer was separated therefrom and the solvent was distilled off. The obtained crude product was purified by silica gel chromatography (using a mixed solvent of ethyl acetate/n-hexane) to obtain 3.1 g (yield 56%) of Intermediate 2 as a white solid. The molecular weight of Intermediate 2 measured by FAB-MS measurement was 323.

Synthesis of Compound 7

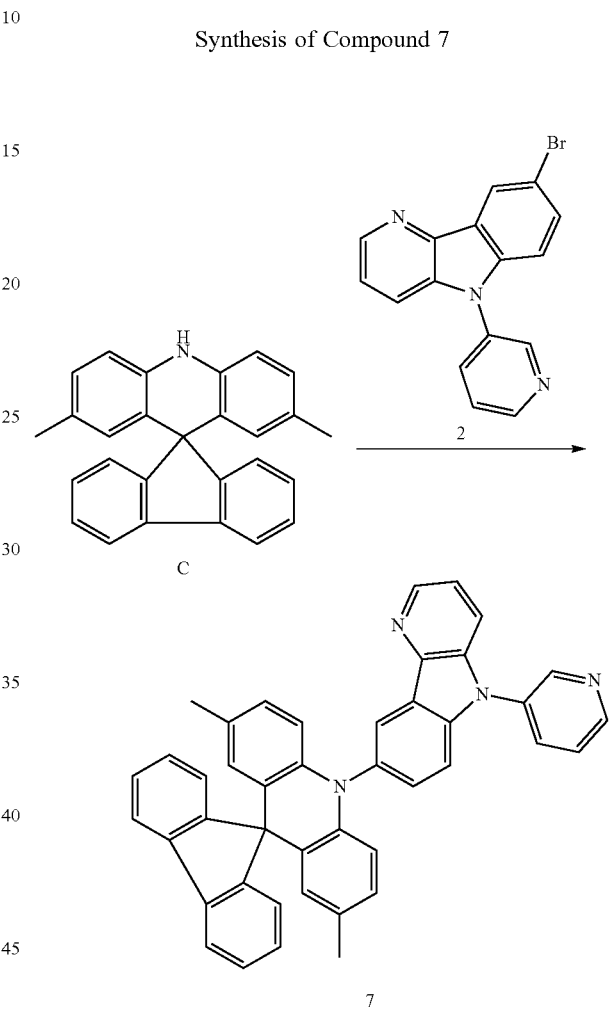

In a 100 mL three-necked flask under argon (Ar) atmosphere, 2.3 g of Compound C, 2.0 g of Intermediate 2, 1.2 g of sodium tert-butoxide, 0.40 g of tris(dibenzylideneacetone)dipalladium(0), 0.18 g of tri-tert-butylphosphine, and 31 mL of toluene were combined, and heated and stirred for 7 hours. After completion of the reaction, water was added thereto, and the organic layer was separated therefrom and the solvent was distilled off. The obtained crude product was purified by silica gel chromatography (using a mixed solvent of toluene and hexane) to obtain 2.93 g (yield 77%) of Compound 7 as a white solid. The molecular weight of Compound 7 measures by FAB-MS measurement was 602.

2. Synthesis of Compound 8

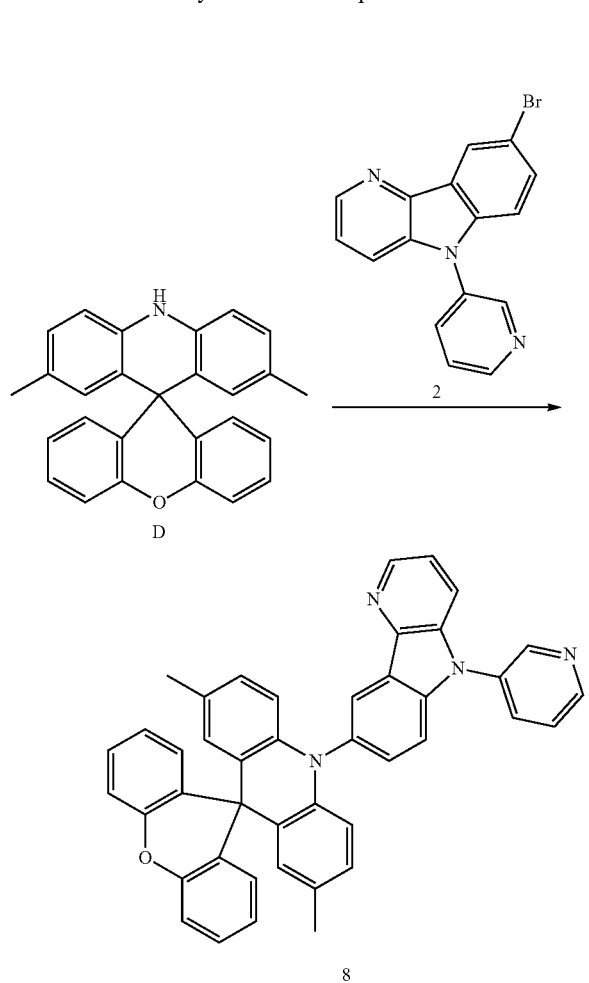

Compound 8 was synthesized in the same (or substantially the same) manner as in the synthesis method of Compound 7 described above, except for using Compound D instead of Compound C (yield 81%). The molecular weight of Compound 8 measured by FAB-MS measurement was 618.

3. Synthesis of Compound 72

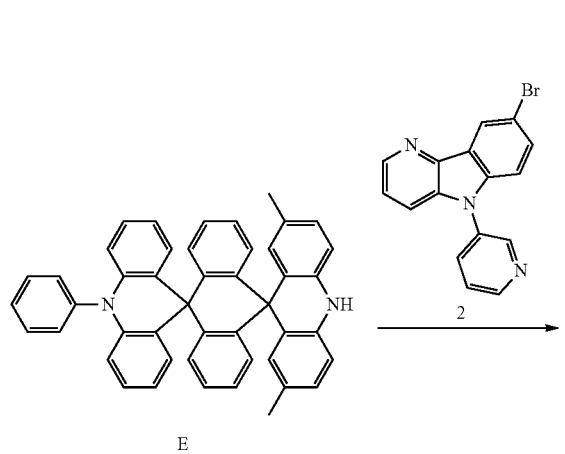

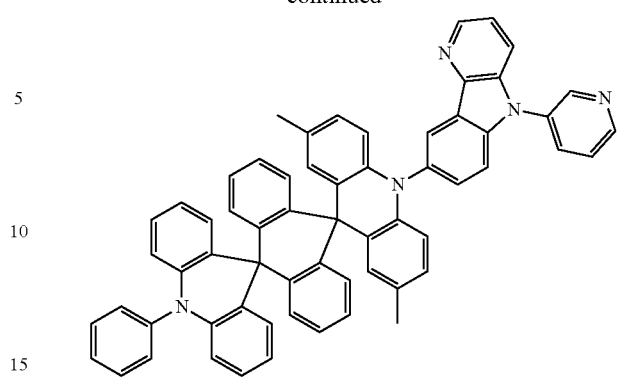

Compound 72 was synthesized in the same (or substantially the same) manner as in the synthesis method of Compound 7 described above, except for using Compound E instead of Compound C (yield 58%). The molecular weight of Compound 72 measured by FAB-MS measurement was 857.

4. Synthesis of Compound 88

Synthesis of Intermediate 3

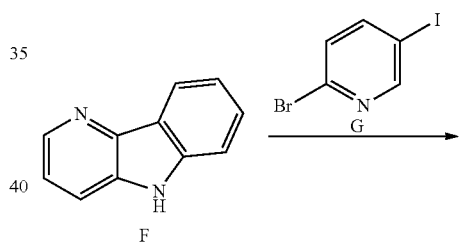

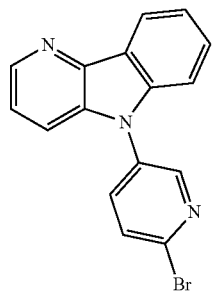

Intermediate 3 was synthesized in the same manner as in the synthesis method of Intermediate 2 described above, except for using Compound F instead of Intermediate 1 and Compound G instead of Compound B (yield 62%). The molecular weight of Intermediate 3 measured by FAB-MS measurement was 323.

Synthesis of Compound 88

Example Compounds

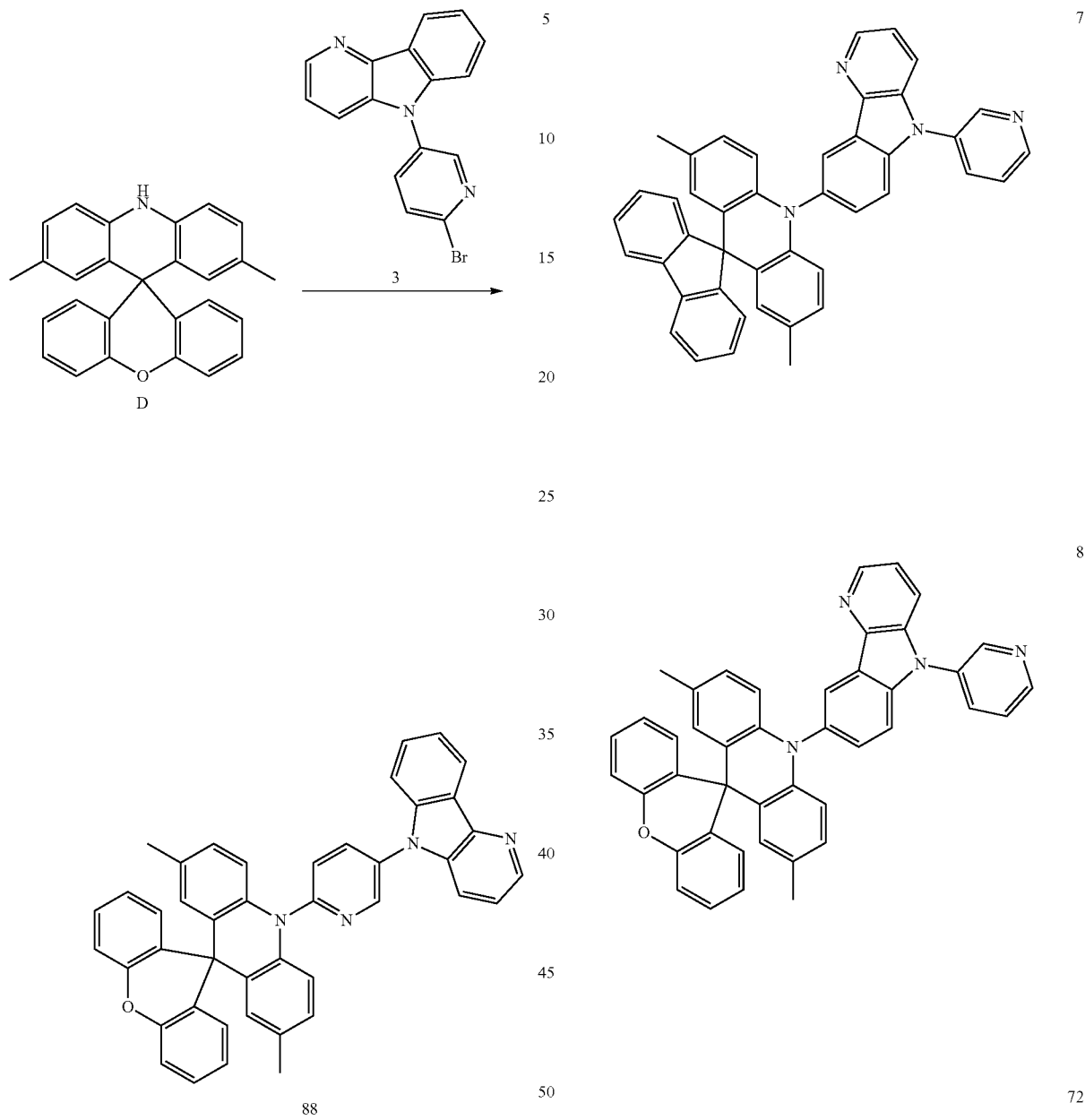

Compound 88 was synthesized in the same (or substantially the same) manner as in the synthesis method of Compound 7 described above, except for using Compound D instead of Compound C and Intermediate 3 instead of Intermediate 2 (yield 69%). The molecular weight of Compound 88 measured by FAB-MS measurement was 618.

Device Manufacturing Example

Compounds 7, 8, 72, and 88 described above were used as dopant materials for the light emitting layer to manufacture the organic electroluminescence devices of Examples 1 to 4.

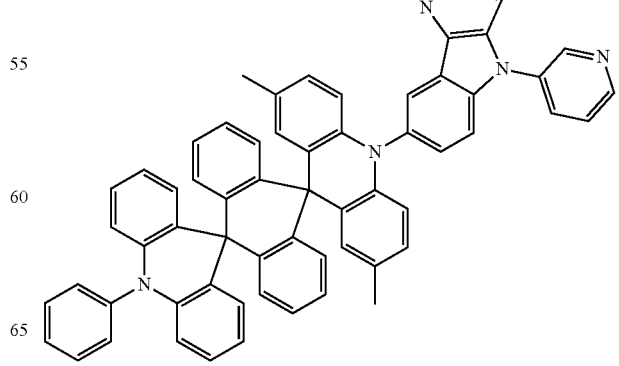

-continued

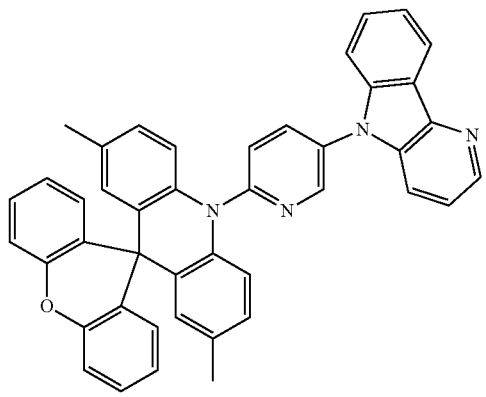

88

Comparative Example Compounds X-1 to X-4 (shown below) were used as dopant materials for the light emitting layer to manufacture the organic electroluminescence devices of Comparative Examples 1 to 4.

Comparative Example Compounds

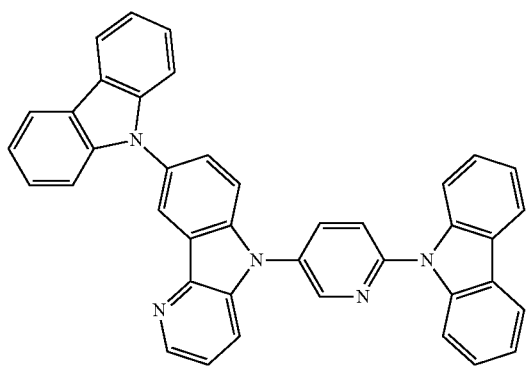

X-1

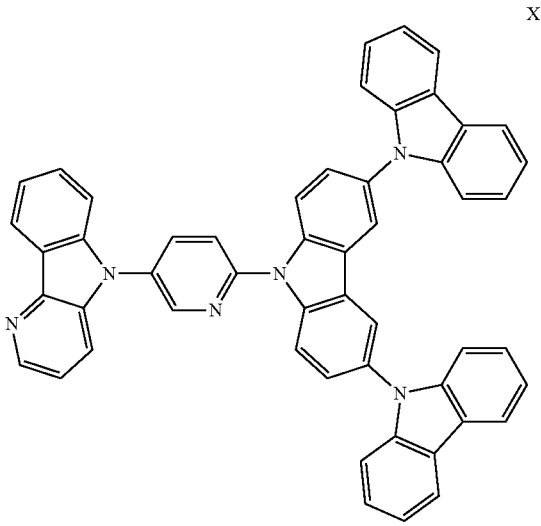

X-2

-continued

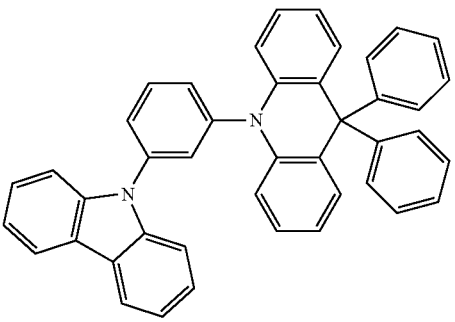

X-3

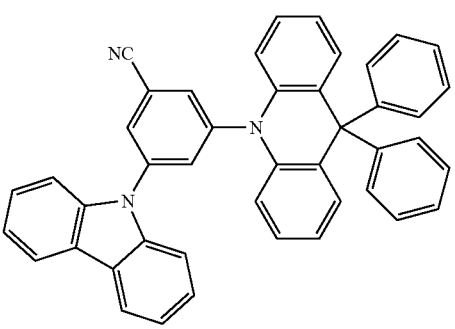

X-4

In the organic electroluminescence devices of Examples 1 to 4 and Comparative Examples 1 to 4, a 150 nm thick first electrode was formed with ITO, a 10 nm thick hole injection layer was formed with HAT-CN, an 80 nm thick hole transport layer was formed with α-NPD, a 5 nm thick electron blocking layer was formed with mCP, a 20 nm-thick light-emitting layer doped with 18% of the corresponding compound of Examples or Comparative Examples was formed in DPEPO, a 30 nm thick electron transport layer was formed with TPBi, a 0.5 nm thick electron injection layer was formed with LiF, and a 100 nm thick second electrode was formed with Al. Each layer was formed by vacuum deposition.

TABLE 1

| | S1 Energy Level | T1 Energy Level | $E_{ST}$ |
|---|---|---|---|
| Example Compound 7 | 2.77 | 2.74 | 0.03 |
| Example Compound 8 | 2.80 | 2.77 | 0.03 |
| Example Compound 72 | 2.81 | 2.77 | 0.04 |
| Example Compound 88 | 2.84 | 2.80 | 0.04 |
| Comparative Example Compound X-1 | 3.28 | 3.01 | 0.27 |
| Comparative Example Compound X-2 | 3.28 | 3.03 | 0.25 |
| Comparative Example Compound X-3 | 3.64 | 3.18 | 0.46 |
| Comparative Example Compound X-4 | 2.91 | 2.88 | 0.03 |

In Table 1, $E_{ST}$ indicates the difference value of a singlet energy level (S1) and a triplet energy level (T1).

Referring to Table 1, it can be seen that all Example Compounds show small $E_{ST}$ values, and thus may be usefully utilized as a thermally activated delayed fluorescence material. On the other hand, it can be seen that Comparative Example Compounds X-1 to X-3 show large $E_{ST}$ values larger than $E_{ST}$=0.2. Compounds that exhibit thermally activated delayed fluorescence will generally have $E_{ST}$ values below 0.2. As such, the Comparative Example Compounds X-1 to X-3 were not suitable as a thermally activated delayed fluorescence material.

Next, a maximum light emitting wavelength and external quantum efficiency of the manufactured organic electroluminescence devices of Examples and Comparative Examples were measured and the results are shown in Table 2 below.

TABLE 2

|  | Light emitting layer dopant | $\lambda_{max}$ (nm) | $\eta_{ext}$ (%) |
|---|---|---|---|
| Example 1 | Example Compound 7 | 450 | 18 |
| Example 2 | Example Compound 8 | 457 | 17 |
| Example 3 | Example Compound 72 | 447 | 21 |
| Example 4 | Example Compound 88 | 459 | 19 |
| Comparative Example 1 | Comparative Example Compound X-1 | 484 | 4 |
| Comparative Example 2 | Comparative Example Compound X-2 | 488 | 6 |
| Comparative Example 3 | Comparative Example Compound X-3 | 492 | 2 |
| Comparative Example 4 | Comparative Example Compound X-4 | 476 | 8 |

The maximum light emitting wavelength ($\lambda_{max}$) refers to a maximum light emission wavelength of a luminescence spectrum at room temperature (about 300K), measured by using a sample of a subject compound deposited on a quartz glass substrate. The external quantum efficiency ($\eta_{ext}$) of the organic electroluminescence device was measured by using an external quantum efficiency measuring device C9920-12 manufactured by Hamamatsu Photonics.

Referring to Table 2, it may be seen that Examples 1 to 4 had higher external quantum efficiency than Comparative Examples 1 to 4. Furthermore, referring back to Table 1, in Comparative Examples 1 to 3, the $E_{ST}$ value was larger than 0.2, whereas in all of Examples 1 to 4, the $E_{ST}$ value was smaller than 0.2, and thus the thermally activated delayed fluorescence was exhibited to be highly efficient. Although the $E_{ST}$ value in Comparative Example 4 was small, Comparative Example 4 showed decreased efficiency.

Further, it may also be seen that, in Examples 1 to 4, deep blue light emission was observed (Examples 1 to 4 had $\lambda_{max}$ in the range of 440 to 470 nm), whereas in Comparative Examples 1 to 4, deep blue light emission was not observed (Comparative Examples 1 to 4 had $\lambda_{max}$ higher than 470 nm).

The nitrogen-containing compound according to an embodiment of the present disclosure may be used as a dopant material for a light emitting layer of an organic electroluminescence device to realize deep blue light emission and high efficiency.

The nitrogen-containing compound according to an embodiment of the present disclosure may be used in the light emitting layer to improve the light emitting efficiency of the organic electroluminescence device.

The organic electroluminescence device according to an embodiment of the present disclosure includes the nitrogen-containing compound according to an embodiment of the present disclosure, and thus may exhibit improved light emitting efficiency and may emit deep blue light simultaneously (or concurrently).

The nitrogen-containing compound according to an embodiment of the present disclosure may be used as a material for an organic material layer of an organic electroluminescence device, and the efficiency of the resulting organic electroluminescence device may be improved by using the nitrogen-containing compound.

The terms "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

While the present invention has been particularly shown and described with reference to example embodiments thereof, it is to be understood that the invention is not limited to the disclosed example embodiments, but various changes and modifications can be made by one ordinary skilled in the art within the spirit and scope of the present invention as defined by the following claims and equivalents thereof. It is therefore to be understood that the above-described embodiments are illustrative in all respects and not restrictive.

What is claimed is:

1. A nitrogen-containing compound represented by any one of Formulae 1-1, 1-2, 1-3-1, 1-4-1, 1-3-2, and 1-4-2 below:

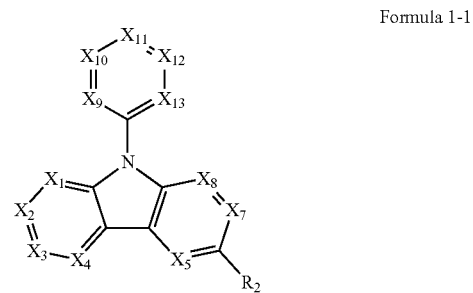

Formula 1-1

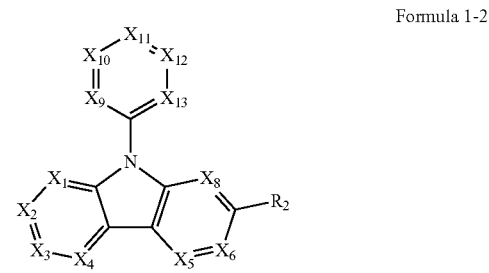

Formula 1-2

Formula 1-3-1

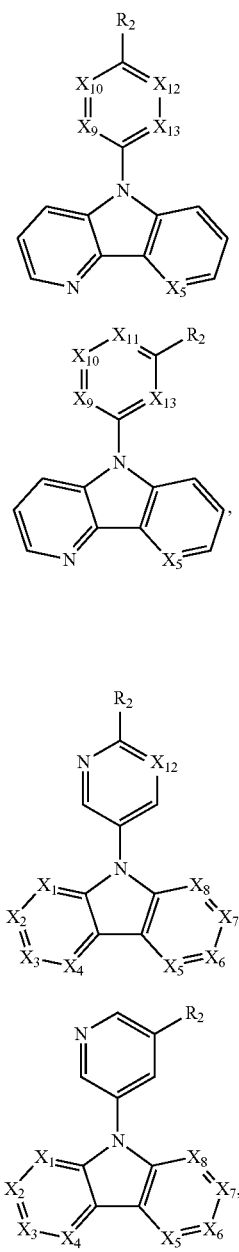

Formula 1-4-1

Formula 1-3-2

Formula 1-4-2 wherein in Formulae 1-1, 1-2, 1-3-1, 1-4-1, 1-3-2, and 1-4-2, $X_1$ to $X_{13}$ are each independently $CR_1$ or N, in Formulae 1-1 and 1-2, at least one of $X_1$ to $X_8$ and at least one of $X_9$ to $X_{13}$ are N, in Formulae 1-3-1 and 1-4-1, at least one of $X_9$ to $X_{13}$ is N, in Formulae 1-3-2 and 1-4-2, at least one of $X_1$ to $X_8$ is N, $R_1$ is selected from hydrogen, deuterium, a substituted or unsubstituted alkyl group having 1 to 10 carbon atoms, a substituted or unsubstituted aryl group having 6 to 30 ring-forming carbon atoms, and a substituted or unsubstituted heteroaryl group having 2 to 30 ring-forming carbon atoms, in Formulae 1-1, 1-2, 1-3-1, 1-4-1, and 1-3-2, when any one of $X_9$ to $X_{13}$ is $CR_1$, $R_1$ is not a phenyl group, $R_2$ is represented by any one of Formulae 2-7 and 2-8 below:

Formula 2-7

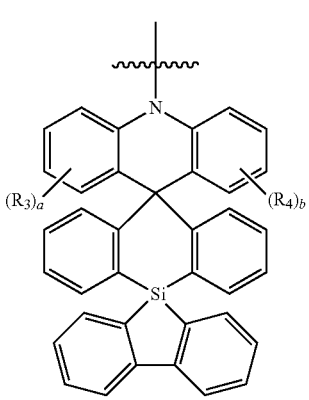

Formula 2-8

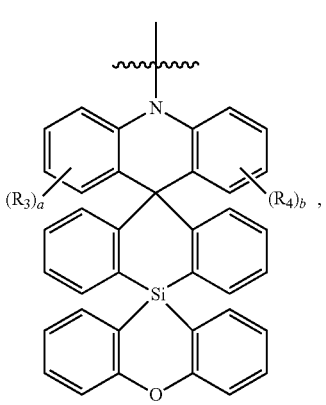

wherein in Formulae 2-7 and 2-8, $R_3$ and $R_4$ are each independently selected from hydrogen, deuterium, a halogen atom, a substituted or unsubstituted alkyl group having 1 to 10 carbon atoms, a substituted or unsubstituted aryl group having 6 to 30 ring-forming carbon atoms, and a substituted or unsubstituted heteroaryl group having 2 to 30 ring-forming carbon atoms, provided that $R_3$ and $R_4$ are not substituted with a cyano group, and a and b are each independently an integer of 1 to 4.

2. The nitrogen-containing compound of claim 1, wherein an absolute value of a difference between a singlet energy level and a triplet energy level of the nitrogen-containing compound is 0.2 eV or less.

3. The nitrogen-containing compound of claim 1, wherein the nitrogen-containing compound is represented by Formulae 1-1-1 or 1-2-1 below:

Formula 1-1-1

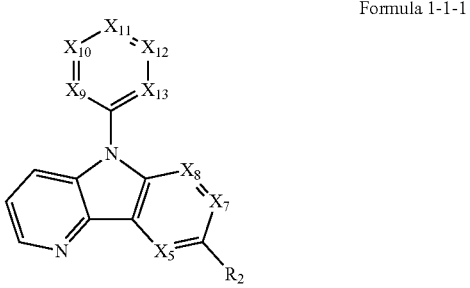

-continued

Formula 1-2-1

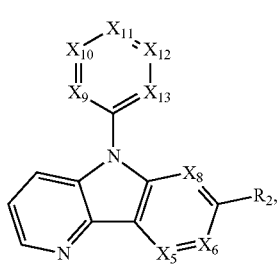

wherein in Formulae 1-1-1 and 1-2-1,
$X_5$ to $X_{13}$ are each independently $CR_1$ or N and at least one of $X_9$ to $X_{13}$ is N, and
$R_1$ and $R_2$ are the same as defined in Formulae 1-1 and 1-2.

4. The nitrogen-containing compound of claim 1, wherein the nitrogen-containing compound is represented by Formulae 1-1-2, 1-1-3, 1-2-2, or 1-2-3 below:

Formula 1-1-2

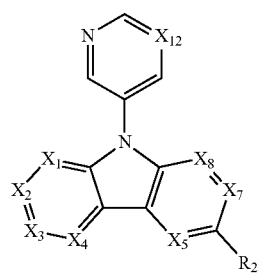

Formula 1-1-3

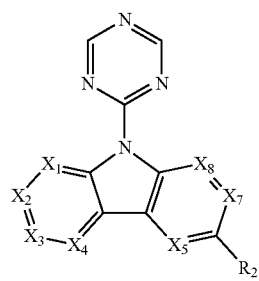

Formula 1-2-2

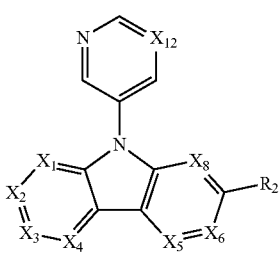

Formula 1-2-3

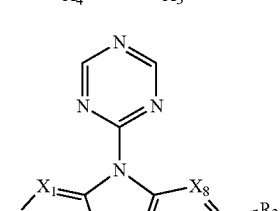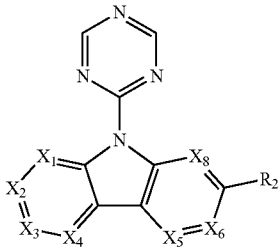

wherein in Formulae 1-1-2, 1-1-3, 1-2-2, and 1-2-3,
$X_{12}$ is OH or N, and
$X_1$ to $X_8$, and $R_2$ are the same as defined in Formulae 1-1 and 1-2.

5. A nitrogen-containing compound represented by any one selected from the compounds represented by Compound Group 1 below:

Compound Group 1

25

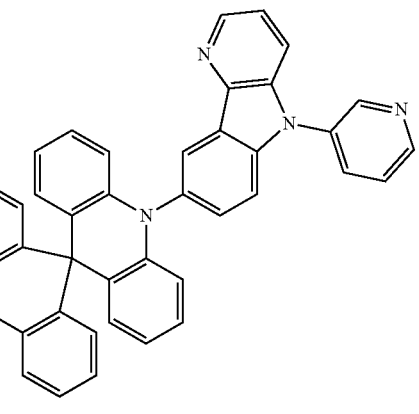

26

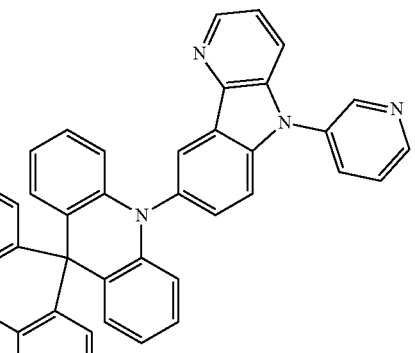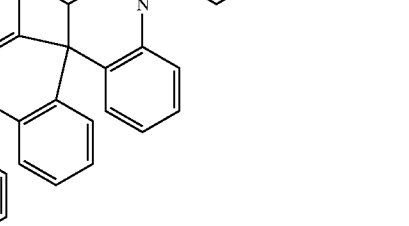

29

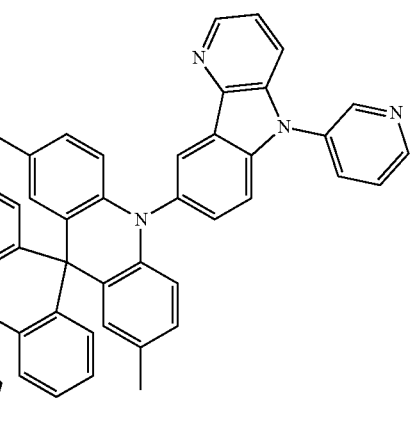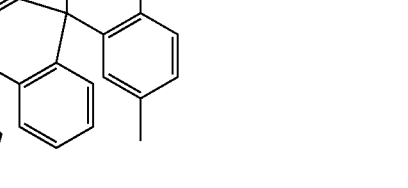

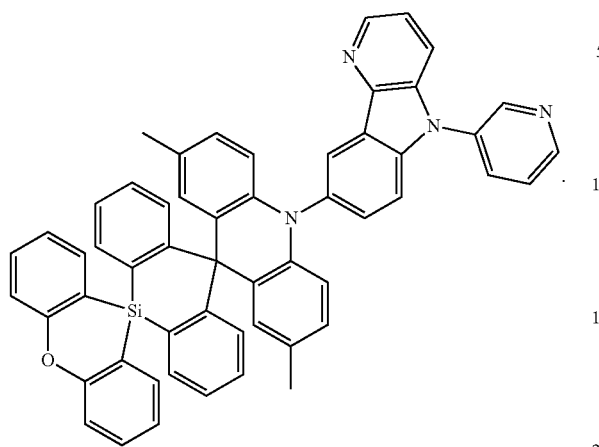

6. An organic electroluminescence device comprising:

a first electrode;

a hole transport region on the first electrode;

a light emitting layer on the hole transport region;

an electron transport region on the light emitting layer; and a second electrode on the electron transport region, wherein the first electrode and the second electrode each independently comprise at least one selected from Ag, Mg, Cu, Al, Pt, Pd, Au, Ni, Nd, Ir, Cr, Li, Ca, LiF/Ca, LiF/Al, Mo, Ti, In, Sn, and Zn, a compound of two or more thereof, a mixture of two or more thereof, and an oxide of one or more thereof, wherein the light emitting layer comprises a nitrogen-containing compound represented by any one of Formulae 1-1, 1-2, 1-3-1, 1-4-1, 1-3-2, and 1-4-2 below:

Formula 1-1

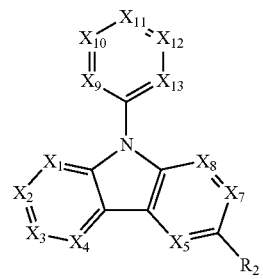

Formula 1-2

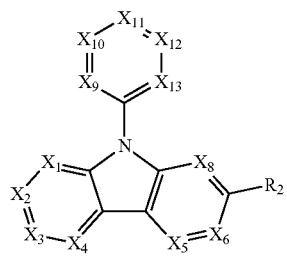

Formula 1-3-1

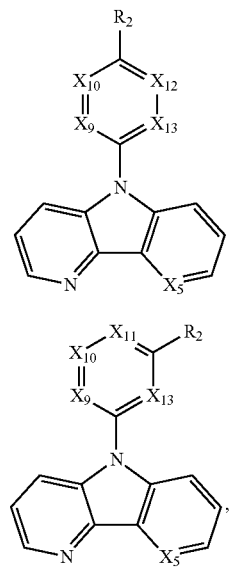

Formula 1-4-1

Formula 1-3-2

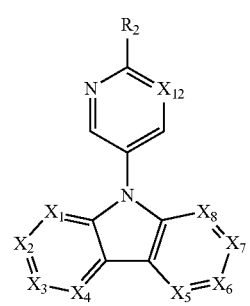

Formula 1-4-2

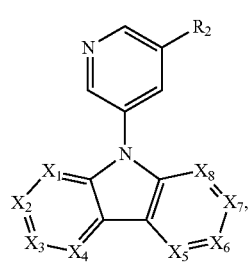

wherein in Formulae 1-1, 1-2, 1-3-1, 1-4-1, 1-3-2, and 1-4-2, $X_1$ to $X_{13}$ are each independently $CR_1$ or N, in Formulae 1-1 and 1-2, at least one of $X_1$ to $X_8$ and at least one of $X_9$ to $X_{13}$ are N, in Formulae 1-3-1 and 1-4-1, at least one of $X_9$ to $X_{13}$ is N, in Formulae 1-3-2 and 1-4-2, at least one of $X_1$ to $X_8$ is N, $R_1$ is selected from hydrogen, deuterium, a substituted or unsubstituted alkyl group having 1 to 10 carbon atoms, a substituted or unsubstituted aryl group having 6 to 30 ring-forming carbon atoms, and a substituted or unsubstituted heteroaryl group having 2 to 30 ring-forming carbon atoms, in Formulae 1-1, 1-2, 1-3-1, 1-4-1, and 1-3-2, when any one of $X_9$ to $X_{13}$ is $CR_1$, $R_1$ is not a phenyl group, R₂ is represented by any one of Formulae 2-7 and 2-8 below:

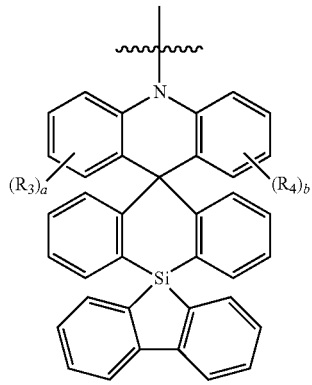

Formula 2-7

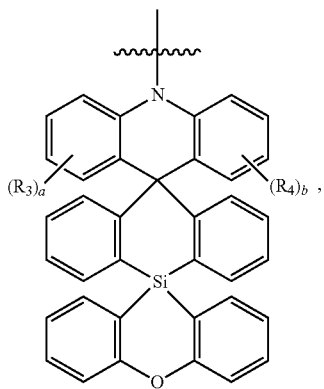

Formula 2-8 wherein in Formulae 2-7 and 2-8, $R_3$ and $R_4$ are each independently selected from hydrogen, deuterium, a halogen atom, a substituted or unsubstituted alkyl group having 1 to 10 carbon atoms, a substituted or unsubstituted aryl group having 6 to 30 ring-forming carbon atoms, and a substituted or unsubstituted heteroaryl group having 2 to 30 ring-forming carbon atoms, provided that $R_3$ and $R_4$ are not substituted with a cyano group, and a and b are each independently an integer of 1 to 4.

7. The organic electroluminescence device of claim 6, wherein the light emitting layer comprises a host and a dopant,
wherein the dopant includes the nitrogen-containing compound represented by any one of Formulae 1-1, 1-2, 1-3-1, 1-4-1, 1-3-2, and 1-4-2.

8. The organic electroluminescence device of claim 7, wherein the dopant is a thermally activated delayed fluorescence dopant.

9. The organic electroluminescence device of claim 6, wherein in Formulae 1-3-1, 1-4-1, and 1-3-2, $X_9$ to $X_{13}$ are each independently CH or N.

10. The organic electroluminescence device of claim 6, wherein the nitrogen-containing compound represented by any one of Formulae 1-1 and 1-2 is any one selected from the compounds represented by Compound Group 1 below:

Compound Group 1

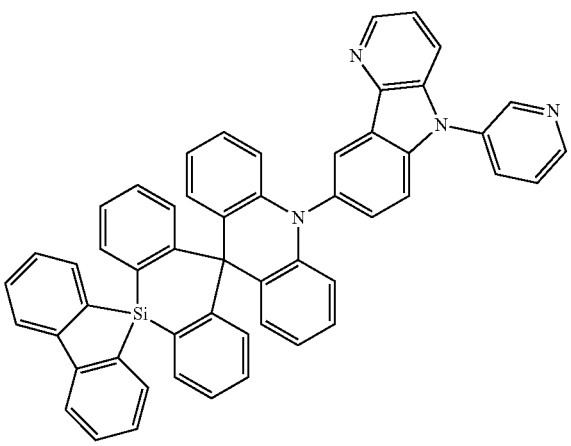

25

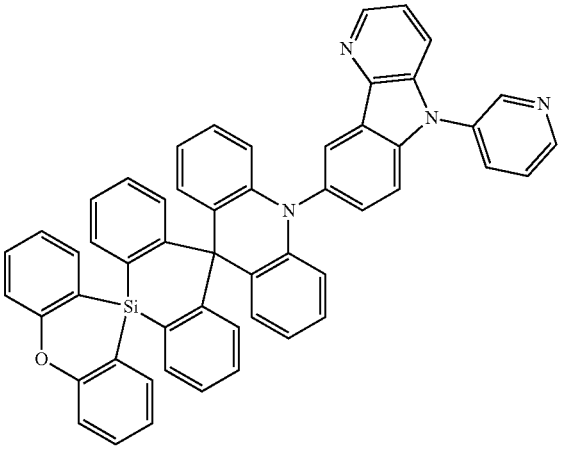

26

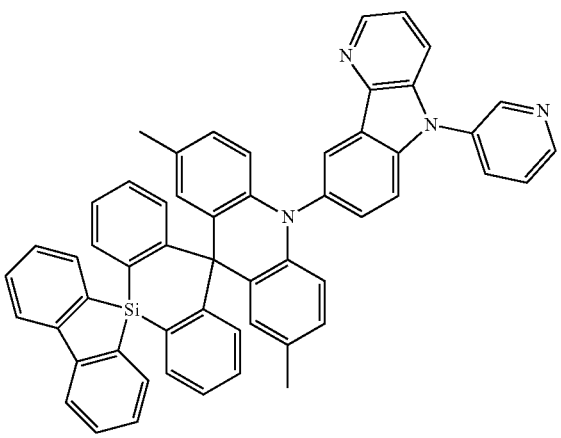

29

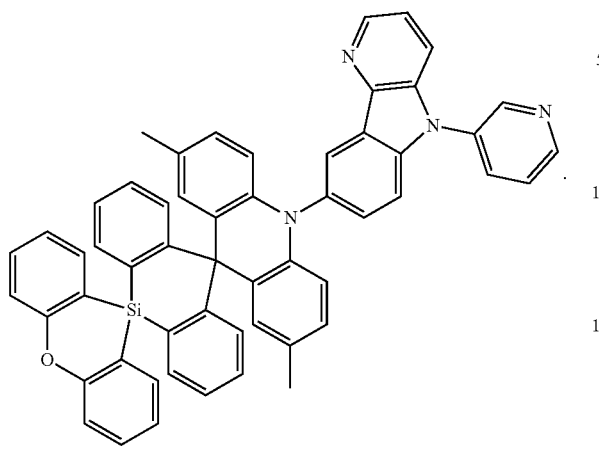
30
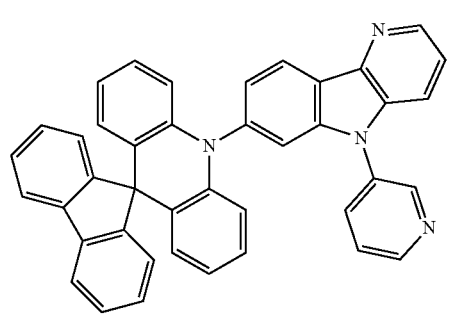
33
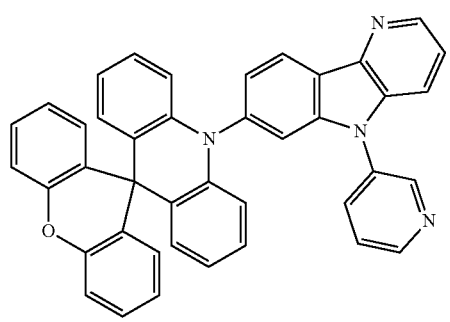
34
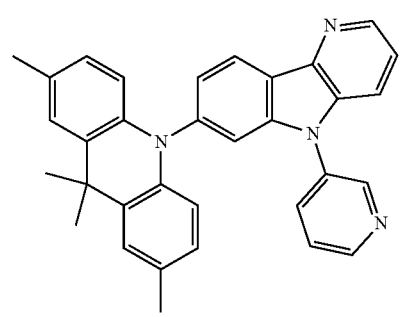
35
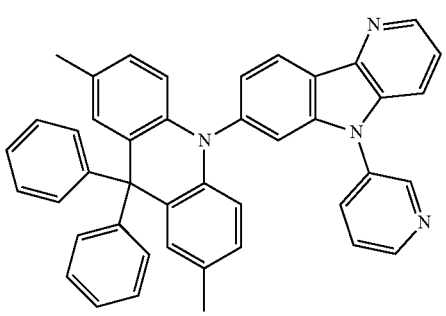
36
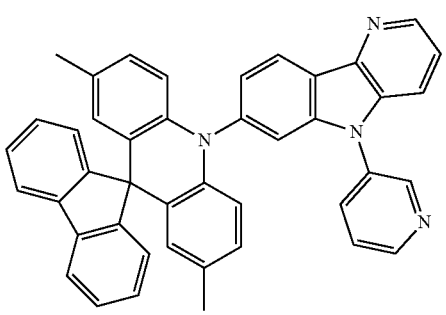
37
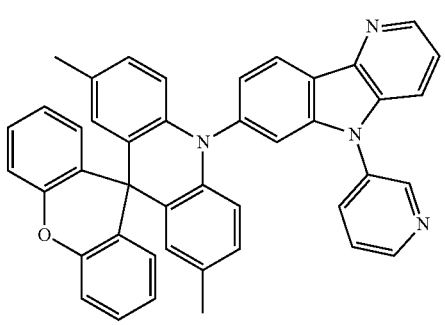
38
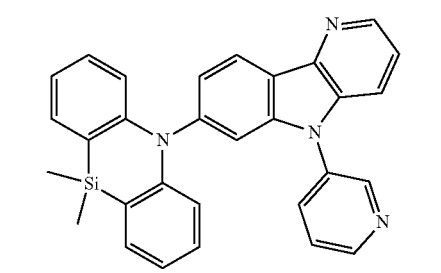
39
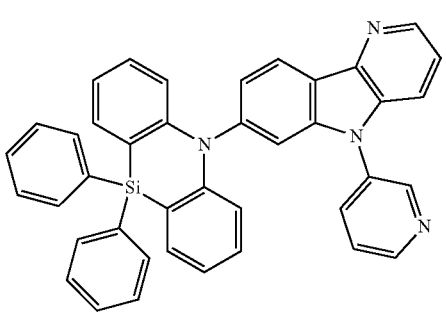
40

-continued
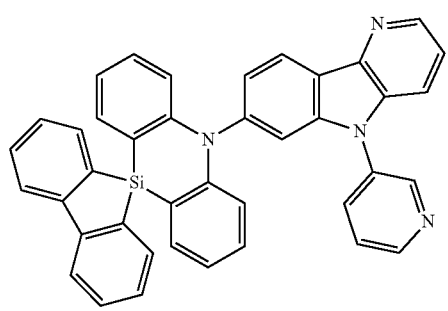
41
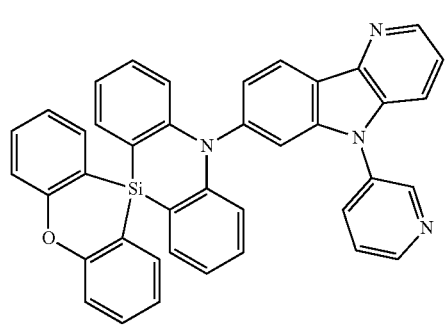
42
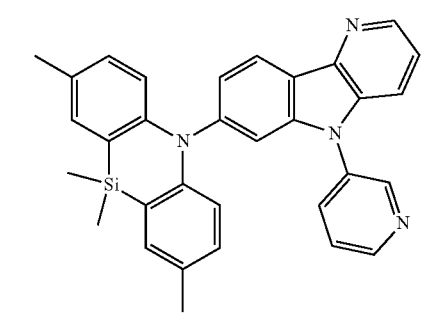
43
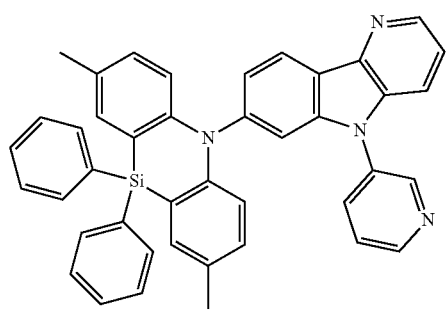
44
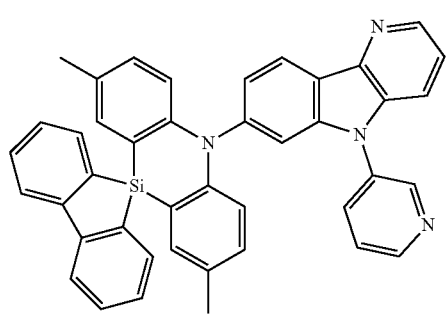
45
-continued
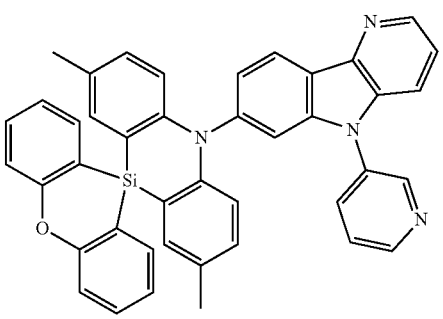
46
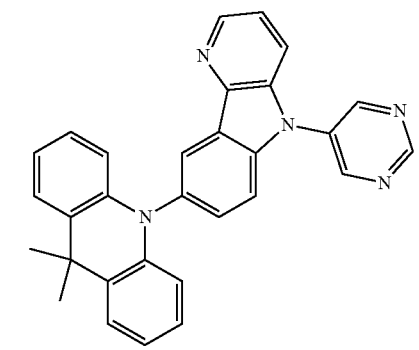
47
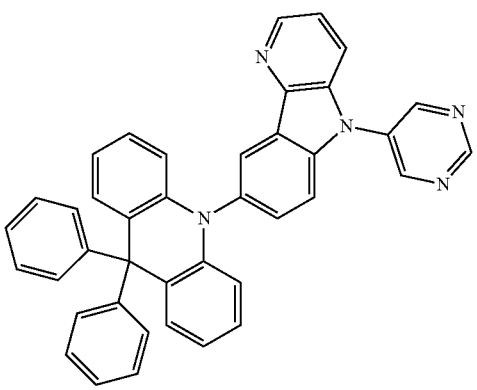
48
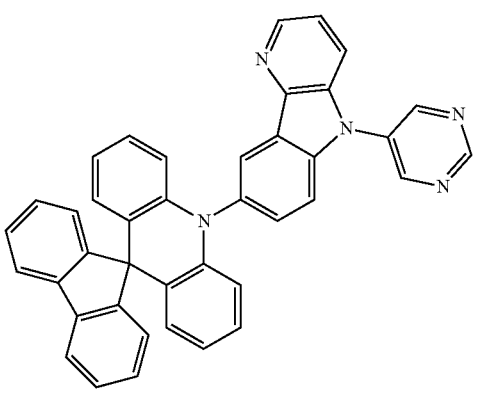
49

-continued
50
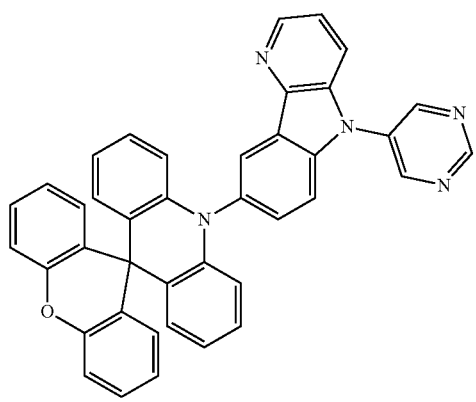
51
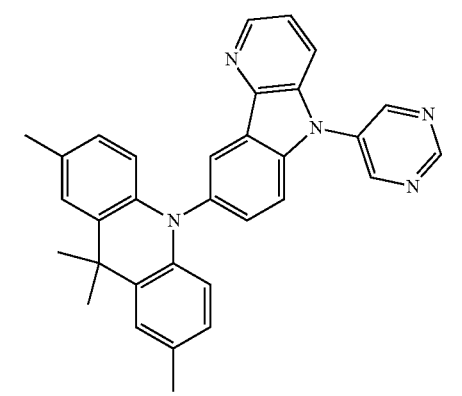
52
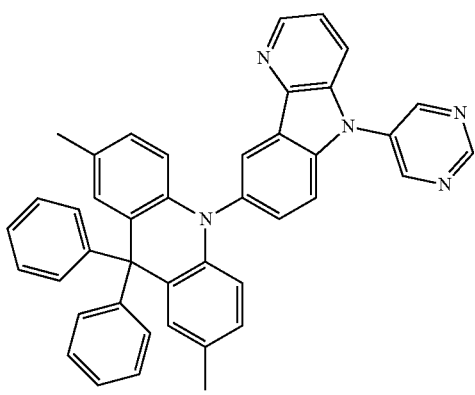
53
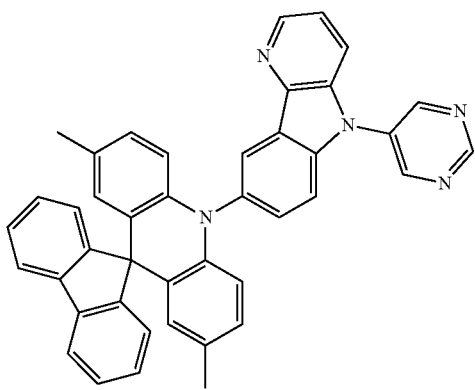
-continued
54
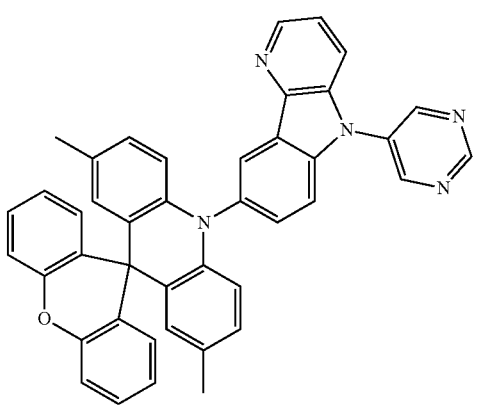
55
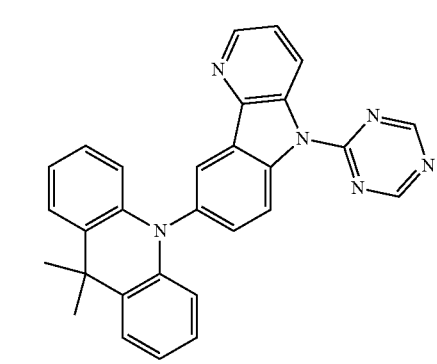
56
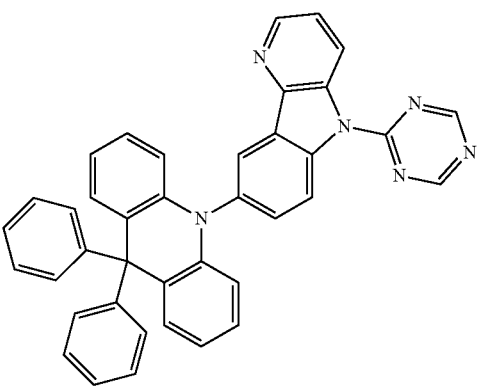
57
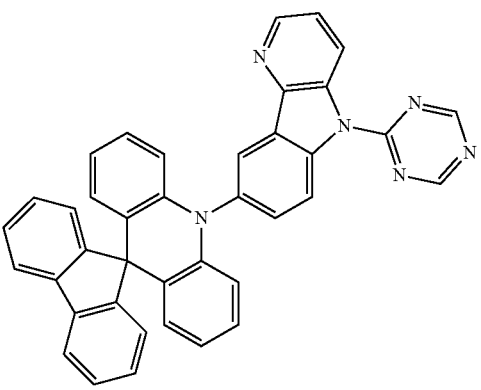

-continued
58
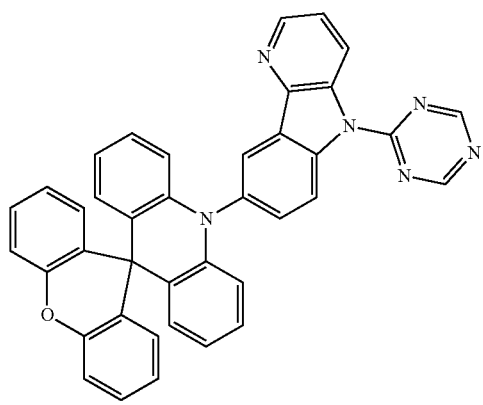
59
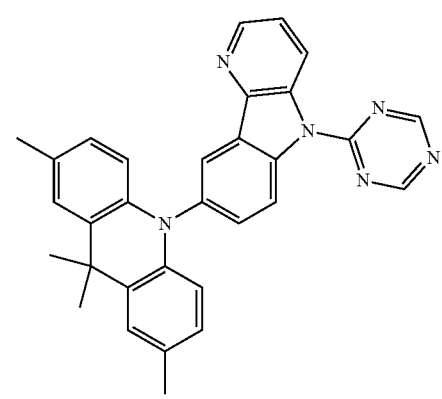
60
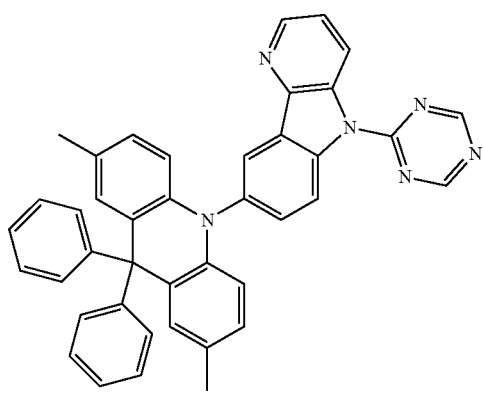
61
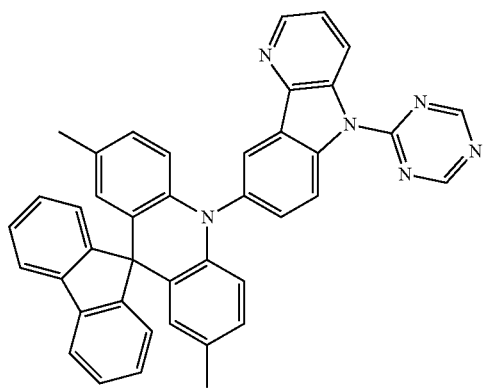
-continued
62
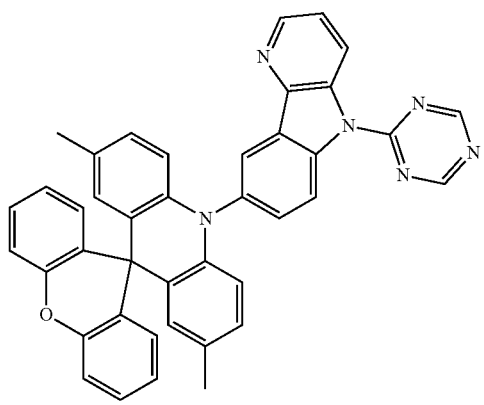
63
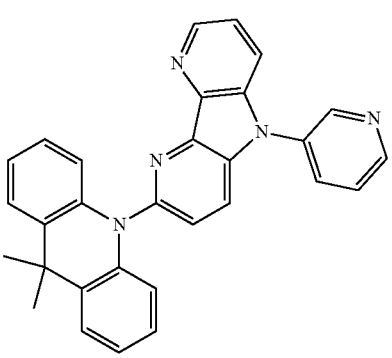
64
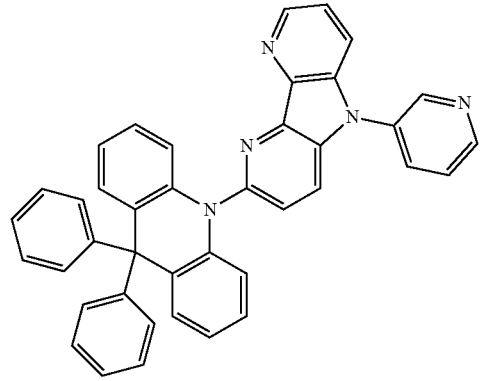
65

66
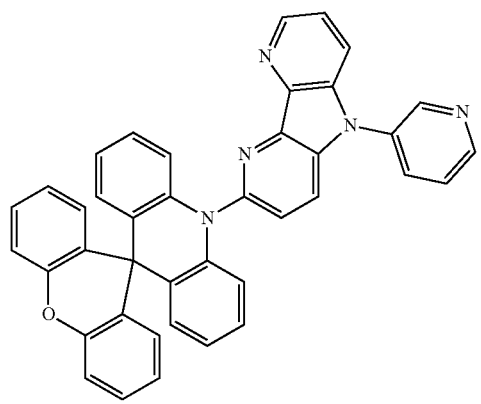
67
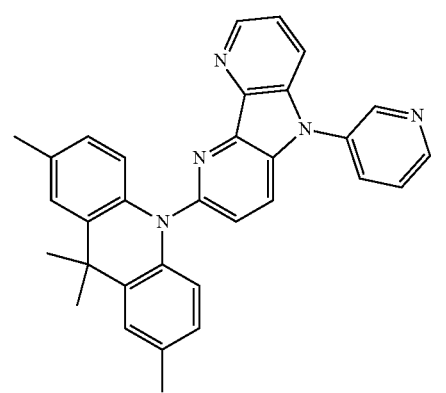
68
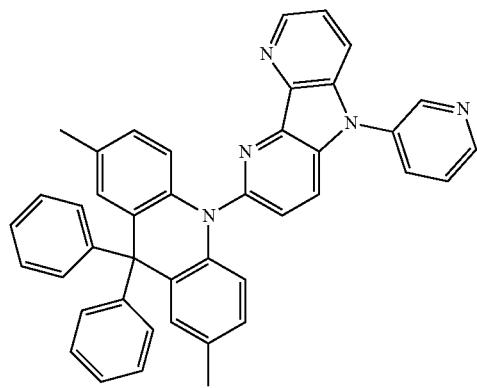
69
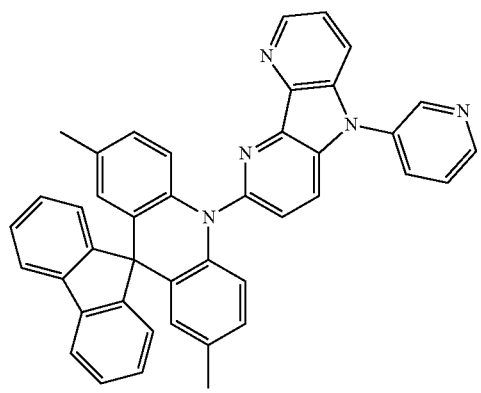
70
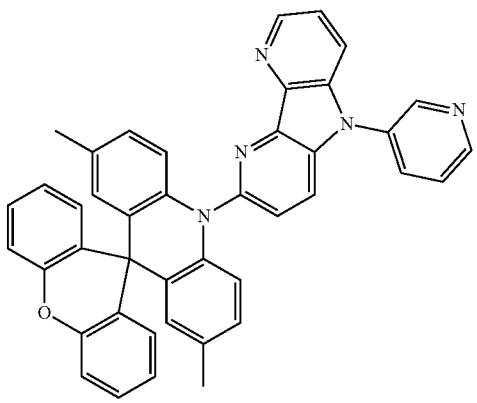
71
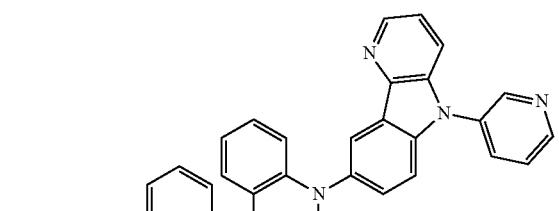
72
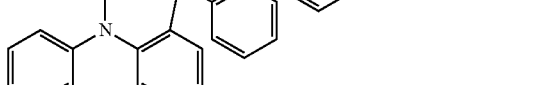
73
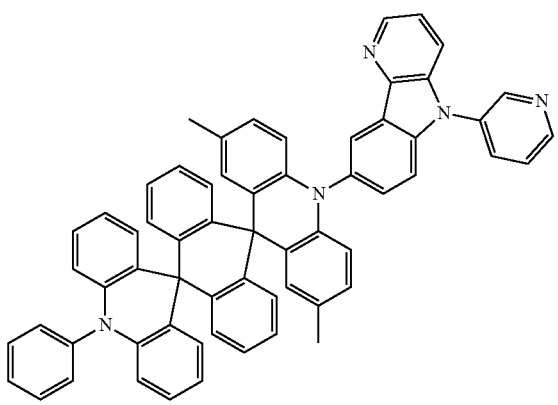

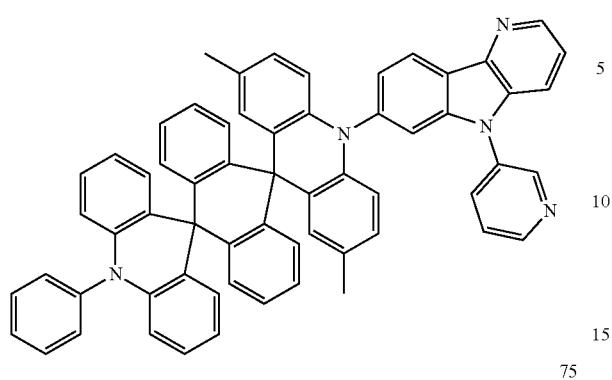
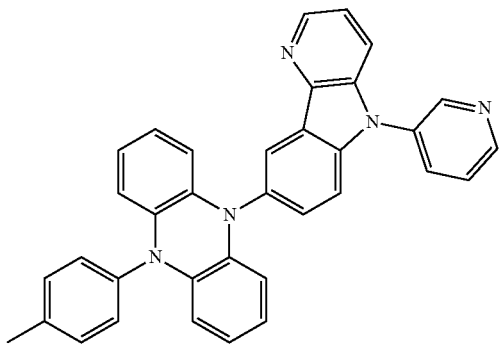
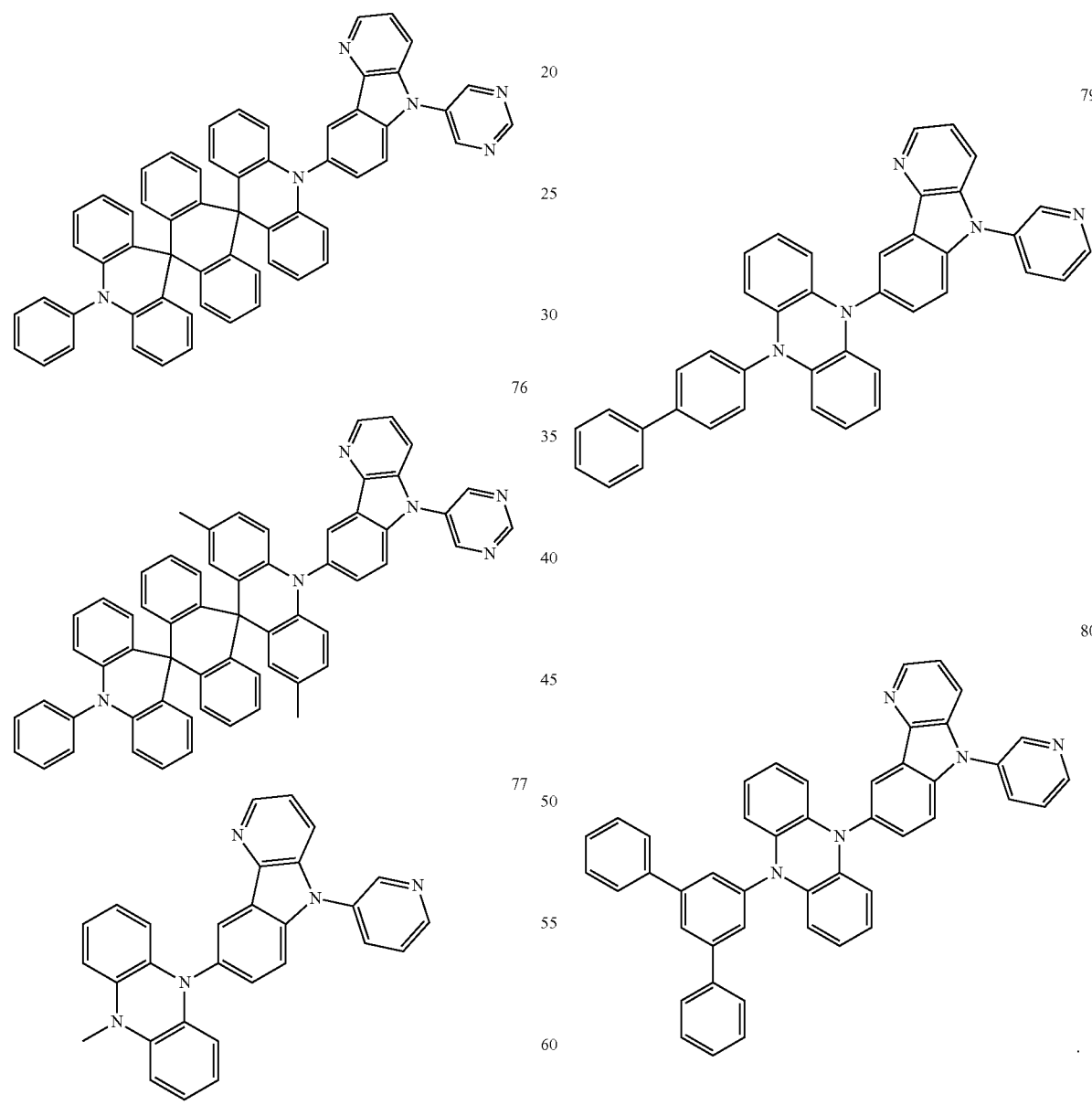
* * * * *